US008883379B2

(12) United States Patent
Hatakeyama et al.

(10) Patent No.: US 8,883,379 B2
(45) Date of Patent: Nov. 11, 2014

(54) RESIST-PROTECTIVE FILM-FORMING COMPOSITION AND PATTERNING PROCESS

(71) Applicant: Shin-Etsu Chemical Co., Ltd., Tokyo (JP)

(72) Inventors: Jun Hatakeyama, Joetsu (JP); Daisuke Kori, Joetsuke (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 62 days.

(21) Appl. No.: 13/706,664

(22) Filed: Dec. 6, 2012

(65) Prior Publication Data

US 2013/0143162 A1  Jun. 6, 2013

(30) Foreign Application Priority Data

Dec. 6, 2011  (JP) .................................. 2011-266406

(51) Int. Cl.
| | | |
|---|---|---|
| G03F 7/11 | (2006.01) | |
| G03F 7/26 | (2006.01) | |
| C08L 65/00 | (2006.01) | |
| C08G 61/12 | (2006.01) | |
| G03F 7/20 | (2006.01) | |
| C09D 161/12 | (2006.01) | |
| C09D 165/00 | (2006.01) | |

(52) U.S. Cl.
CPC .............. *C08L 65/00* (2013.01); *C08G 61/128* (2013.01); *G03F 7/20* (2013.01); *G03F 7/11* (2013.01); *C09D 161/12* (2013.01); *C09D 165/00* (2013.01); *C08G 2261/3424* (2013.01)
USPC ....... 430/14; 430/271.1; 430/273.1; 430/325; 430/326

(58) Field of Classification Search
CPC ........... G03F 7/09; G03F 7/091; G03F 7/092; G03F 7/094; G03F 7/095; G03F 7/11
USPC ............... 430/271.1, 273.1, 14, 15, 325, 326; 524/378; 528/97, 385
See application file for complete search history.

(56) References Cited

U.S. PATENT DOCUMENTS

| | | | |
|---|---|---|---|
| 6,448,420 | B1 | 9/2002 | Kinsho et al. |
| 6,503,689 | B2 * | 1/2003 | Zampini et al. ............ 430/270.1 |
| 7,537,880 | B2 | 5/2009 | Harada et al. |
| 2004/0067627 | A1* | 4/2004 | Lee et al. ....................... 438/585 |
| 2006/0204891 | A1* | 9/2006 | Hatakeyama ............... 430/270.1 |
| 2007/0122741 | A1 | 5/2007 | Hatakeyama et al. |
| 2008/0102407 | A1* | 5/2008 | Ohsawa et al. ............. 430/286.1 |
| 2009/0081595 | A1* | 3/2009 | Hatakeyama et al. ........ 430/323 |
| 2012/0252218 | A1* | 10/2012 | Kori et al. ..................... 438/703 |

FOREIGN PATENT DOCUMENTS

| | | |
|---|---|---|
| JP | 09-246173 A | 9/1997 |
| JP | 2000-327633 A | 11/2000 |
| JP | 2006-058739 A | 3/2006 |
| JP | 2008-065304 A | 3/2008 |
| JP | 2008-111103 A | 5/2008 |
| JP | 4425776 B2 | 3/2010 |
| JP | 2011-138107 A | 7/2011 |
| JP | 4716027 B2 | 7/2011 |
| JP | 4771083 B2 | 9/2011 |

OTHER PUBLICATIONS

Kim, Hyun-Woo et al., "CD uniformity improvement for EUV resists process: EUV resolution enhancement layer", Proc. of SPIE, 2011, pp. 796916-1-796916-10, vol. 7969.

* cited by examiner

*Primary Examiner* — Anca Eoff
(74) *Attorney, Agent, or Firm* — Westerman, Hattori, Daniels & Adrian, LLP

(57) ABSTRACT

A pattern is printed by forming a photoresist layer on a wafer, forming a protective film thereon, exposure, and development. The protective film is formed from a protective film-forming composition comprising a novolak resin of a bisphenol compound and a mixture of an alcohol solvent and an ether or aromatic solvent.

3 Claims, 2 Drawing Sheets

RESIST-PROTECTIVE FILM-FORMING COMPOSITION AND PATTERNING PROCESS

CROSS-REFERENCE TO RELATED APPLICATION

This non-provisional application claims priority under 35 U.S.C. §119(a) on Patent Application No. 2011-266406 filed in Japan on Dec. 6, 2011, the entire contents of which are hereby incorporated by reference.

TECHNICAL FIELD

This invention relates to a composition for forming a resist protective film for use in the micropatterning step in the fabrication of semiconductor devices, and a pattern forming process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and a light source with a shorter wavelength.

Resist materials adapted for KrF excimer laser (248 nm) started use on the 0.3 μm process and entered the mass production phase on the 0.13 μm rule. A wavelength change-over from KrF to shorter wavelength ArF excimer laser (193 nm) is expected to enable miniaturization of the design rule to below 0.13 μm. Since commonly used novolak resins and polyvinylphenol resins have very strong absorption in proximity to 193 nm, they cannot be used as the base resin for resists. To ensure transparency and dry etching resistance, acrylic resins and alicyclic (typically cycloolefin) resins are investigated, leading to mass-scale production of devices by the ArF lithography.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the $F_2$ lithography was postponed and instead, the early introduction of ArF immersion lithography was advocated. This enables mass-scale production of 45-nm node devices. For the mass-scale production of 32-nm node devices, the double patterning process utilizing sidewall spacer technology is used although the process suffers from complexity and length.

For the fabrication of 32-nm node and subsequent devices, the extreme ultraviolet (EUV) lithography using an exposure wavelength of 13.5 nm which is shorter than the conventional lasers by one order of magnitude and thus featuring improved resolution is expected rather than the double patterning process with noticeable costs. Efforts are focused on the EUV lithography.

In the EUV lithography, a low laser power and light attenuation by reflecting mirror lead to a reduced quantity of light. Then light with a low intensity reaches the wafer surface. It is urgently demanded to develop a high-sensitivity resist material in order to gain a throughput despite a low light quantity. However, a trade-off relationship of sensitivity is pointed out that the sensitivity of resist material can be increased at the sacrifice of resolution and edge roughness (LER, LWR).

EUV resist materials are susceptible to environmental impacts because of their high sensitivity. In general, an amine quencher is added to chemically amplified resist materials for rendering the resist materials unsusceptible to contamination with airborne amine. The amount of amine quencher added to the EUV resist materials is only a fraction as compared with the ArF and other lithography resist materials. As a result, the EUV resist materials tend to take a T-top profile under the influence of amine from the resist surface.

For shutting off environmental impacts, it is effective to form a protective film on top of the resist film. Application of a protective film was effective for the chemically amplified resist materials of the early stage based on a t-BOC-protected polyhydroxystyrene and free of an amine quencher, used in the KrF excimer laser lithography. Also at the initial stage of the ArF immersion lithography, a protective film was applied to prevent the acid generator from leaching out in water and thus inhibit the profile from becoming T-topped.

With respect to the EUV lithography, it was also proposed to form a protective film on top of the resist film (see Patent Documents 1 to 3 and Non-Patent Document 1). The protective film thus formed is effective for improving environmental resistance and reducing the outgassing from the resist film.

EUV laser sources of the discharge-produced plasma (DPP) or laser-produced plasma (LPP) method emit not only light of wavelength 13.5 nm available for pattern formation, but also broad light of wavelength 140 to 300 nm, known as out-of-band (OOB) light. The broad light has a low intensity, but a wide span of wavelength and is not negligible as energy quantity. The EUV microstepper is loaded with a Zr filter for cutting off OOB light, but the quantity of light is reduced thereby. The EUV scanner may not be loaded with the filter because a reduction of light quantity is not permissible for the goal of enhancing the throughput.

There is a need for a resist material which is sensitive to EUV, but not to OOB light. For such resist materials, the cation structure of sulfonium salt PAG is important. Patent Document 4 (JP-A 2011-138107, paragraph [0052]) describes a polymer-bound acid generator having a high sensitivity to EUV light, but a low sensitivity to OOB light. Non-Patent Document 1 describes the superiority of a protective film which is formed on top of the resist layer for cutting off OOB light.

In connection with a protective film for use in the immersion lithography, it is pointed out in Patent Document 5 that the solvent for the coating of a protective film dissolves the resist film surface to invite intermixing between the protective film and the resist film, resulting in a thickness loss of the resist pattern after development. The film thickness loss becomes outstanding particularly when alcohol solvents are used. Ether solvents are effective for preventing thickness loss. Polymers that are dissolved in ether solvents include polymers containing hexafluoroalcohol (HFA) as described in Patent Document 4. However, since fluorine atoms have strong absorption to EUV light, a resist film on which a protective film is formed using a HFA-containing polymer undesirably exhibits low sensitivity on patterning.

CITATION LIST

Patent Document 1: JP-A 2006-058739
Patent Document 2: JP 4716027
Patent Document 3: JP-A 2008-065304
Patent Document 4: JP-A 2011-138107
Patent Document 5: JP 4771083 (US 20070122741)
Non-Patent Document 1: Proc. SPIE Vol. 7969, p 796916-1 (2011)

SUMMARY OF INVENTION

An object of the invention is to provide a resist protective film-forming composition which is effective for mitigating the environmental impact on a resist film, cutting off OOB light, reducing a film thickness loss of the resist pattern, avoiding bridges between pattern features, and allowing the resist film to exhibit a high sensitivity. Another object is to provide a pattern forming process using the same.

The inventors have found that a protective film formed on a resist film as defined below is effective for mitigating the environmental impact on the resist film, absorbing OOB light, reducing a film thickness loss of the resist pattern, and avoiding bridges between pattern features. The protective film is made soluble in alkaline developer so that it can be stripped off at the same time as development of the resist film. Thus the process is simple as compared with the protective film of solvent stripping type, and the concomitant increase of the process cost is minimized.

It is reported that at wavelength 13.5 nm, hydrogen, carbon, silicon and sulfur atoms have low absorption and oxygen and fluorine atoms have high absorption. The fluoropolymer described in Patent Document 1 possesses noticeable absorption at wavelength 13.5 nm. If the resist protective film is absorptive, the sensitivity of the resist film is shifted to the lower side. In the EUV lithography with a low laser power, the low sensitivity of the resist film is a problem. Then the resist protective film must be highly transparent. Also since the aforementioned fluoropolymer does not dissolve in alkaline developer, a stripping cup specialized for the resist protective film must be separately used prior to development. As such, the process is complicated. Since a protective film which can be stripped at the same time as development of the resist film is desirable, the design of protective film material needs to incorporate an alkali-soluble group into the material. The protective film defined herein meets these requirements.

Suitable alkali-soluble groups include carboxyl, phenol, sulfo, and hexafluoroalcohol groups. From the standpoint of transparency, the use of a hexafluoroalcohol group as the alkali-soluble group in the protective film is undesirable because the hexafluoroalcohol group having as many as six fluorine atoms possesses strong absorption.

It is reported that polyhydroxystyrene-based resist materials have a high acid generation efficiency upon EUV exposure. The EUV exposure brings about energy transfer from phenol group to the acid generator to exert a sensitizing effect, leading to enhanced sensitivity. Therefore, polyhydroxystyrene-based resist materials are investigated for the purpose of enhancing the sensitivity of resist film.

JP 4425776 proposes a resist material based on a polymer having an acid generator (PAG) bound to its backbone. On use of a sulfonium or iodonium salt acid generator whose sulfonic acid is bound to the backbone, the distance of acid diffusion is shortened, thereby minimizing image blur due to acid diffusion. This is advantageous in forming fine size patterns. The resist film having PAG bound thereto has the shortcoming of low sensitivity. The sensitivity may be enhanced by copolymerizing hydroxystyrene having a phenol group or the like. However, copolymerization of a monomer having a phenol group capable of enhancing an alkaline dissolution rate is not desirable because a thickness loss of the resist pattern can occur. There is a need for a resist protective film-forming composition which allows the resist film to exhibit a high sensitivity and minimizes the thickness loss of the resist pattern as developed.

In one aspect, the invention provides a resist protective film-forming composition which is used in a lithography pattern forming process comprising the steps of forming a photoresist layer on a wafer, forming a protective film thereon, exposure, and development. The resist protective film-forming composition comprises a novolak resin of a bisphenol compound having the general formula (1) as a base resin.

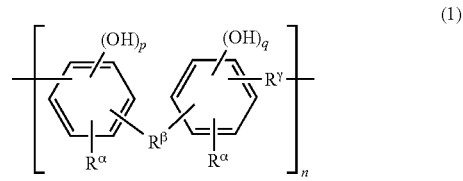

Herein $R^\alpha$ is each independently hydrogen, a $C_1$-$C_{10}$ alkyl group, $C_2$-$C_{10}$ alkenyl group, or $C_6$-$C_{10}$ aryl group, $R^\beta$ is a single bond or a 2n-valent $C_1$-$C_{40}$ hydrocarbon group of straight, branched or cyclic structure which may have a bridged cyclic hydrocarbon radical, aliphatic unsaturation, heteroatom, or $C_6$-$C_{30}$ aromatic radical, n is an integer of 1 to 4, $R^\gamma$ is a single bond or a straight or branched alkylene group which may have an aromatic radical, p and q each are an integer of 1 to 3.

Preferably, the protective film-forming composition is soluble in an alkaline developer.

The protective film-forming composition may further comprise an organic solvent mixture of at least one alcohol solvent and at least one other solvent. The alcohol solvent is selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclopentanol, and cyclohexanol. The other solvent is selected from an ether solvent selected from the group consisting of diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether, and an aromatic solvent selected from the group consisting of toluene, xylene, mesitylene, ethylbenzene, propylbenzene, butylbenzene, tert-butylbenzene, and anisole.

In a second aspect, the invention provides a lithography pattern forming process comprising the steps of forming a photoresist layer on a wafer, forming a protective film thereon, exposure, and development, the protective film being formed from the resist protective film-forming composition defined herein.

In a third aspect, the invention provides a lithography pattern forming process comprising the steps of forming a photoresist layer on a wafer, forming a protective film thereon, and exposure in vacuum, the protective film being formed from the resist protective film-forming composition defined herein. The exposure step preferably uses radiation having a wavelength of 3 to 15 nm or EB.

Also preferably, the development step following exposure includes applying an alkaline developer to develop the photoresist layer and strip off the protective film simultaneously.

In a fourth aspect, the invention provides a pattern forming process comprising the steps of forming a photoresist layer on a wafer, forming a protective film thereon, and exposure in vacuum. The protective film is formed from the resist protective film-forming composition defined herein. The photoresist layer is formed from a resist composition comprising a copolymer comprising recurring units of at least one type selected from recurring units (a1) and (a2) having a carboxyl group and phenol group whose hydroxyl moiety is substituted with an acid labile group, respectively, as represented by the general formula (2) and recurring units of at least one type selected from recurring units (b1) and (b2) of a sulfonium salt as represented by the general formula (3) and having a weight average molecular weight of 1,000 to 500,000, as a base resin.

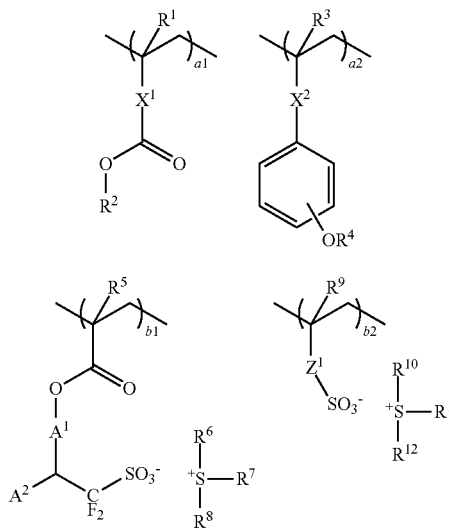

(2)

(3)

In formula (2), $R^1$ and $R^3$ are each independently hydrogen or methyl, $R^2$ and $R^4$ each are an acid labile group, $X^1$ is a single bond, a $C_1$-$C_{12}$ linking group having an ester radical, lactone ring, phenylene radical or naphthylene radical, phenylene group or naphthylene group, $X^2$ is a single bond, an ester group or an amide group. In formula (3), $R^5$ and $R^9$ are each independently hydrogen or methyl, $R^6$, $R^7$, $R^8$, $R^{10}$, $R^{11}$ and $R^{12}$ are each independently a straight, branched or cyclic $C_1$-$C_{12}$ alkyl group which may contain a carbonyl, ester or ether radical, or $C_6$-$C_{12}$ aryl group, $C_7$-$C_{20}$ aralkyl group or thiophenyl group, $A^1$ is a single bond, -$A^0$-C(=O)—O— or -$A^0$-O—C(=O)—, $A^0$ is a straight, branched or cyclic $C_1$-$C_{12}$ alkylene group which may contain a carbonyl, ester or ether radical, $A^2$ is hydrogen or $CF_3$, $Z^1$ is a single bond, methylene, ethylene, phenylene, fluorophenylene, —O—$R^{13}$—, or —C(=O)—$Z^2$—$R^{13}$—, $Z^2$ is oxygen or NH, $R^{13}$ is a straight, branched or cyclic $C_1$-$C_6$ alkylene group, phenylene group, fluorophenylene group, tri fluoromethyl-substituted phenylene group or alkenylene group, which may contain a carbonyl, ester, ether or hydroxyl radical. The subscripts a1, a2, b1 and b2 are numbers in the range: $0 \leq a1 \leq 0.9$, $0 \leq a2 \leq 0.9$, $0 < a1+a2 \leq 0.9$, $0 \leq b1 \leq 0.3$, $0 \leq b2 \leq 0.3$, and $0 < b1+b2 \leq 0.3$.

Advantageous Effects of Invention

The resist protective film-forming composition, when applied onto the resist film, prevents the resist pattern from being T-topped due to contamination with airborne amine and exerts a sensitizing effect on the resist film for enhancing the sensitivity of the resist film. When an acid generator and an amine quencher are added to the protective film-forming composition, they are effective for enhancing the contrast of acid in the protective film, reducing the edge roughness of the resist pattern, improving the rectangularity of the resist pattern, and avoiding bridges between pattern features. At the same time, the protective film restrains outgassing from the resist film during exposure in vacuum. When the protective film-forming composition is formulated soluble in alkaline developer, the protective film can be stripped off at the same time as development of the resist film. Furthermore, since the protective film-forming composition does not dissolve the resist film or form an intermix layer, the resist shape after development is not at all changed. The protective film has the additional effect of absorbing OOB light having a wavelength of 140 to 300 nm emitted by the EUV laser, thereby preventing the resist film from becoming sensitive to the OOB light.

DESCRIPTION OF PREFERRED EMBODIMENTS

Figure 1:
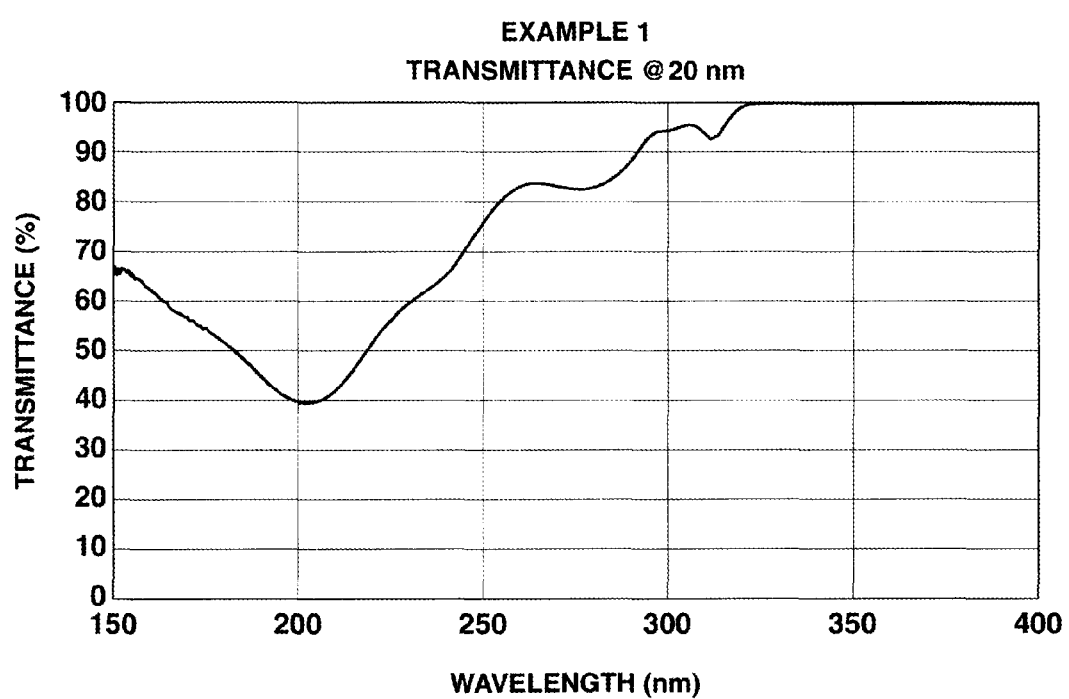
FIG. 1 graphically illustrates the transmittance of a protective film of 20 nm thick in Example 1.

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
PAG: photoacid generator
LER: line edge roughness
LWR: line width roughness Protective Film-Forming Composition The resist protective film-forming composition is defined as comprising a novolak resin of a bisphenol compound which is formed from hydrocarbon so as to be alkali soluble, as a base resin. The novolak resin has the general formula (1).

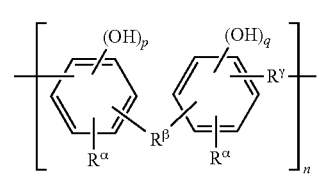

(1)

Herein $R^\alpha$ is each independently hydrogen, a $C_1$-$C_{10}$ alkyl group, a $C_2$-$C_{10}$ alkenyl group, or a $C_6$-$C_{10}$ aryl group. $R^\beta$ is a single bond or a 2n-valent $C_1$-$C_{40}$ hydrocarbon group of straight, branched or cyclic structure which may have a bridged cyclic hydrocarbon radical, aliphatic unsaturation, a heteroatom such as sulfur, or a $C_6$-$C_{30}$ aromatic radical. The subscript n is an integer of 1 to 4. $R^\gamma$ is a single bond or a straight or branched alkylene group which may have an aromatic radical. The subscripts p and q each are an integer of 1 to 3.

The novolak resin has an accelerated dissolution rate in alkaline developer due to the hydroxyl group and improved solubility in alcoholic solvents of 4 or more carbon atoms. The alcoholic solvents of 4 or more carbon atoms are characterized by difficult dissolution of the resist film. When the solvent which does not dissolve the resist film is used in the protective film-forming composition, any intermixing between the protective film and the resist film is prohibited. Since ether solvents and aromatic solvents do not substantially dissolve the resist film, the use of these solvents in the protective film-forming composition is most preferred from the standpoint of preventing intermixing. However, polyhydroxystyrene, novolak resins, calix resorcin and analogous resins are not substantially dissolved in ether solvents and aromatic solvents. Although these resins are dissolved in alcoholic solvents of 4 or more carbon atoms, a protective film formed using an alcoholic solvent of 4 or more carbon atoms alone allows the resist pattern as developed to lose its thickness.

As compared with cresol novolak resins, bisphenol novolak resins are highly soluble in ether solvents and aromatic solvents. When a protective film-forming composition having a bisphenol novolak resin dissolved in an ether solvent or aromatic solvent-rich solvent is used, a film thickness loss of the resist pattern after development can be restrained.

The bisphenol compound from which the bisphenol novolak resin having formula (1) is prepared is described in JP 4716027, with examples being illustrated below.

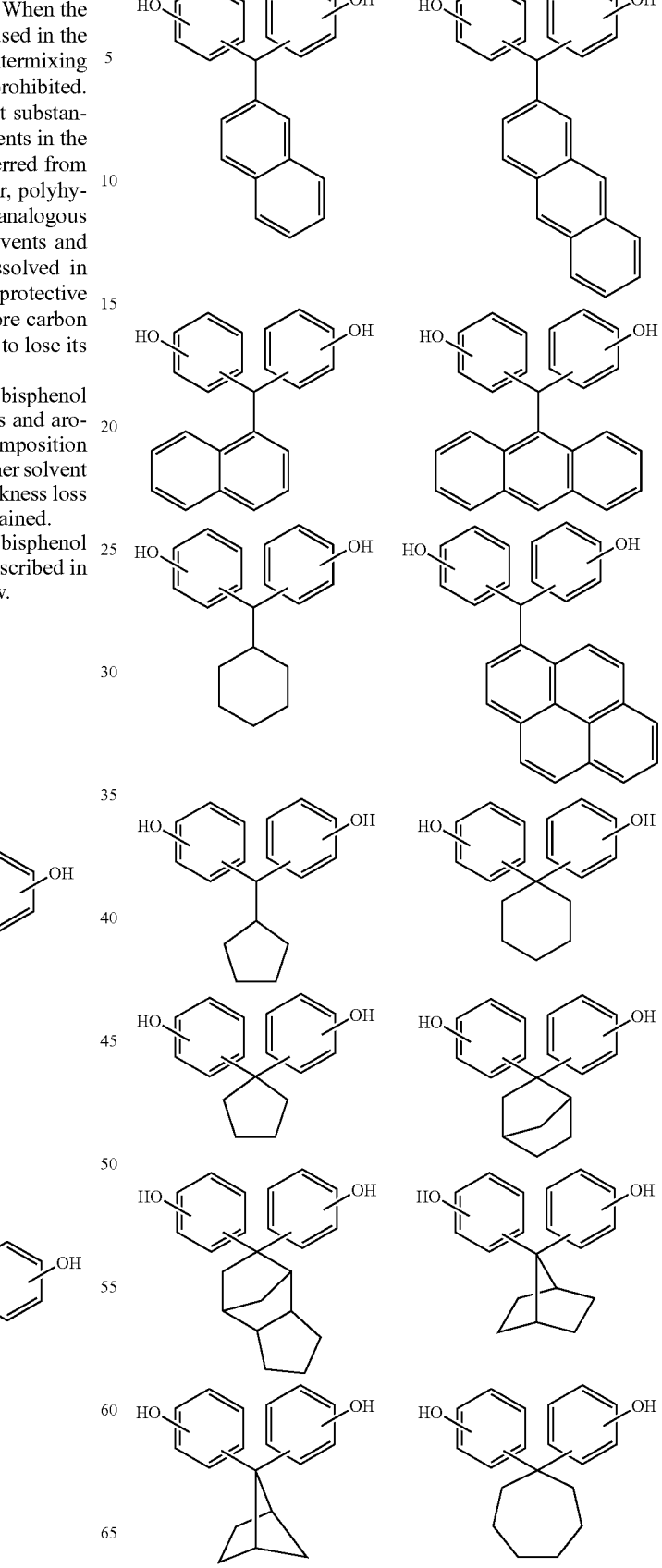

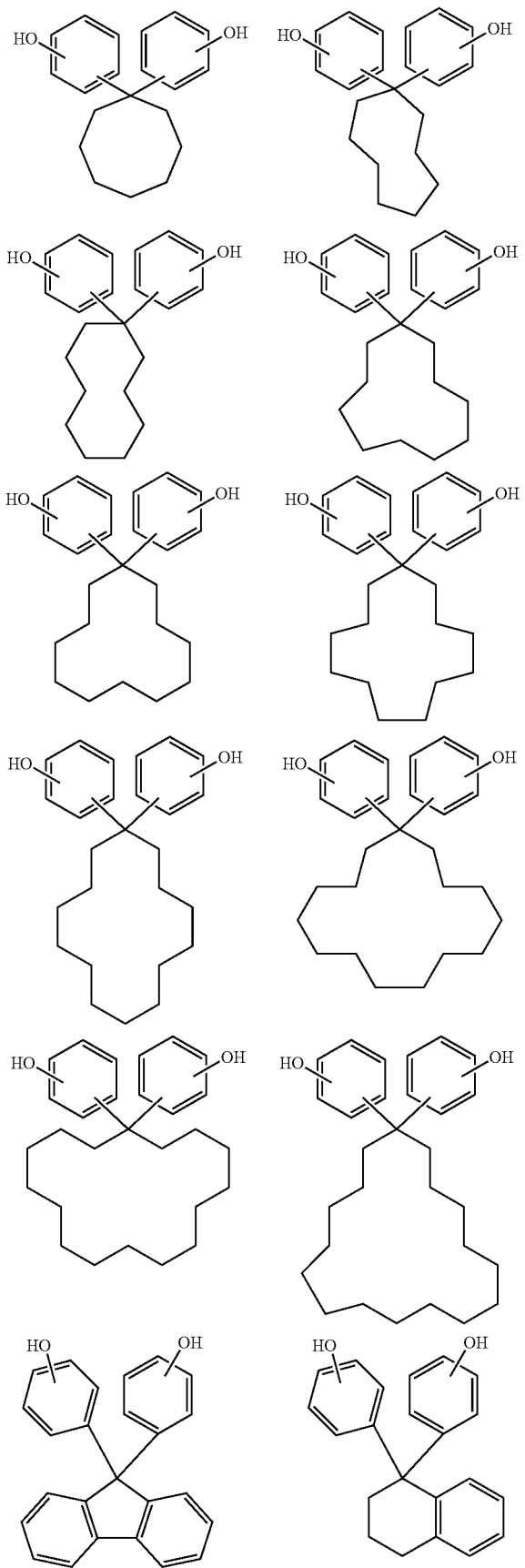
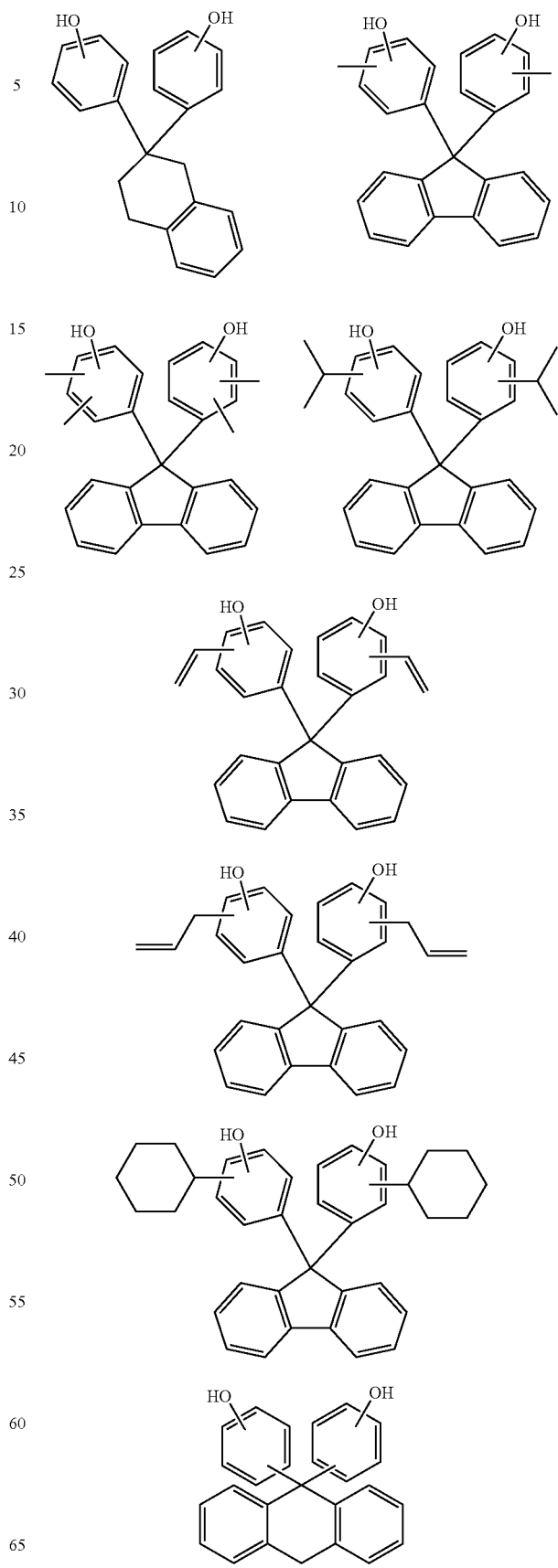

-continued
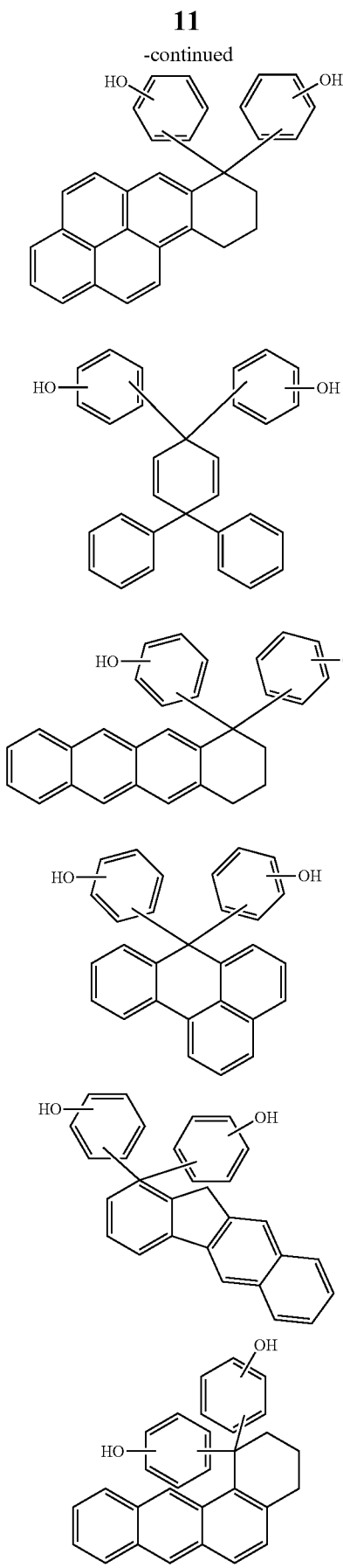
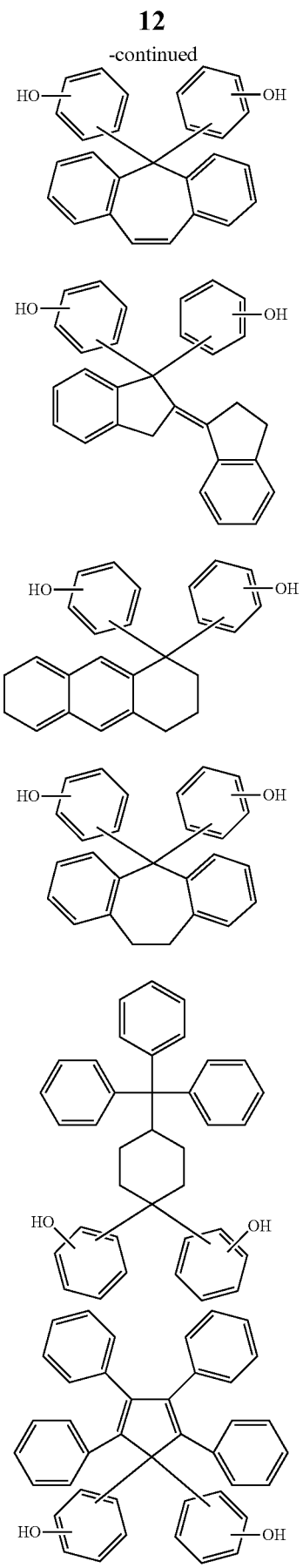

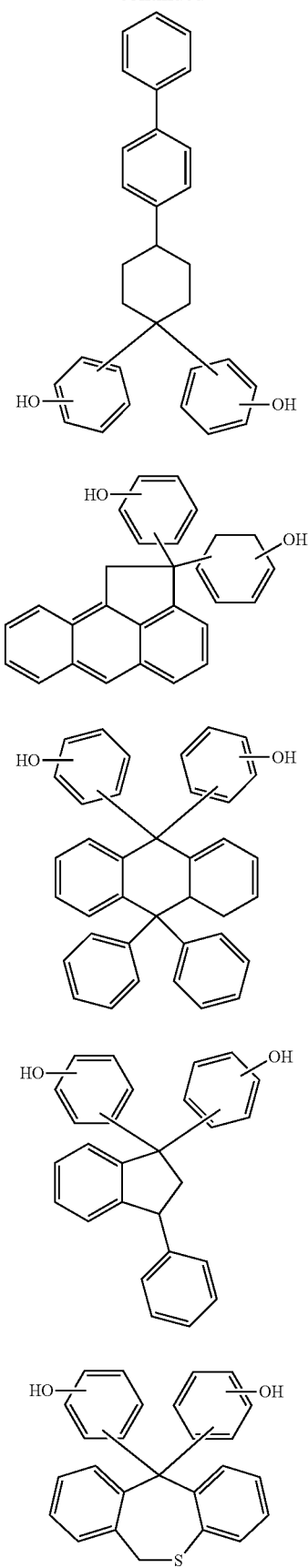

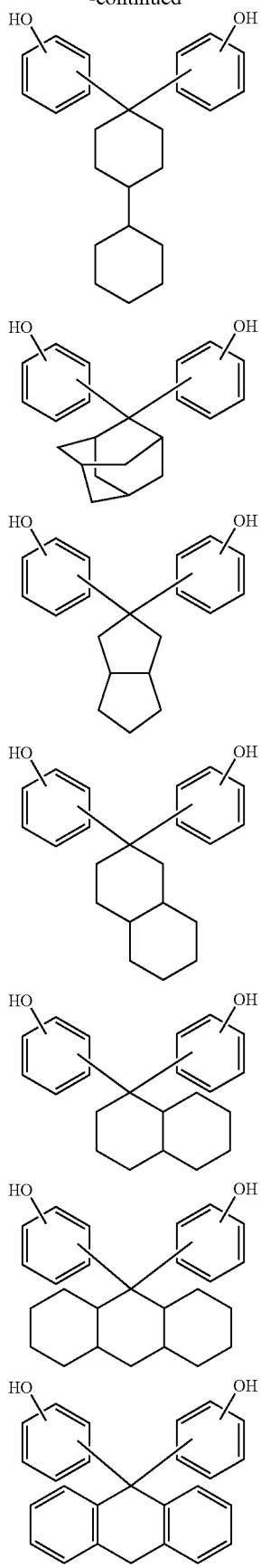
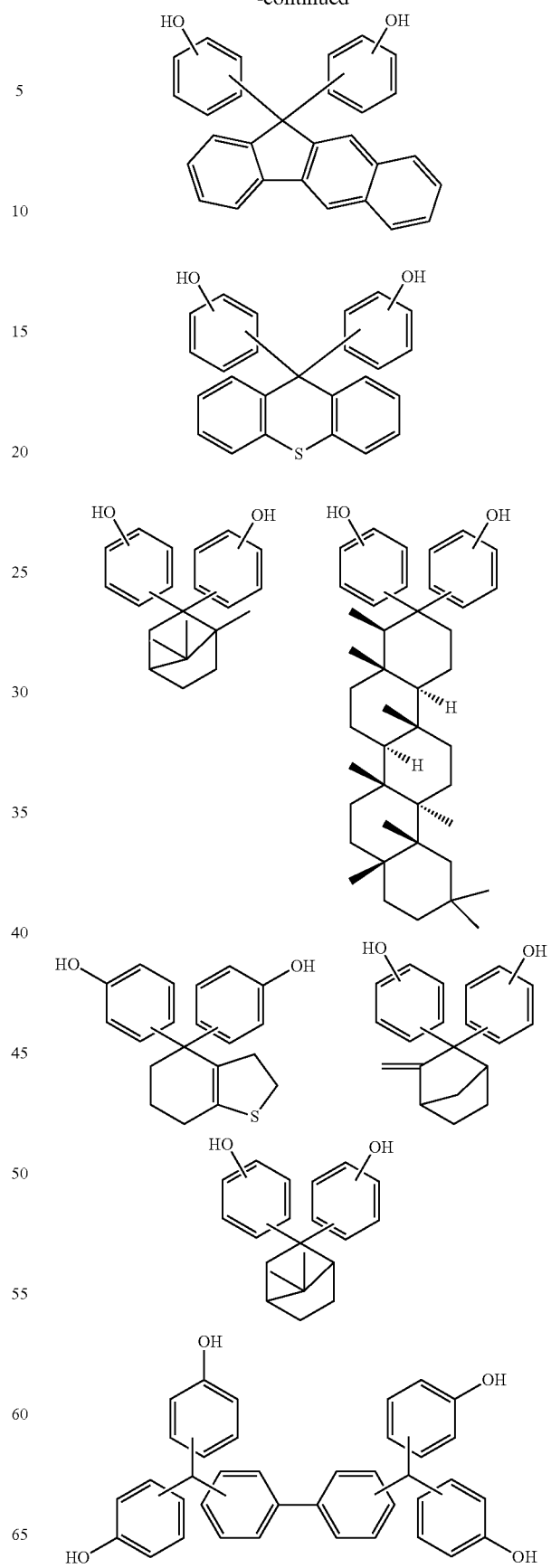

-continued
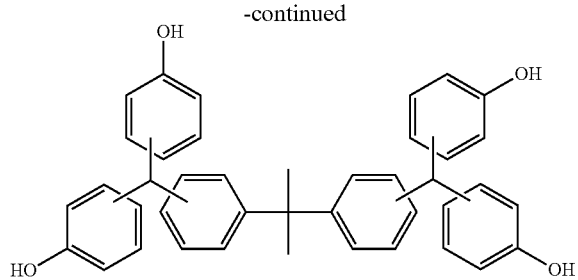
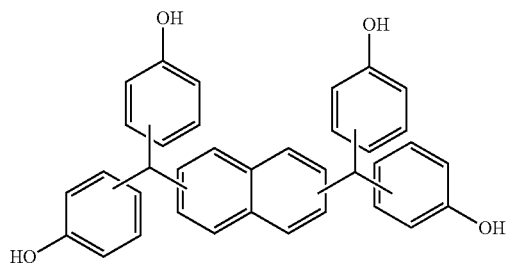
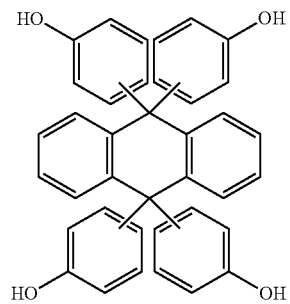
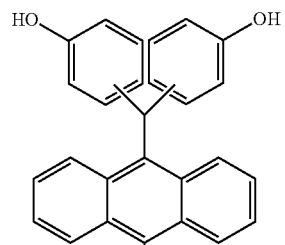
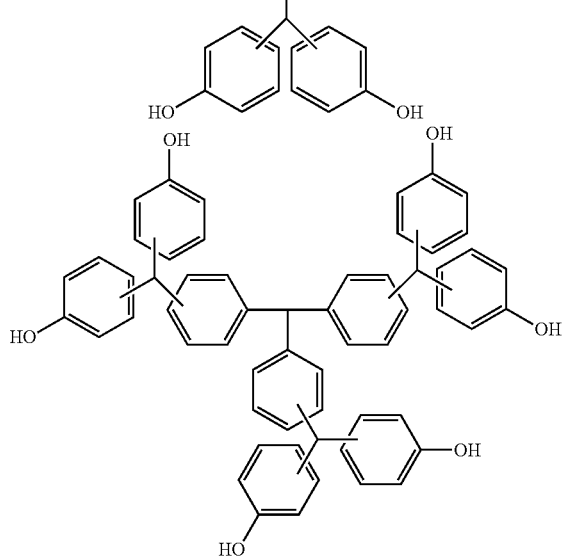
-continued
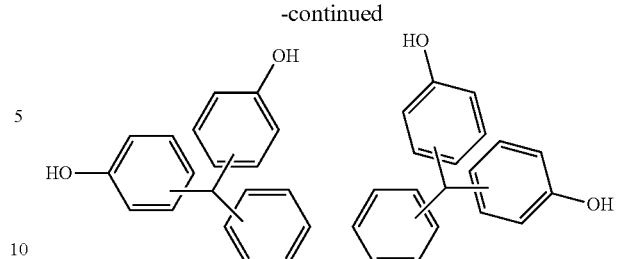
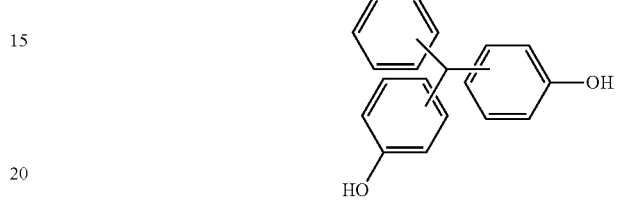
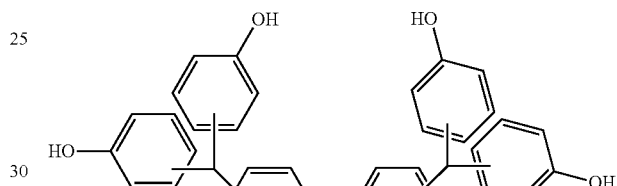
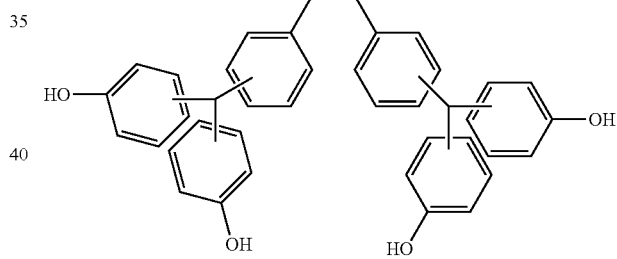
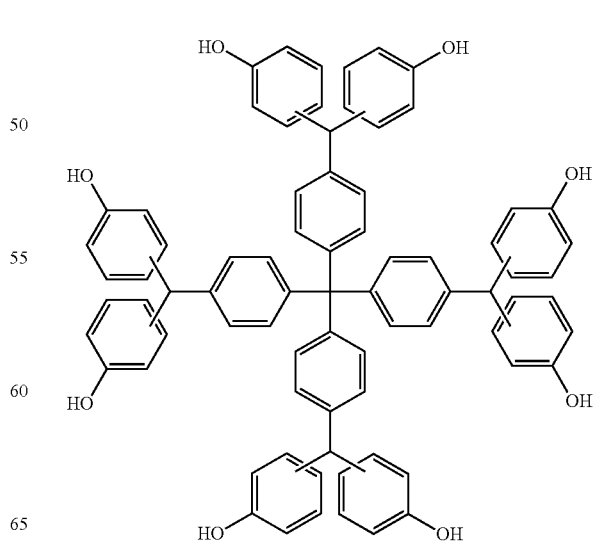

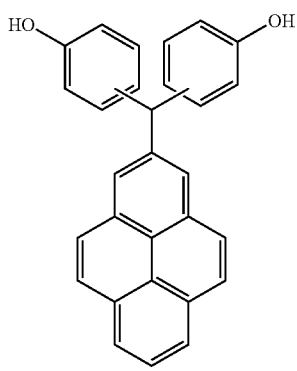
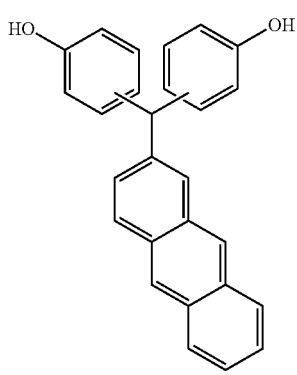
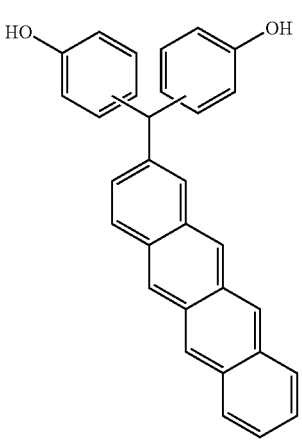
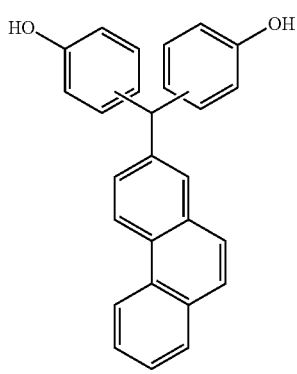
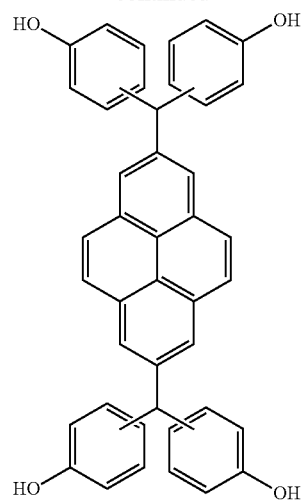
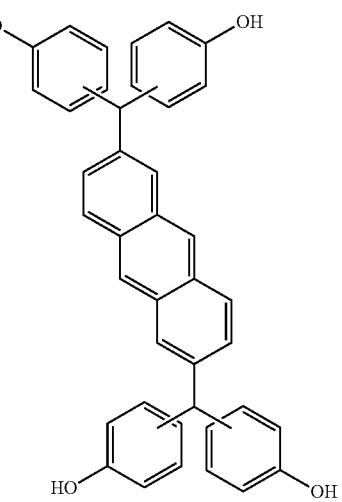
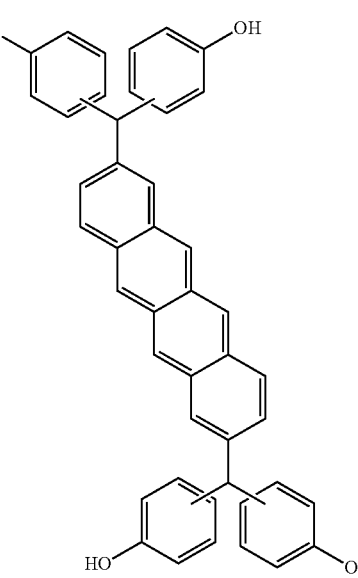

-continued
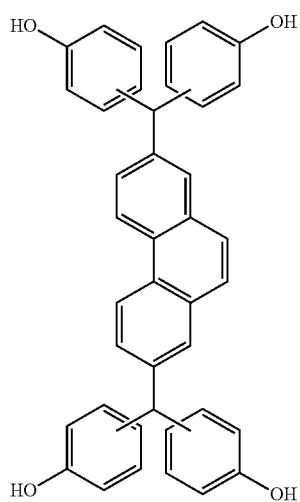
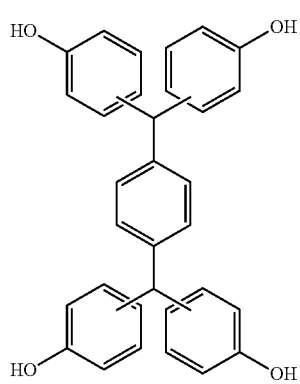
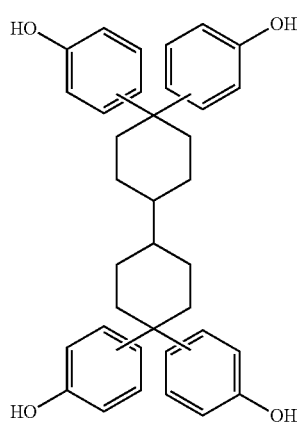
-continued
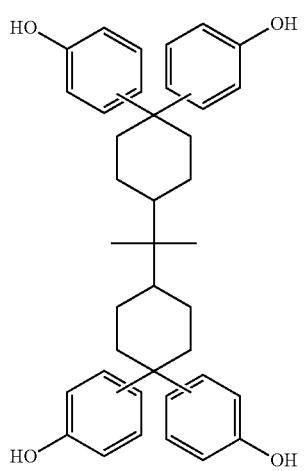
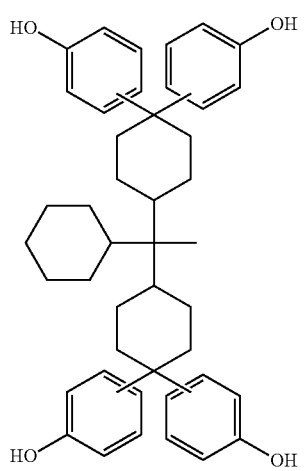
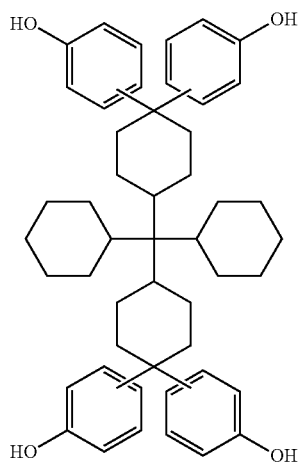

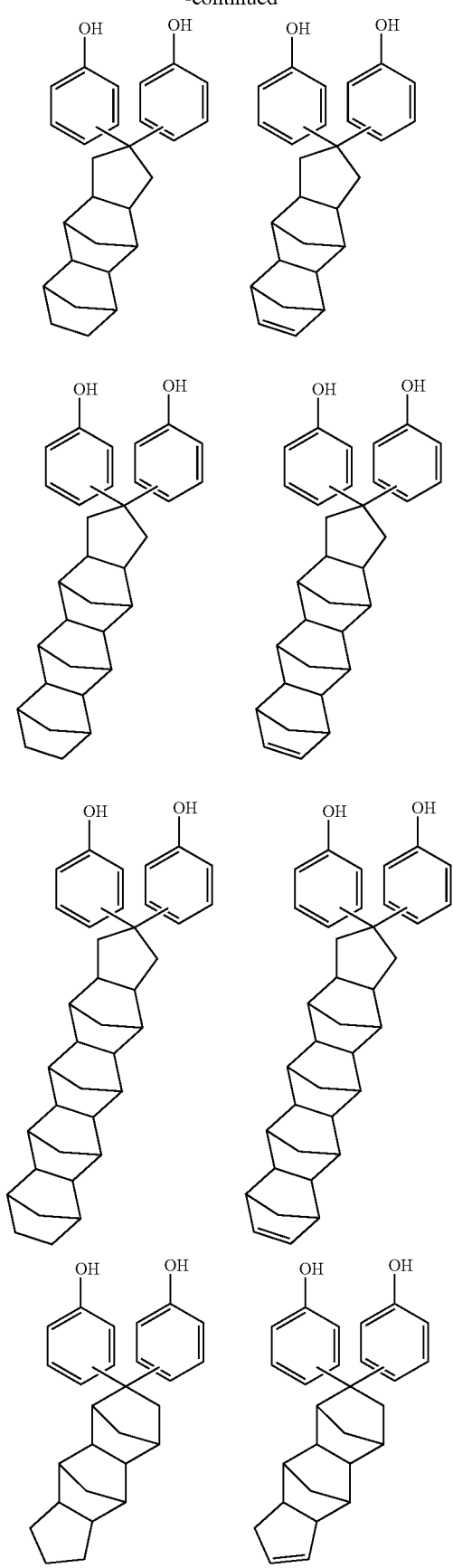
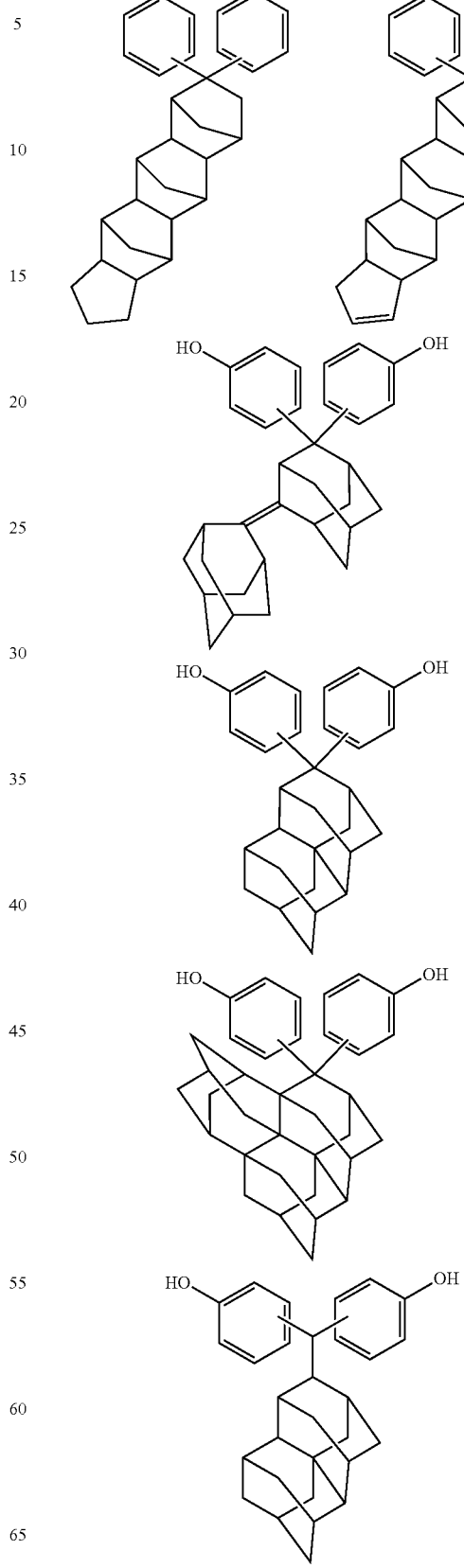

25
-continued
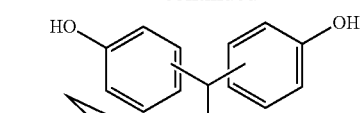
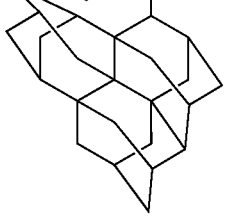
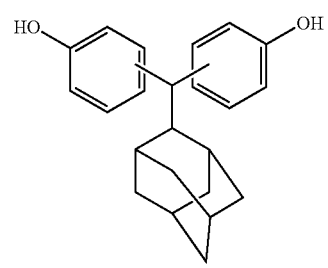
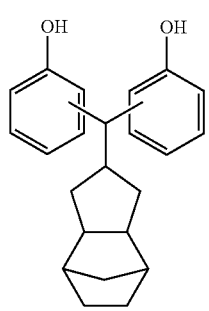
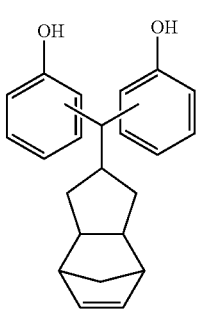
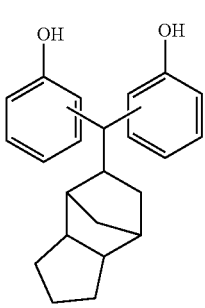
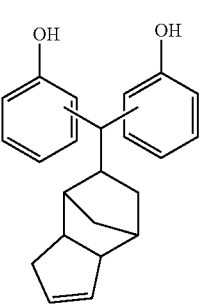
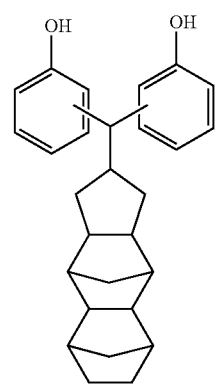
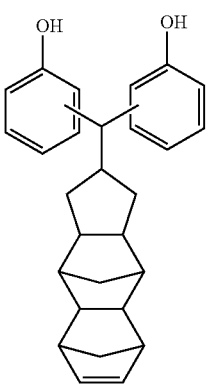
26
-continued
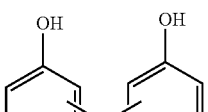
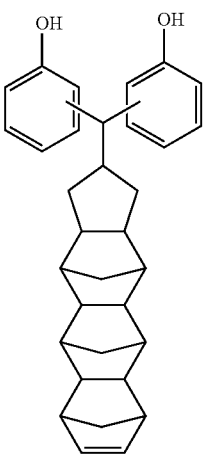
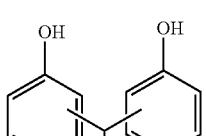
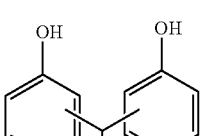
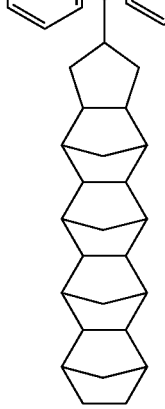
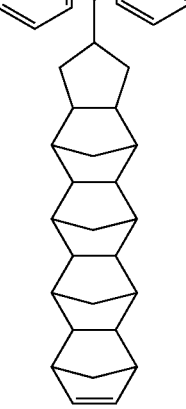
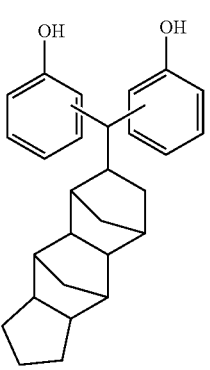
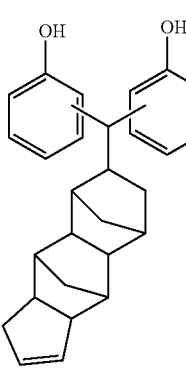

27
-continued
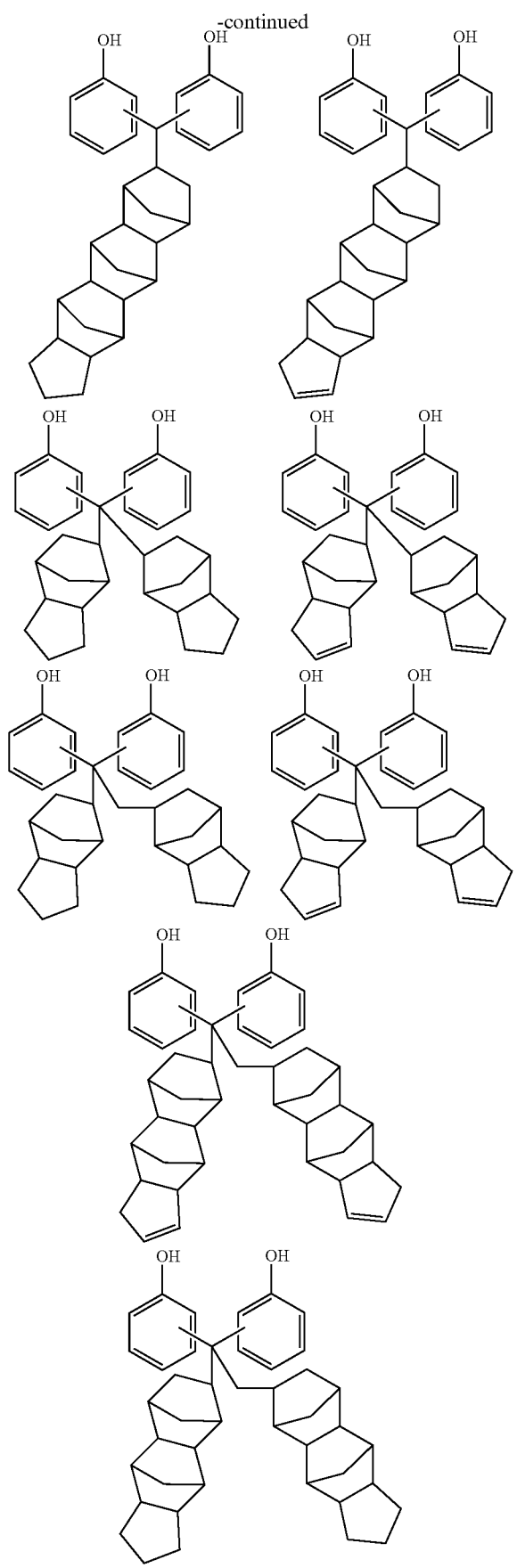
28
-continued
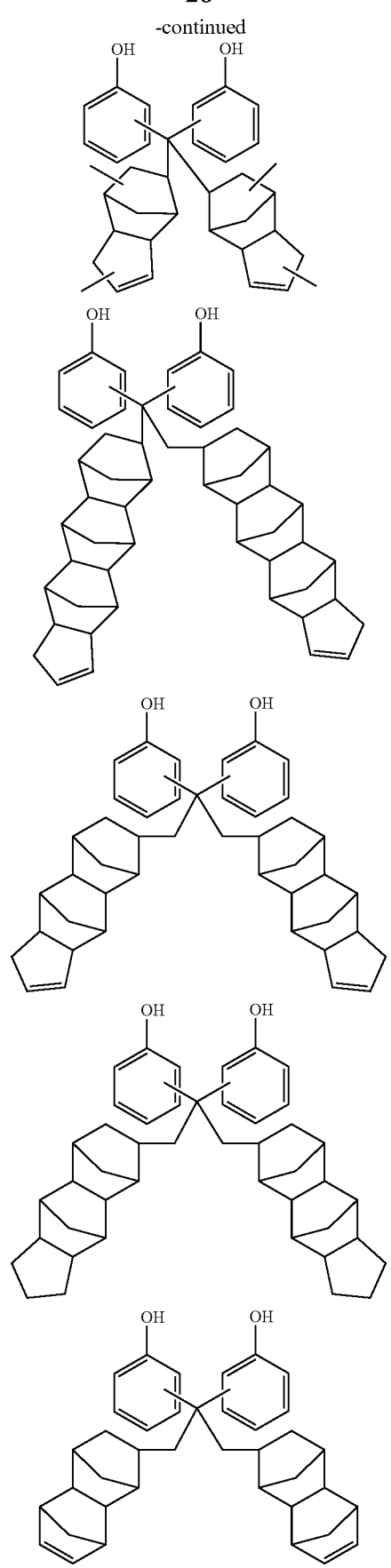

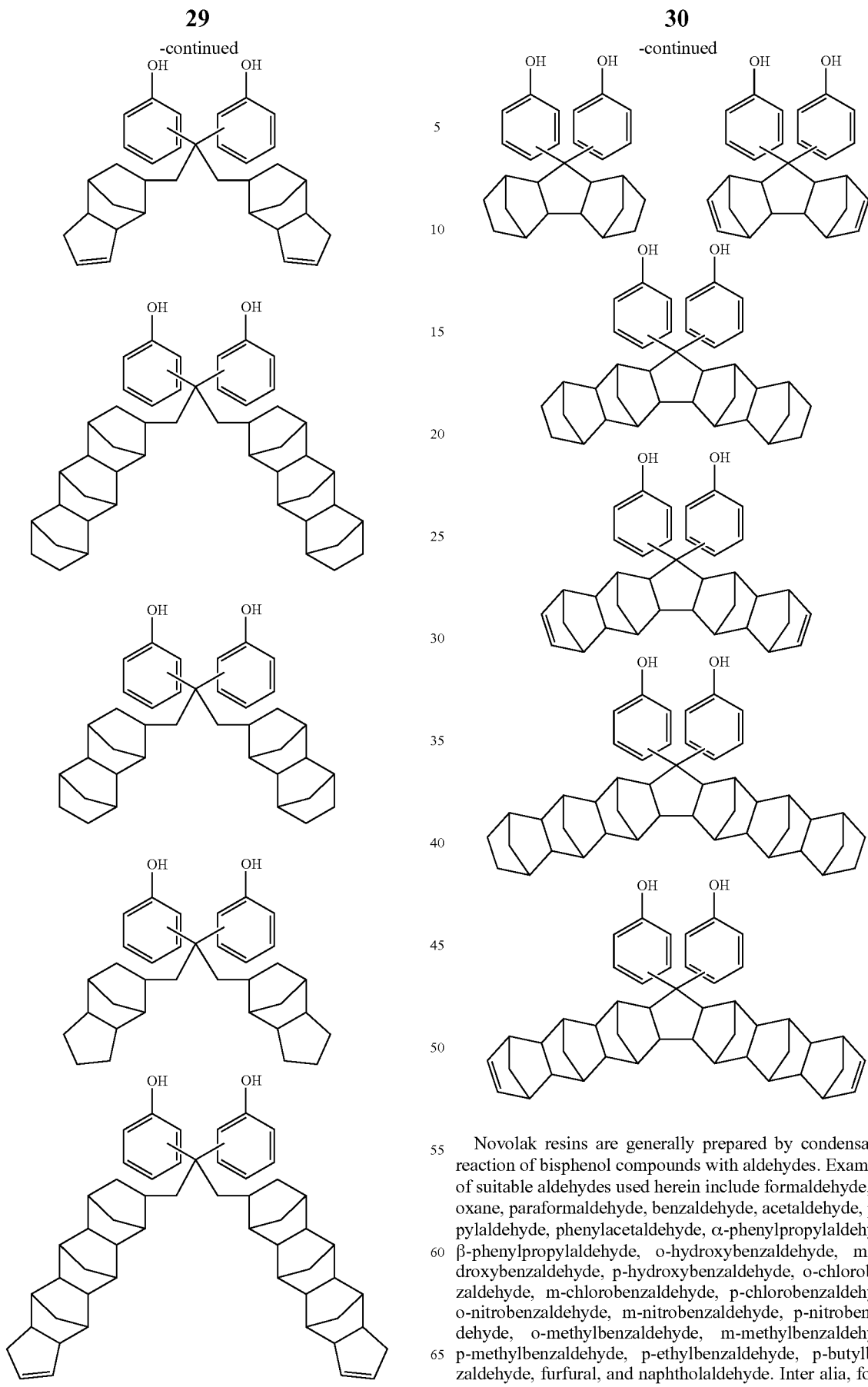

Novolak resins are generally prepared by condensation reaction of bisphenol compounds with aldehydes. Examples of suitable aldehydes used herein include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-butylbenzaldehyde, furfural, and naphtholaldehyde. Inter alia, formaldehyde is most preferred. These aldehydes may be used alone or in admixture of two or more. Preferably the aldehyde is used in an amount of 0.2 to 5 moles, more preferably 0.5 to 2 moles per mole of the bisphenol.

In the condensation reaction of bisphenols with aldehydes, catalysts may be used. Suitable catalysts are acidic catalysts such as hydrochloric acid, nitric acid, sulfuric acid, formic acid, oxalic acid, acetic acid, methanesulfonic acid, camphorsulfonic acid, tosylic acid, and trifluoromethanesulfonic acid. The acidic catalyst may be used in an amount of $1 \times 10^{-5}$ to $5 \times 10^{-1}$ mole per mole of the bisphenol.

It is noted that the aldehyde is not necessarily needed in the case of copolymerization reaction with compounds having a non-conjugated double bond such as indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, and limonene.

A reaction medium may be used for polycondensation, for example, water, methanol, ethanol, propanol, butanol, tetrahydrofuran, dioxane or a mixture thereof. The solvent may be used in an amount of 0 to 2,000 parts by weight per 100 parts by weight of the reactants. The reaction temperature may be selected as appropriate in accordance with the reactivity of the reactants used, and is typically in a range of 10 to 200° C.

The condensation reaction may be carried out by charging the bisphenol, aldehyde and catalyst all at once or by adding dropwise the bisphenol and aldehyde in the presence of the catalyst. After the completion of polycondensation reaction, it is desirable to remove the unreacted reactants and catalyst from the system. To this end, the reactor is heated at a temperature of 130 to 230° C. whereupon the volatiles may be removed in a vacuum of 1 to 50 mmHg.

The compound having a bisphenol group represented by formula (1) may be polymerized alone although another phenol may be copolymerized therewith. Examples of the phenol compound which can be copolymerized include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, and isothymol.

Besides, a further monomer may be copolymerized. Suitable copolymerizable monomers include 1-naphthol, 2-naphthol, 2-methyl-1-naphthol, 4-methoxy-1-naphthol, 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxynaphthalene-2-carboxylate, indene, hydroxyindene, benzofuran, hydroxyanthracene, hydroxypyrene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, limonene, sulfobenzene, sulfonaphthalene, sulfoanthracene, and sulfopyrene. With any of these monomers added, copolymers of three or more components may be used.

The novolak resin thus obtained is preferably composed of 10 to 100 mol %, more preferably 30 to 100 mol % of recurring units having formula (1), and optionally, 0 to 90 mol %, more preferably 0 to 80 mol % of recurring units derived from the copolymerizable phenol compound, and 0 to 90 mol %, more preferably 0 to 80 mol % of recurring units derived from the copolymerizable monomer.

The novolak resin preferably has a Mw of 1,000 to 30,000, more preferably 2,000 to 20,000, as measured versus polystyrene standards by GPC, and a dispersity (Mw/Mn) in the range of 1.2 to 7. It is preferred that the molecular weight distribution of the resin is narrowed by cutting off the monomeric and oligomeric components and low-molecular weight fractions having a Mw of less than 1,000, because the intermixing with the resist film is prevented.

The protective film-forming composition is generally formulated by dissolving the novolak resin in a solvent. The solvent used herein is not particularly limited as long as it does not dissolve the resist film. Examples of the solvent in which the resist film can be dissolved include ketones such as cyclohexanone and methyl-2-n-amyl ketone, alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and acetates such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents should not be used herein.

Examples of the solvent which does not dissolve the photoresist film and which can be preferably used herein include higher alcohols of 4 or more carbon atoms, such as 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclopentanol, and cyclohexanol. With the higher alcohol of 4 or more carbon atoms, an ether solvent and/or an aromatic solvent may be blended for preventing intermixing with the resist film. Suitable ether solvents include diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether and a mixture thereof. Suitable aromatic solvents include toluene, xylene, mesitylene, ethylbenzene, propylbenzene, butylbenzene, tert-butylbenzene, and anisole and a mixture thereof. Preferably the ether and/or aromatic solvent accounts for at least 50% by weight, more preferably at least 60% by weight based on the total weight of the solvent mixture. Also preferably the higher alcohol accounts for 5 to 50% by weight, more preferably 10 to 40% by weight based on the total weight of the solvent mixture. The solvent mixture is preferably used in an amount of 200 to 20,000 parts, more preferably 500 to 10,000 parts by weight per 100 parts by weight of the base resin.

An acid generator may be added to the protective film-forming composition used in the pattern forming process of the invention. Typical of the acid generator used herein is a compound capable of generating an acid in response to actinic light or radiation, known as photoacid generator (PAG). The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. Exemplary acid generators are described in U.S.

Pat. No. 7,537,880 (JP-A 2008-111103, paragraphs [0122] to [0142]). The acid generators may be used alone or in admixture of two or more. The PAG is preferably used in an amount of 0.1 to 20 parts, more preferably 0.5 to 10 parts by weight per 100 parts by weight of the base resin. The addition of the PAG to the protective film-forming composition is effective for minimizing bridge defects between resist pattern features after development.

An amine quencher may also be added to the protective film-forming composition. Exemplary amine quenchers are described in JP-A 2008-111103, paragraphs [0146] to [0164], for example. The addition of the amine quencher is effective for rendering the resist pattern after development more rectangular. A combination of an acid generator with an amine quencher is effective for reducing the LWR of the resist pattern. The amine quencher is preferably used in an amount of 0.01 to 10 parts, more preferably 0.05 to 5 parts by weight per 100 parts by weight of the base resin.

A surfactant may be added to the protective film-forming composition. Exemplary surfactants are described in JP-A 2008-111103, paragraphs [0165] to [0166]. The surfactant is preferably used in an amount of 0.0001 to 10 parts, more preferably 0.001 to 5 parts by weight per 100 parts by weight of the base resin.

Resist Composition

The photoresist composition used in the pattern forming process of the invention is typically a chemically amplified positive resist composition. The preferred resist composition used herein comprises a copolymer comprising recurring units of at least one type selected from recurring units (a1) and (a2) having a carboxyl group and phenol group whose hydroxyl moiety is substituted with an acid labile group, respectively, as represented by the general formula (2) and recurring units of at least one type selected from recurring units (b1) and (b2) of a sulfonium salt as represented by the general formula (3) and having a weight average molecular weight of 1,000 to 500,000, as a base resin. A resist composition based on such a polymer having an acid generator bound to its backbone has the advantage that it forms a pattern with minimized edge roughness (LWR) after development.

(2)

(3)

In formula (2), $R^1$ and $R^3$ are each independently hydrogen or methyl. $R^2$ and $R^4$ each are an acid labile group. $X^1$ is a single bond, a $C_1$-$C_{12}$ linking group having one or more radical selected from among an ester radical, lactone ring, phenylene radical, and naphthylene radical, a phenylene group or a naphthylene group. $X^2$ is a single bond, an ester group or an amide group. In formula (3), $R^5$ and $R^9$ are each independently hydrogen or methyl. $R^6$, $R^7$, $R^8$, $R^{10}$, $R^{11}$ and $R^{12}$ are each independently a straight, branched or cyclic $C_1$-$C_{12}$ alkyl group which may contain a carbonyl, ester or ether radical, or a $C_6$-$C_{12}$ aryl group, a $C_7$-$C_{20}$ aralkyl group or a thiophenyl group. $A^1$ is a single bond, -$A^0$-C(=O)—O— or -$A^0$-O—C(=O)—, wherein $A^0$ is a straight, branched or cyclic $C_1$-$C_{12}$ alkylene group which may contain a carbonyl, ester or ether radical. $A^2$ is hydrogen or $CF_3$. $Z^1$ is a single bond, methylene, ethylene, phenylene, fluorophenylene, —O—$R^{13}$—, or —C(=O)—$Z^2$—$R^{13}$—, wherein $Z^2$ is oxygen or NH, and $R^{13}$ is a straight, branched or cyclic $C_1$-$C_6$ alkylene group, phenylene group, fluorophenylene group, trifluoromethyl-substituted phenylene group or alkenylene group, which may contain a carbonyl, ester, ether or hydroxyl radical. The subscripts a1, a2, b1 and b2 are numbers in the range: $0 \le a1 \le 0.9$, $0 \le a2 \le 0.9$, $0 < a1+a2 \le 0.9$, $0 \le b1 \le 0.3$, $0 \le b2 \le 0.3$, and $0 < b1+b2 \le 0.3$.

Of the recurring units in the polymer serving as base resin in the resist composition, the recurring units (a1) having an acid labile group in formula (2) are recurring units having a carboxyl group, typically (meth)acrylate, in which the hydrogen of its hydroxyl moiety is substituted by an acid labile group. Suitable monomers from which the recurring units (a1) are derived are illustrated below.

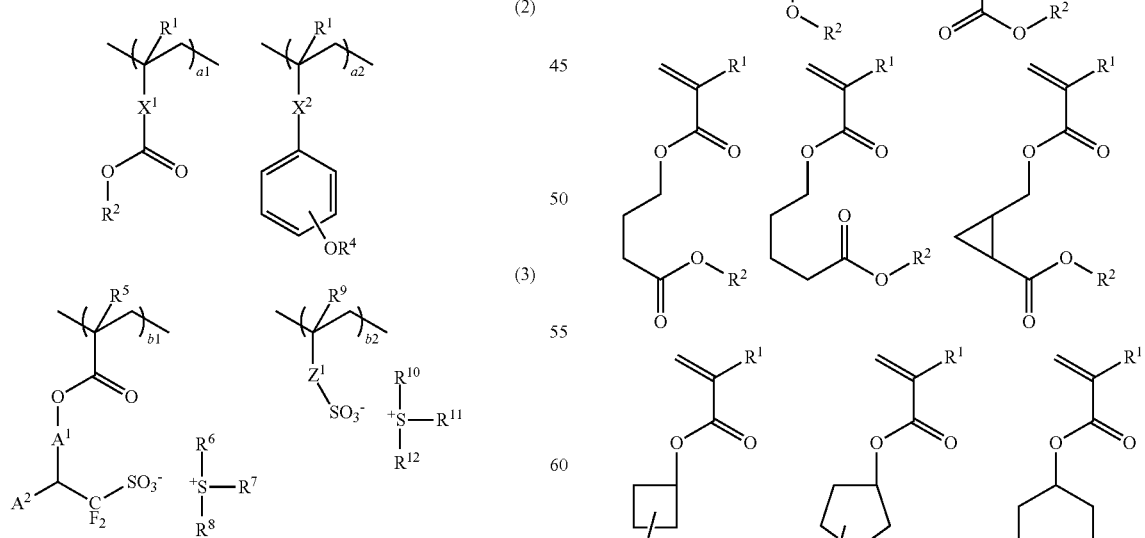

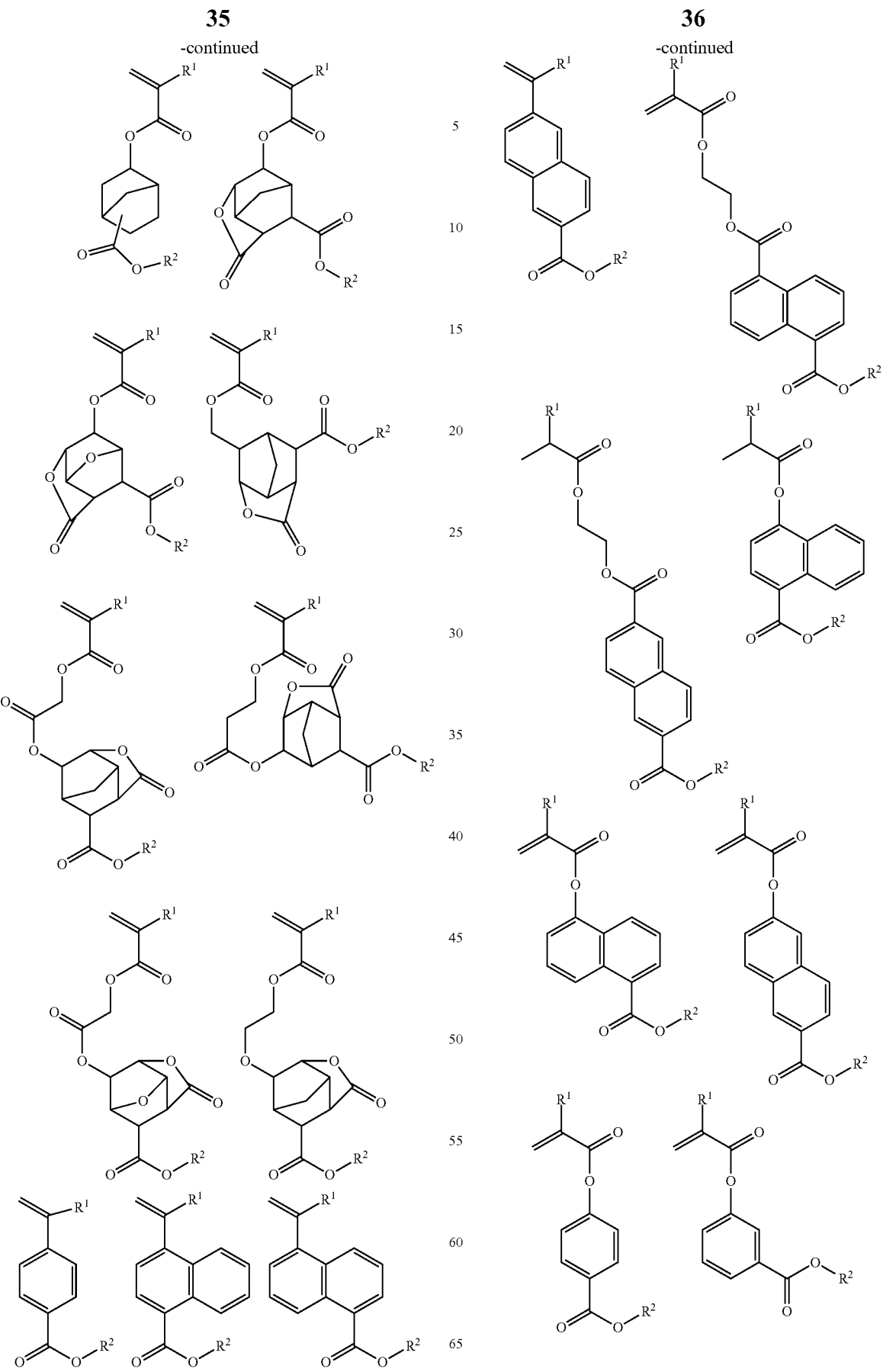
Herein $R^1$ and $R^2$ are as defined above.

The recurring units (a2) having an acid labile group in formula (2) are recurring units having a phenolic hydroxyl group, typically hydroxystyrene or hydroxyphenyl(meth) acrylate, in which the hydrogen of its hydroxyl moiety is substituted by an acid labile group. Suitable monomers from which the recurring units (a2) are derived are illustrated below.

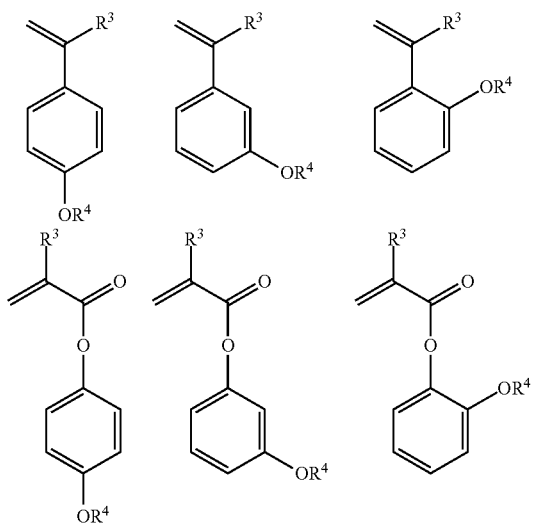

Herein $R^3$ and $R^4$ are as defined above.

The acid labile groups represented by $R^2$ and $R^4$ in formula (2) may be selected from a variety of such groups. The acid labile groups may be the same or different and preferably include groups of the following formulae (A-1) to (A-3).

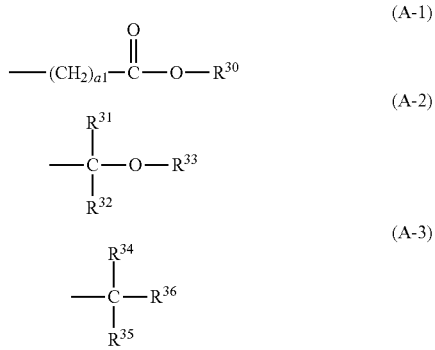

In formula (A-1), $R^{30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter a1 is an integer of 0 to 6.

In formula (A-2), $R^{31}$ and $R^{32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

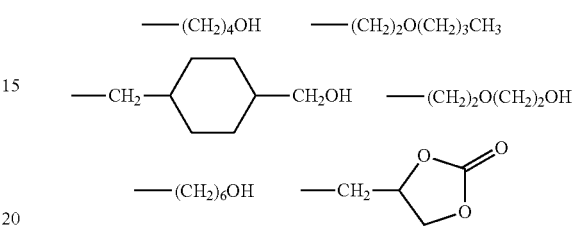

A pair of $R^{31}$ and $R^{32}$, $R^{31}$ and $R^{33}$, or $R^{32}$ and $R^{33}$ may bond together to form a ring with the carbon and oxygen atoms to which they are attached. Each of $R^{31}$, $R^{32}$ and $R^{33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

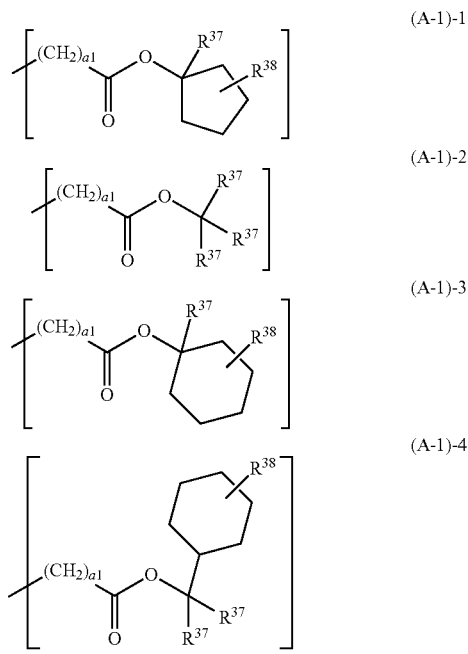

-continued

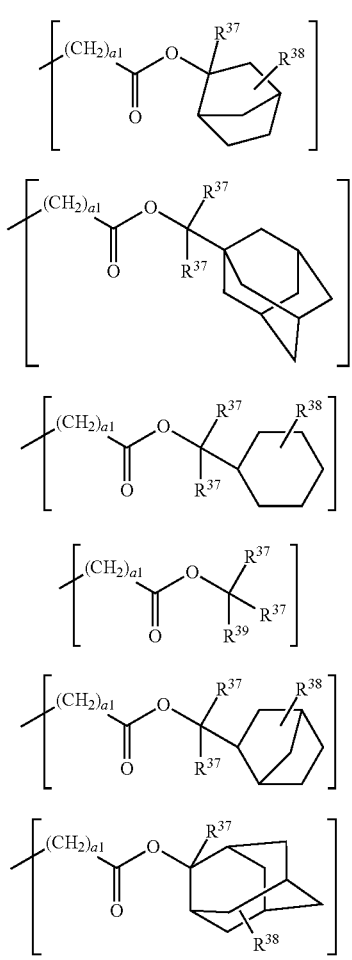

(A-1)-5
(A-1)-6
(A-1)-7
(A-1)-8
(A-1)-9
(A-1)-10

Herein $R^{37}$ is each independently a straight, branched or cyclic $C_1$-$C_{10}$ alkyl group or $C_6$-$C_{20}$ aryl group. $R^{38}$ is hydrogen or a straight, branched or cyclic $C_1$-$C_{10}$ alkyl group. $R^{39}$ is each independently a straight, branched or cyclic $C_2$-$C_{10}$ alkyl group or $C_6$-$C_{20}$ aryl group. The subscript a1 is an integer of 0 to 6.

Of the acid labile groups of formula (A-2), the straight and branched ones are exemplified by the following groups having formulae (A-2)-1 to (A-2)-69.

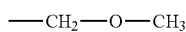 (A-2)-1
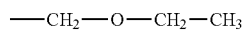 (A-2)-2
 (A-2)-3
 (A-2)-4
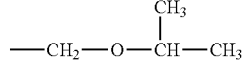 (A-2)-5
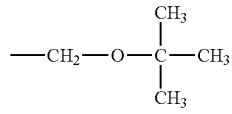 (A-2)-6

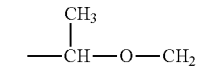 (A-2)-7
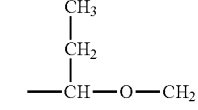 (A-2)-8
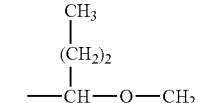 (A-2)-9
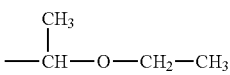 (A-2)-10
 (A-2)-11
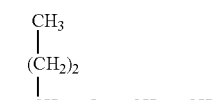 (A-2)-12
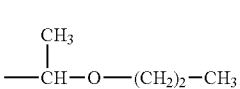 (A-2)-13
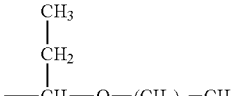 (A-2)-14
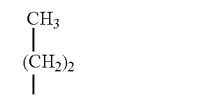 (A-2)-15
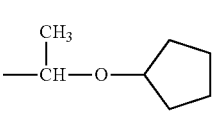 (A-2)-16
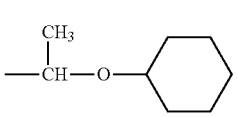 (A-2)-17
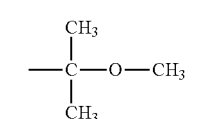 (A-2)-18
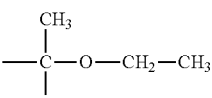 (A-2)-19
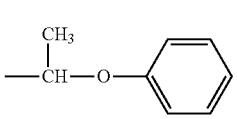 (A-2)-20

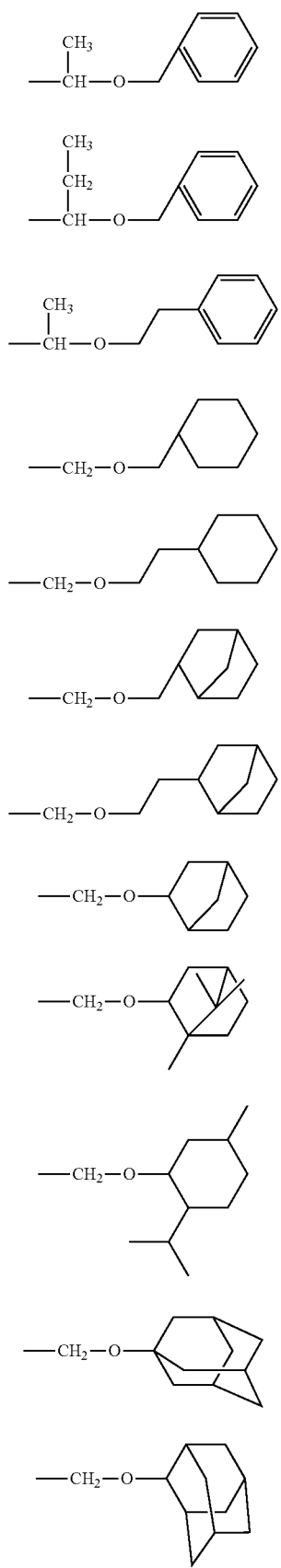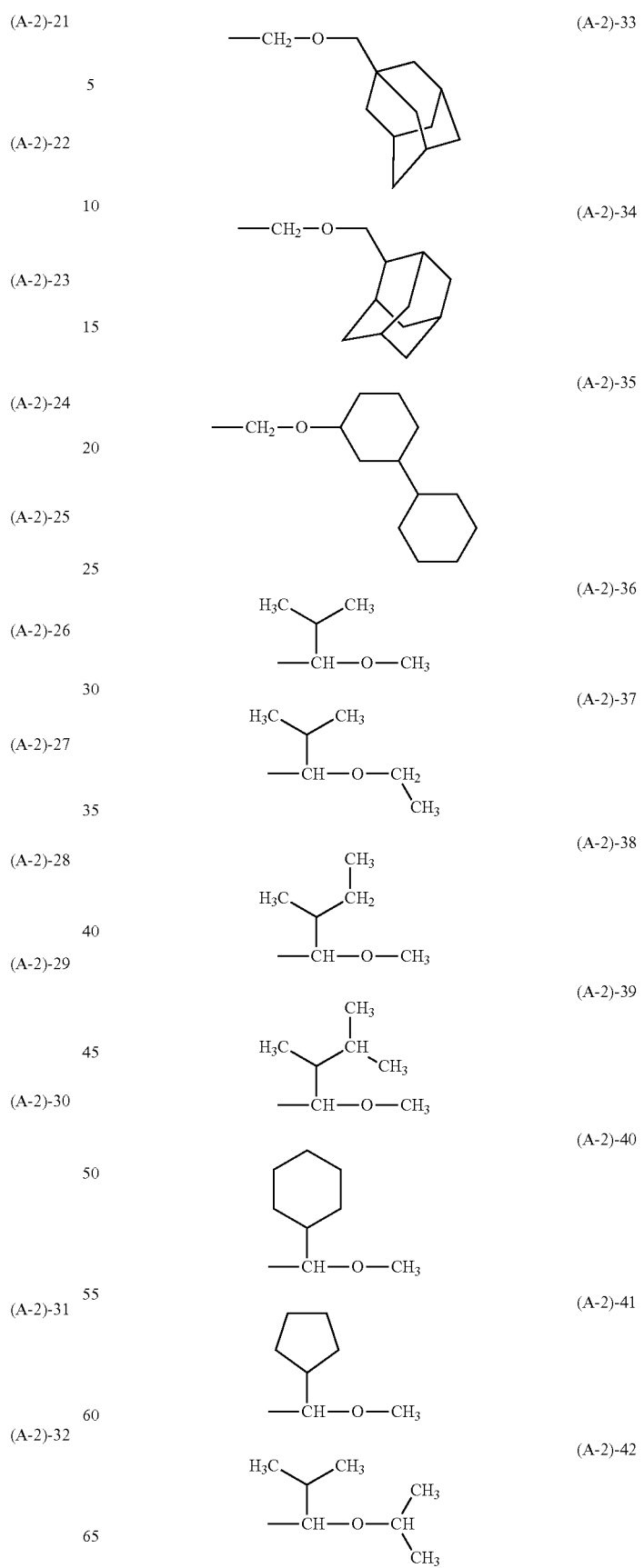

-continued
(A-2)-43
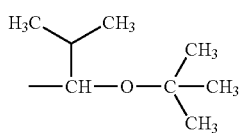
(A-2)-44
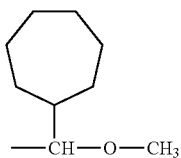
(A-2)-45
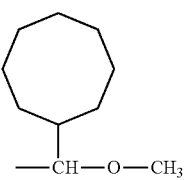
(A-2)-46
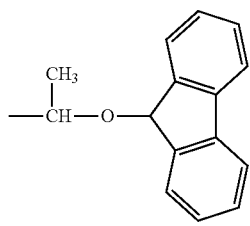
(A-2)-47
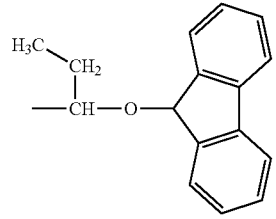
(A-2)-48
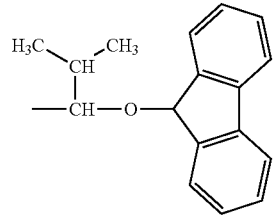
(A-2)-49
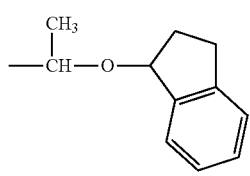
(A-2)-50
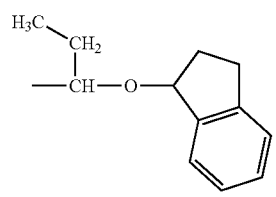
-continued
(A-2)-51
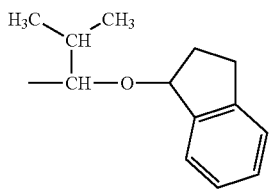
(A-2)-52
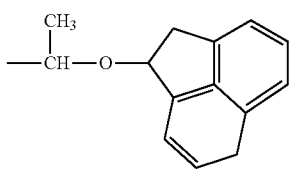
(A-2)-53
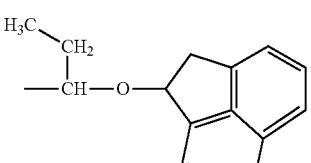
(A-2)-54
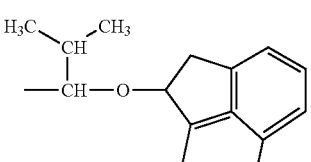
(A-2)-55
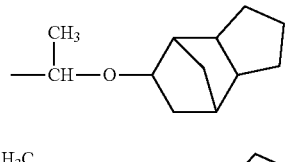
(A-2)-56
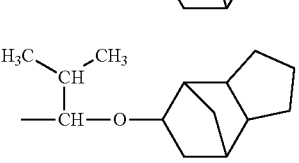
(A-2)-57
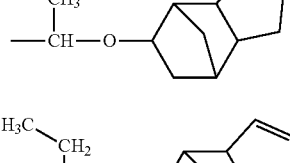
(A-2)-58
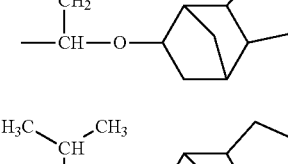
(A-2)-59
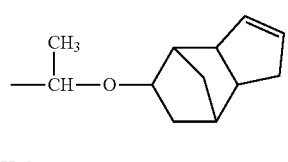
(A-2)-60
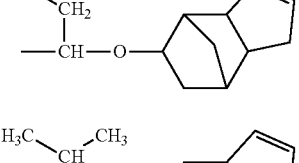

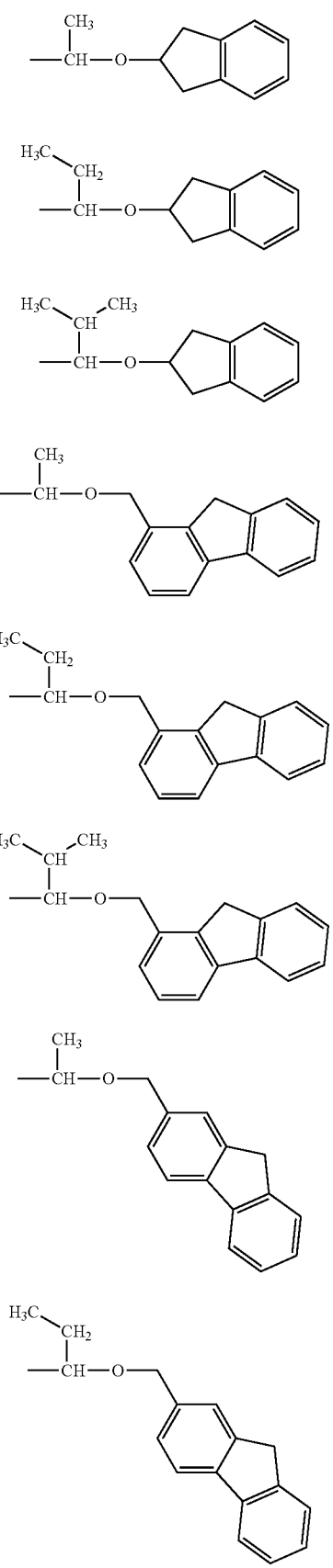

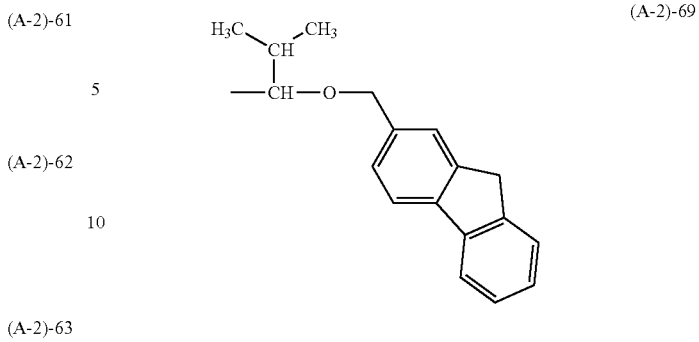

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

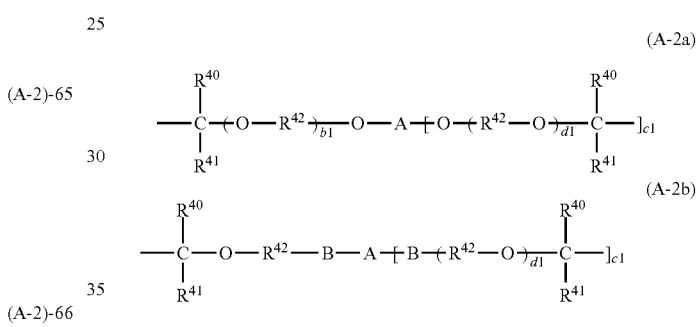

Herein $R^{40}$ and $R^{41}$ each are hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{44}$ are straight or branched $C_1$-$C_8$ alkylene groups when they form a ring. $R^{42}$ is a straight, branched or cyclic $C_1$-$C_{10}$ alkylene group. Each of b1 and d1 is 0 or an integer of 1 to 10, preferably 0 or an integer of 1 to 5, and c1 is an integer of 1 to 7. "A" is a (c1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl radicals or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some hydrogen atoms attached to carbon atoms may be substituted by hydroxyl, carboxyl, acyl radicals or halogen atoms. The subscript c1 is preferably an integer of 1 to 3.

The crosslinking acetal groups of formulae (A-2a) and (A-2b) are exemplified by the following formulae (A-2)-70 through (A-2)-77.

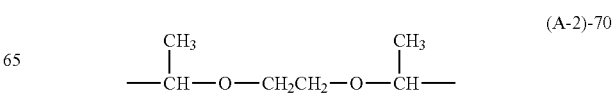

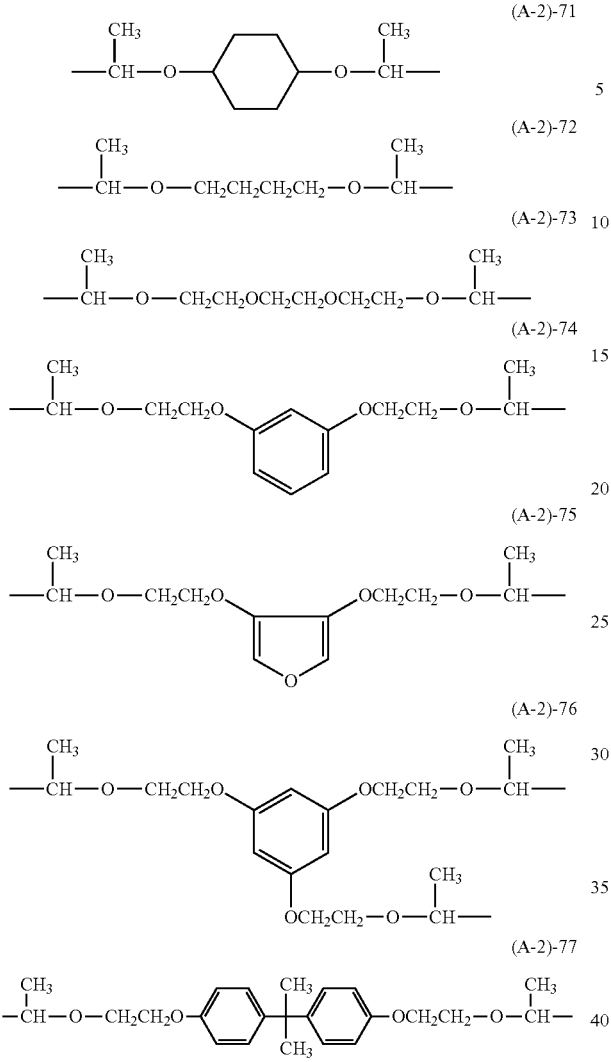

In formula (A-3), $R^{34}$, $R^{35}$ and $R^{36}$ each are a monovalent hydrocarbon group, typically a straight, branched or cyclic $C_1$-$C_{20}$ alkyl group or straight, branched or cyclic $C_2$-$C_{20}$ alkenyl group, which may contain a heteroatom such as oxygen, sulfur, nitrogen or fluorine. A pair of $R^{34}$ and $R^{35}$, $R^{34}$ and $R^{36}$, or $R^{35}$ and $R^{36}$ may bond together to form a $C_3$-$C_{20}$ aliphatic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

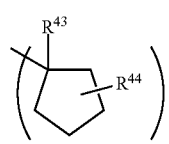

(A-3)-1

(A-3)-2

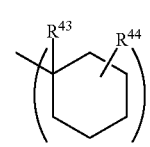

(A-3)-3

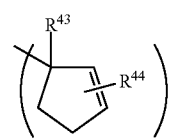

(A-3)-4

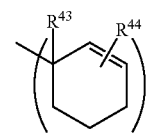

(A-3)-5

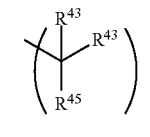

(A-3)-6

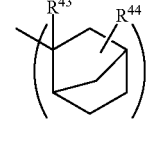

(A-3)-7

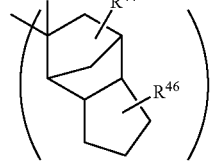

(A-3)-8

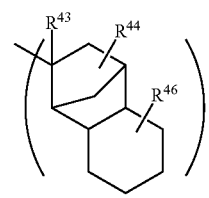

(A-3)-9

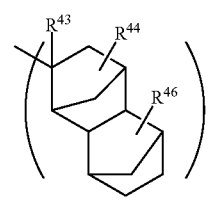

(A-3)-10

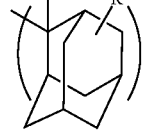

(A-3)-11

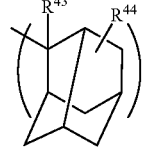

-continued (A-3)-12

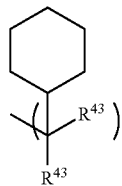

(A-3)-13

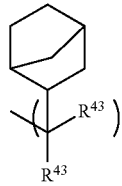

(A-3)-14

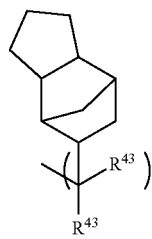

(A-3)-15

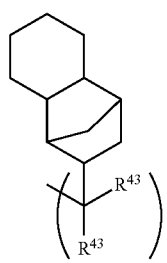

(A-3)-16

(A-3)-17

(A-3)-18

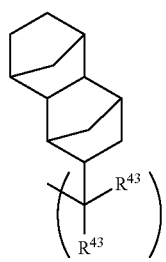

Herein $R^{43}$ is each independently a straight, branched or cyclic $C_1$-$C_8$ alkyl group or $C_6$-$C_{20}$ aryl group, typically phenyl, $R^{44}$ and $R^{46}$ each are hydrogen or a straight, branched or cyclic $C_1$-$C_{20}$ alkyl group, and $R^{45}$ is a $C_6$-$C_{20}$ aryl group, typically phenyl.

The polymer may be crosslinked within the molecule or between molecules with groups having $R^{47}$ which is a di- or multi-valent alkylene or arylene group, as shown by the following formulae (A-3)-19 and (A-3)-20.

(A-3)-19

(A-3)-20

Herein $R^{43}$ is as defined above, $R^{47}$ is a straight, branched or cyclic $C_1$-$C_{20}$ alkylene group or arylene group, typically phenylene, which may contain a heteroatom such as oxygen, sulfur or nitrogen, and e1 is an integer of 1 to 3.

Of acid labile groups of formula (A-3), recurring units of (meth)acrylate having an exo-form structure represented by the formula (A-3)-21 are preferred as the recurring unit (a1).

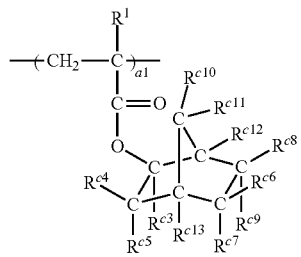

(A-3)-21

Herein, $R^1$ and a1 are as defined above; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

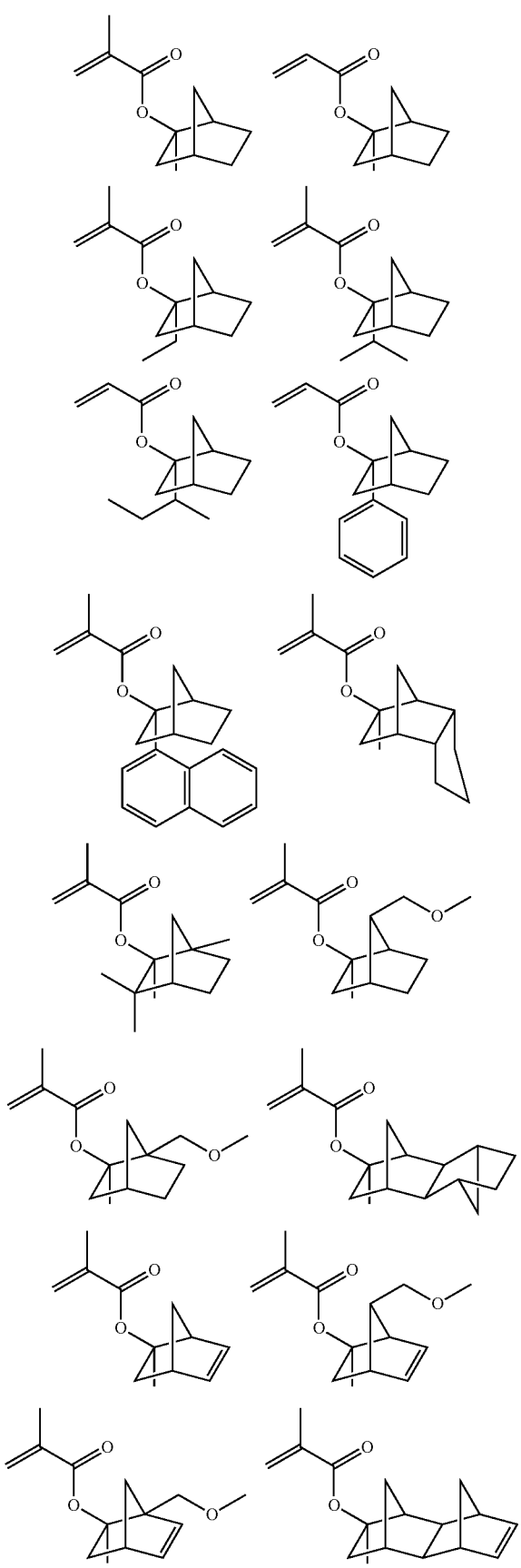

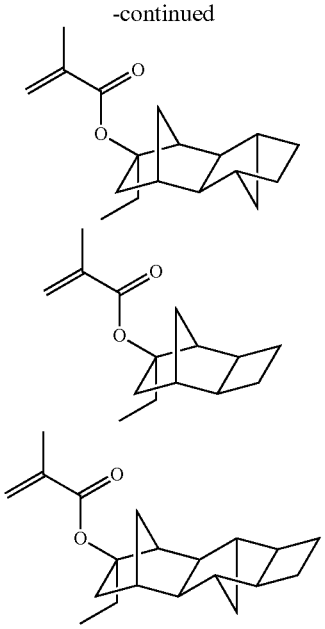

Also included in the acid labile groups of formula (A-3) are acid labile groups of (meth)acrylate having furandiyl, tetrahydrofurandiyl or oxanorbornanediyl in recurring units (a1) represented by the following formula (A-3)-22.

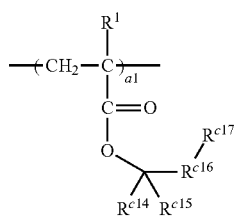

Herein, $R^1$ and a1 are as defined above; $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

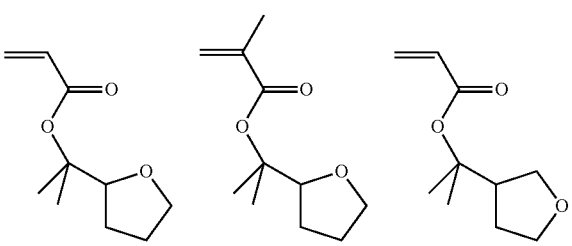

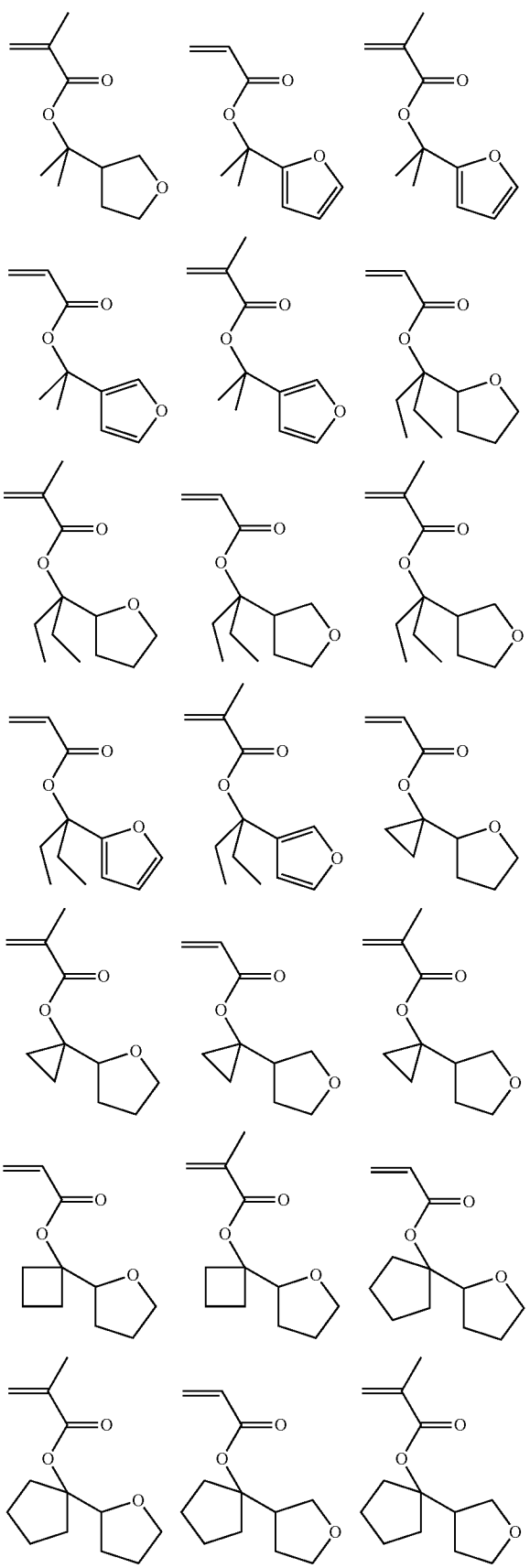
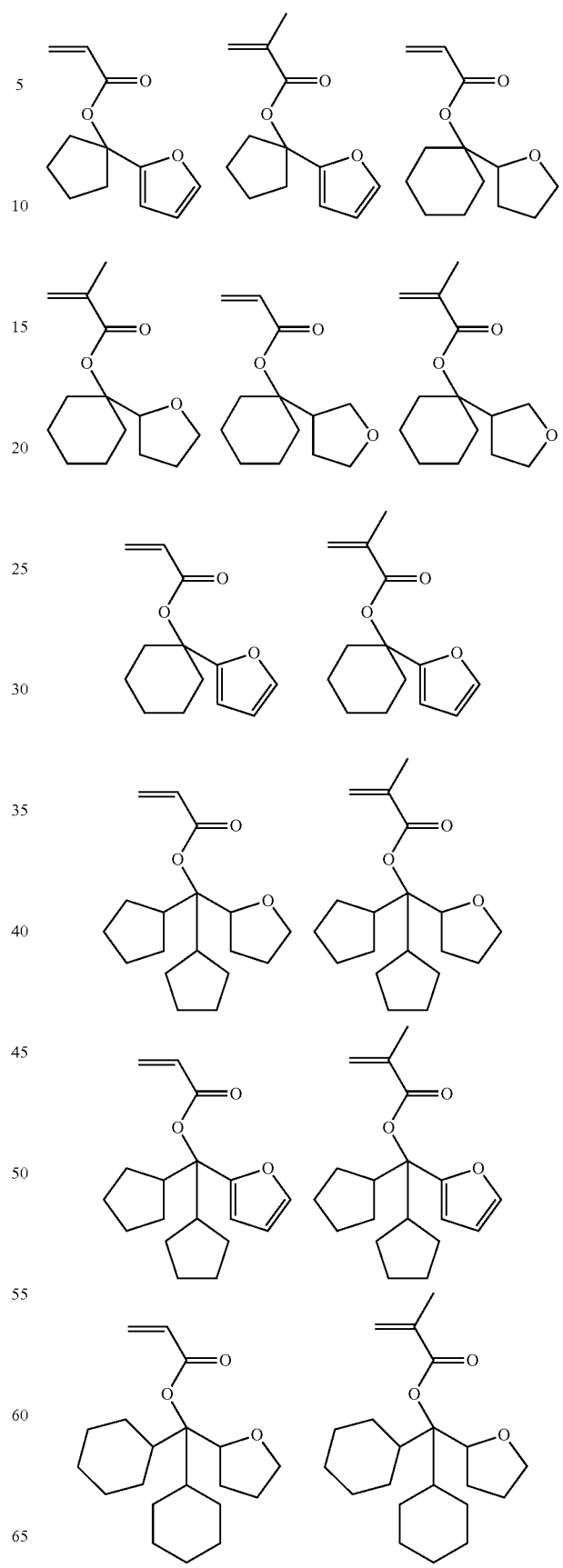

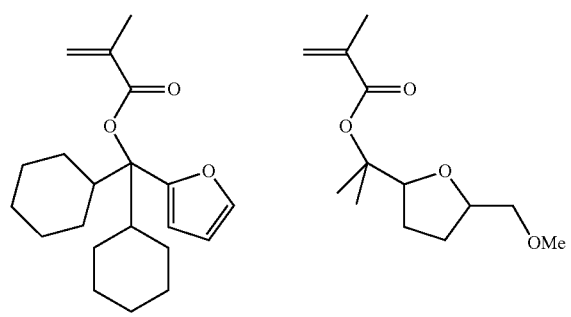
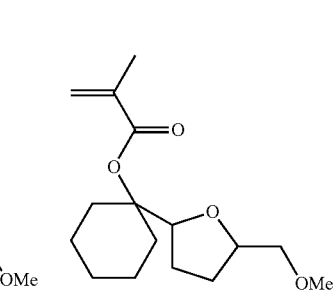
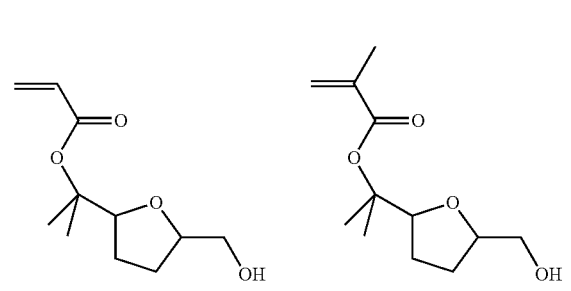
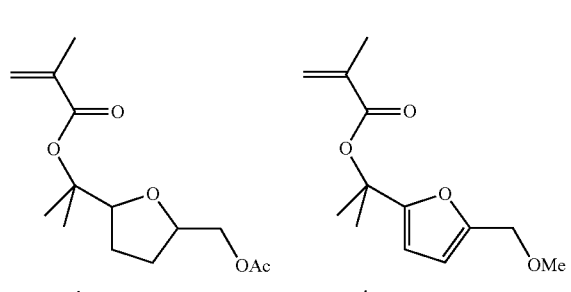
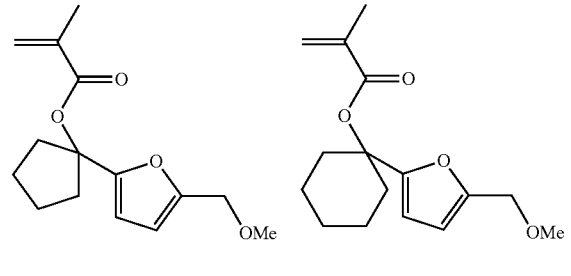
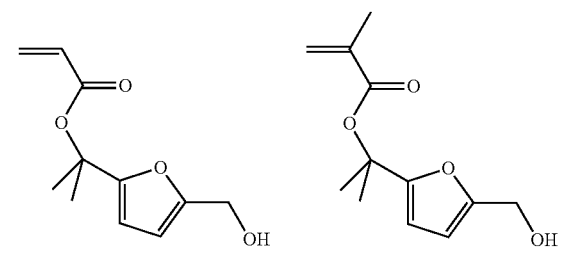
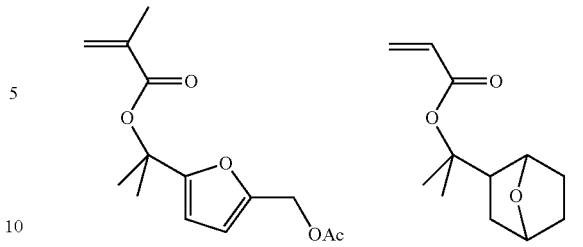
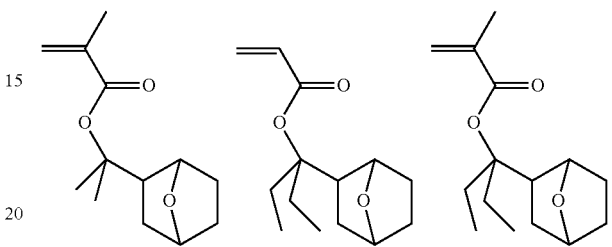
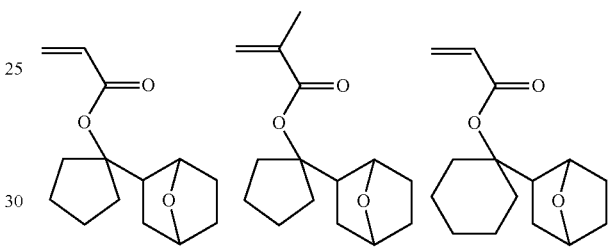
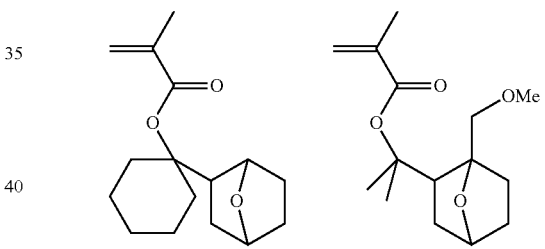
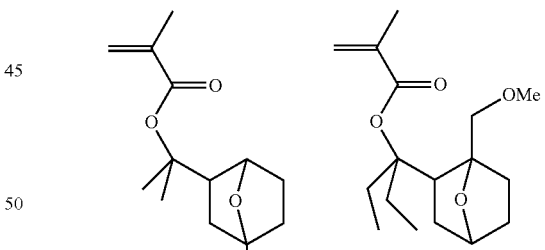
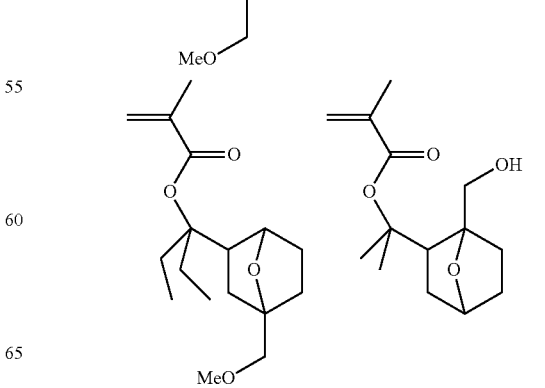

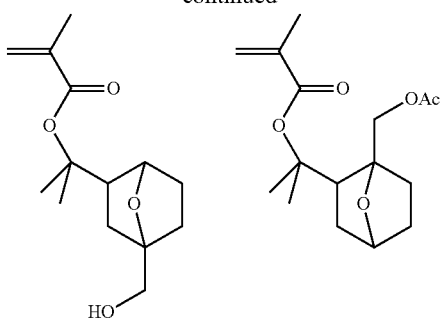
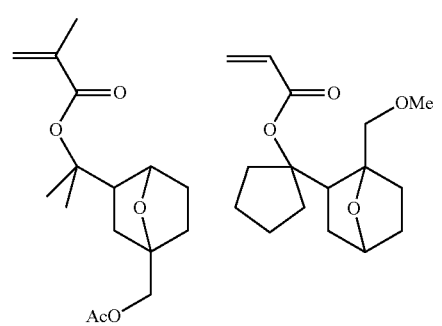
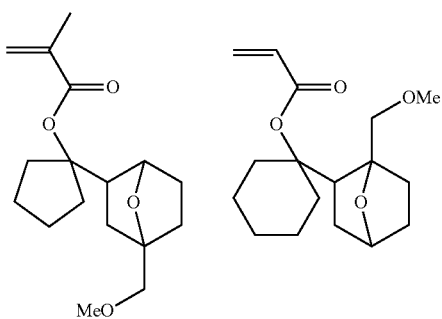
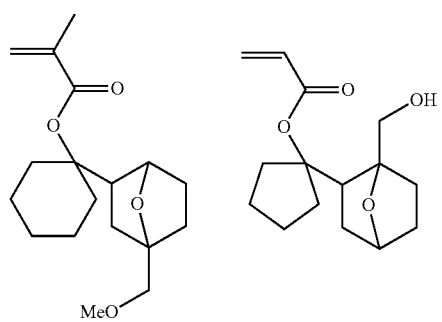
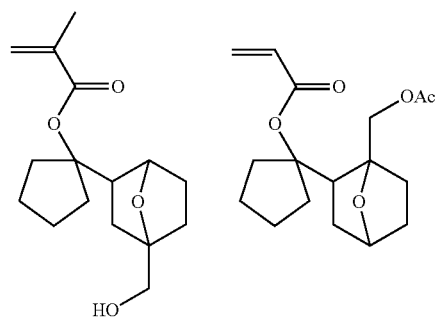

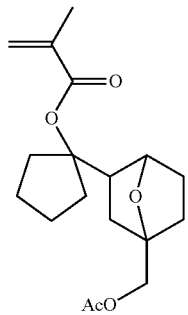

Also included in the acid labile group $R^2$ in recurring units (a1) are groups having the general formula (A-3)-23.

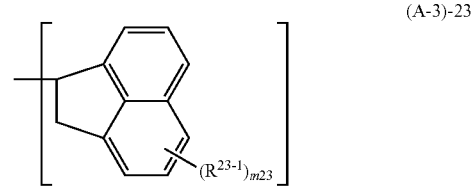

(A-3)-23

Herein, $R^{23-1}$ is hydrogen, a $C_1$-$C_4$ alkyl, alkoxy, alkanoyl or alkoxycarbonyl group, $C_6$-$C_{10}$ aryl group, halogen atom or cyano group, and m23 is an integer of 1 to 4.

Examples of the monomer from which the recurring units (a1) having an acid labile group of formula (A-3)-23 substituted thereon are derived are shown below.

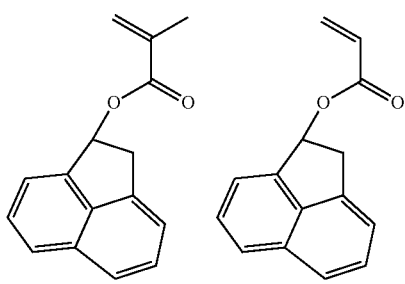
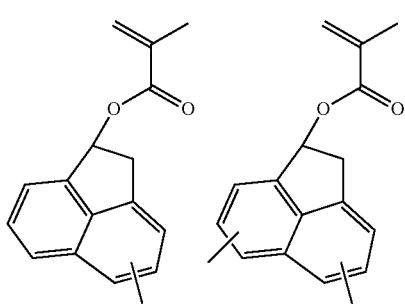

-continued

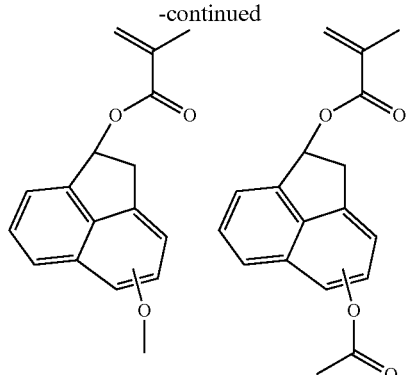
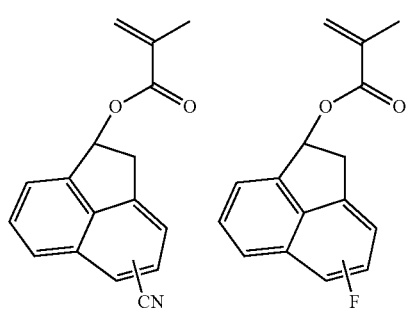
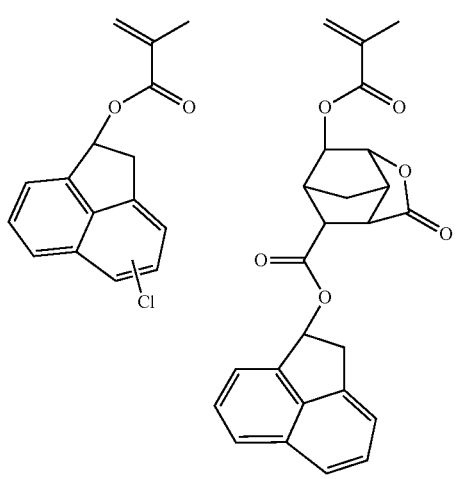
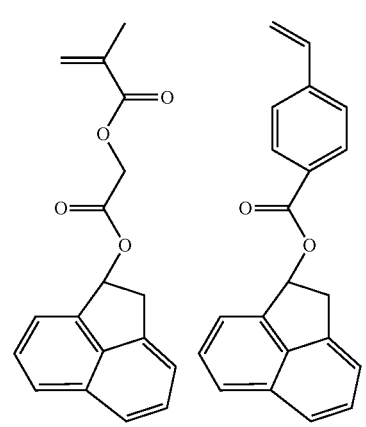

-continued

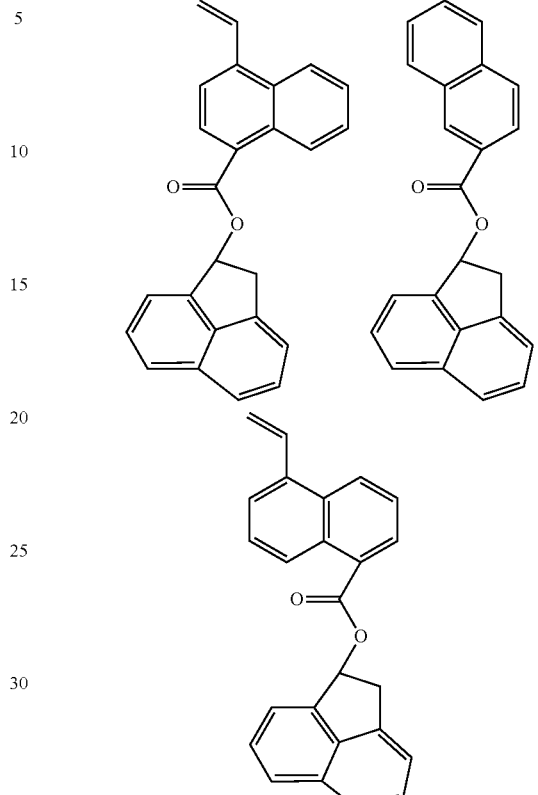

Also included in the acid labile group $R^2$ in recurring units (a1) are groups having the general formula (A-3)-24.

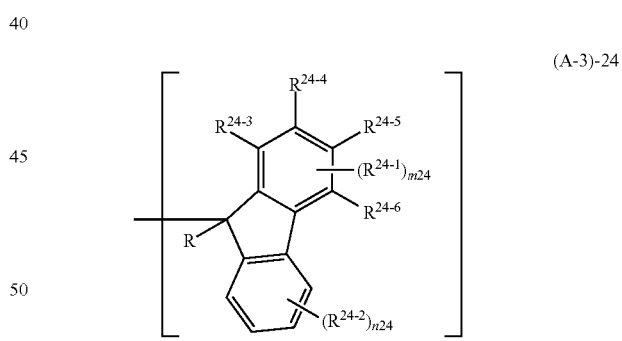

(A-3)-24

Herein, $R^{24-1}$ and $R^{24-2}$ each are hydrogen, a $C_1$-$C_4$ alkyl, alkoxy, alkanoyl or alkoxycarbonyl group, hydroxy group, $C_6$-$C_{10}$ aryl group, halogen atom or cyano group. R is hydrogen, a straight, branched or cyclic $C_1$-$C_{12}$ alkyl group, $C_2$-$C_{12}$ alkenyl group, $C_2$-$C_{12}$ alkynyl, or $C_6$-$C_{10}$ aryl group, which may have an oxygen or sulfur atom. $R^{24-3}$, $R^{24-4}$, $R^{24-5}$ and $R^{24-6}$ each are hydrogen, or a pair of $R^{24-3}$ and $R^{24-4}$, $R^{24-4}$ and $R^{24-5}$, or $R^{24-5}$ and $R^{24-6}$ may bond together to form a benzene ring. The subscripts m24 and n24 each are an integer of 1 to 4.

Examples of the monomer from which the recurring units (a1) having an acid labile group of formula (A-3)-24 substituted thereon are derived are shown below.

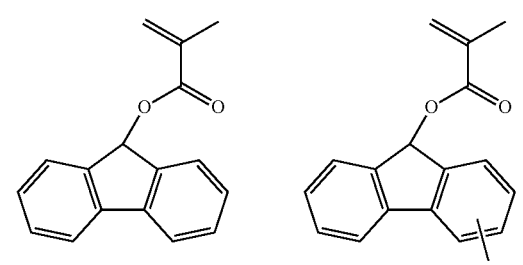
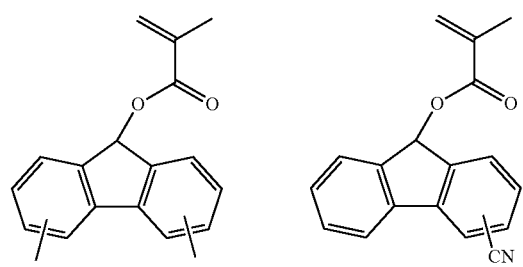
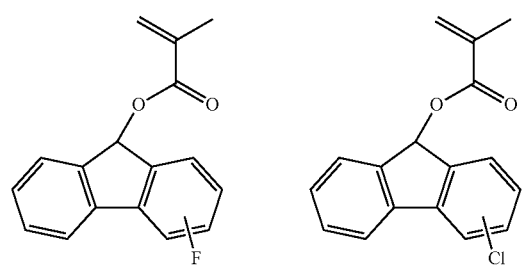
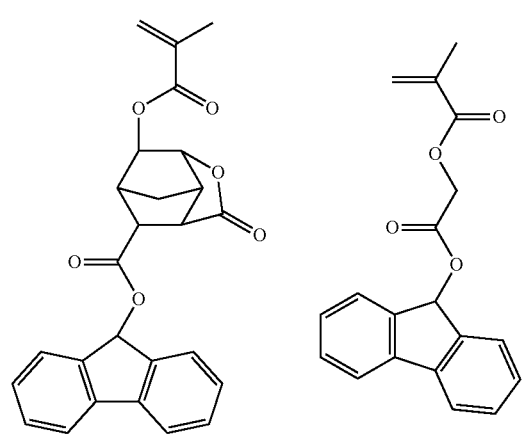
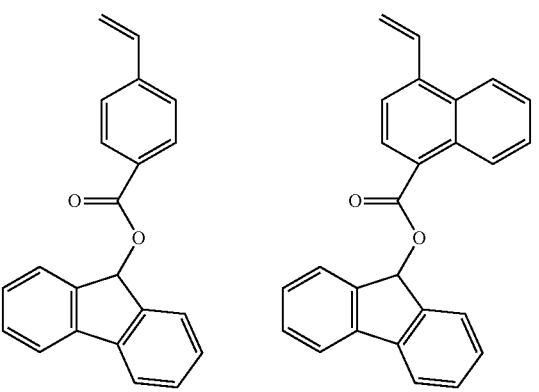

-continued
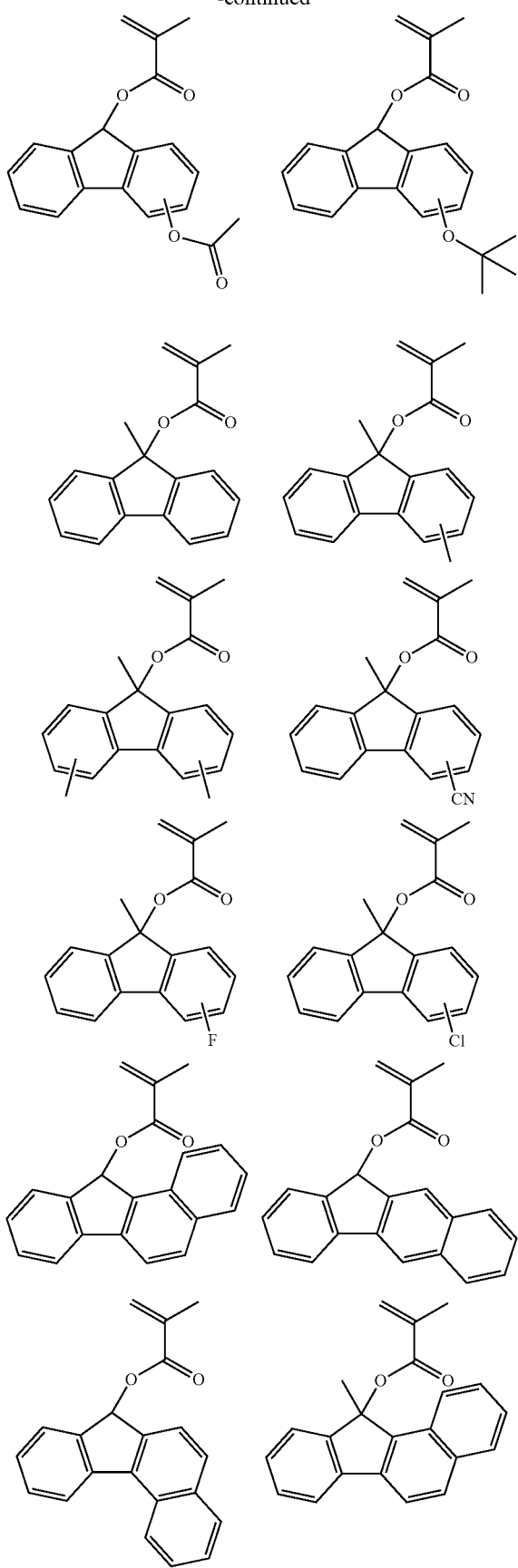
-continued
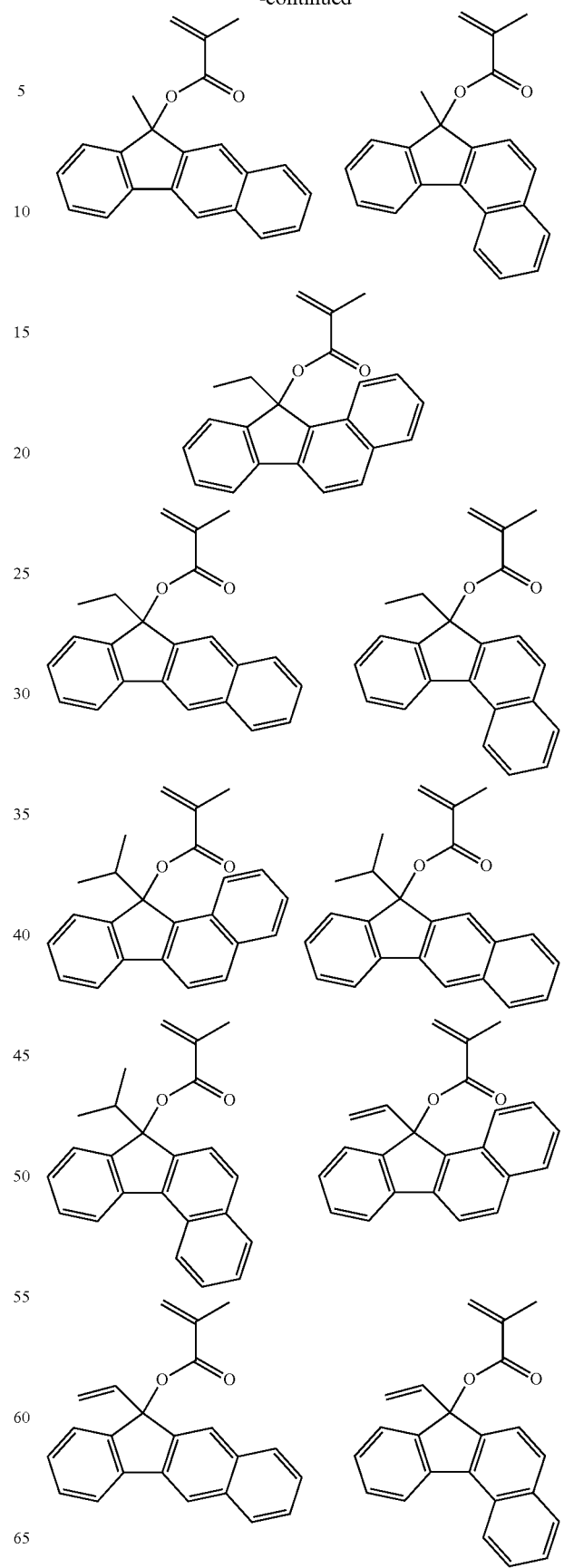

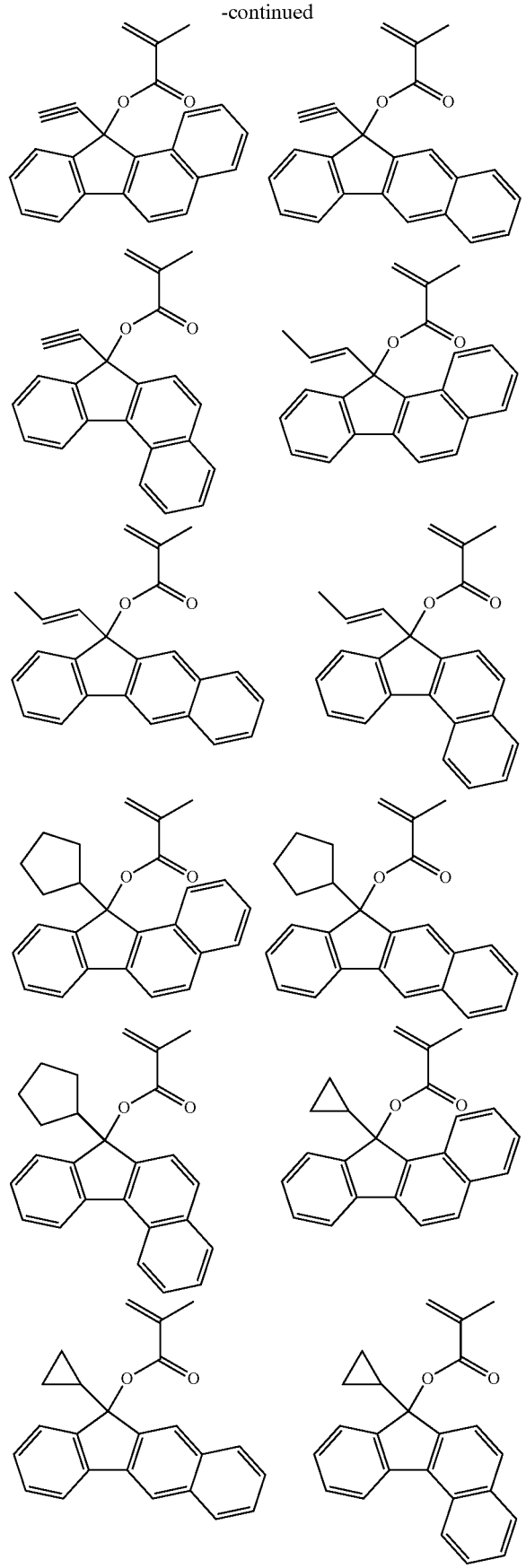
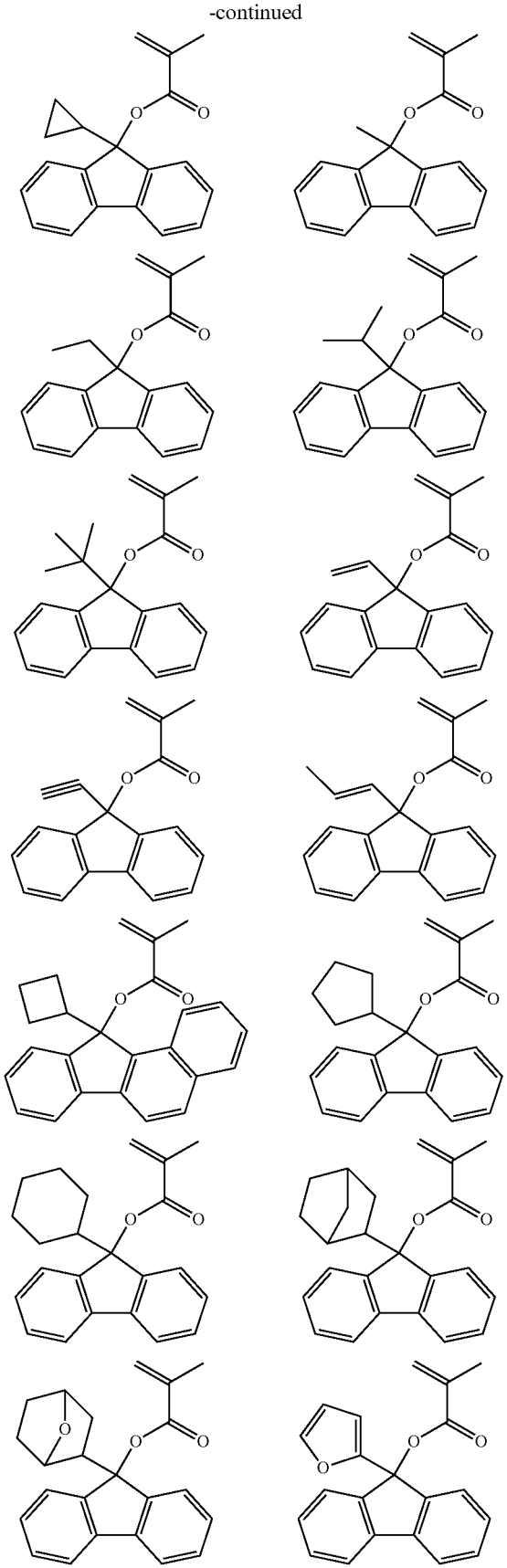

-continued

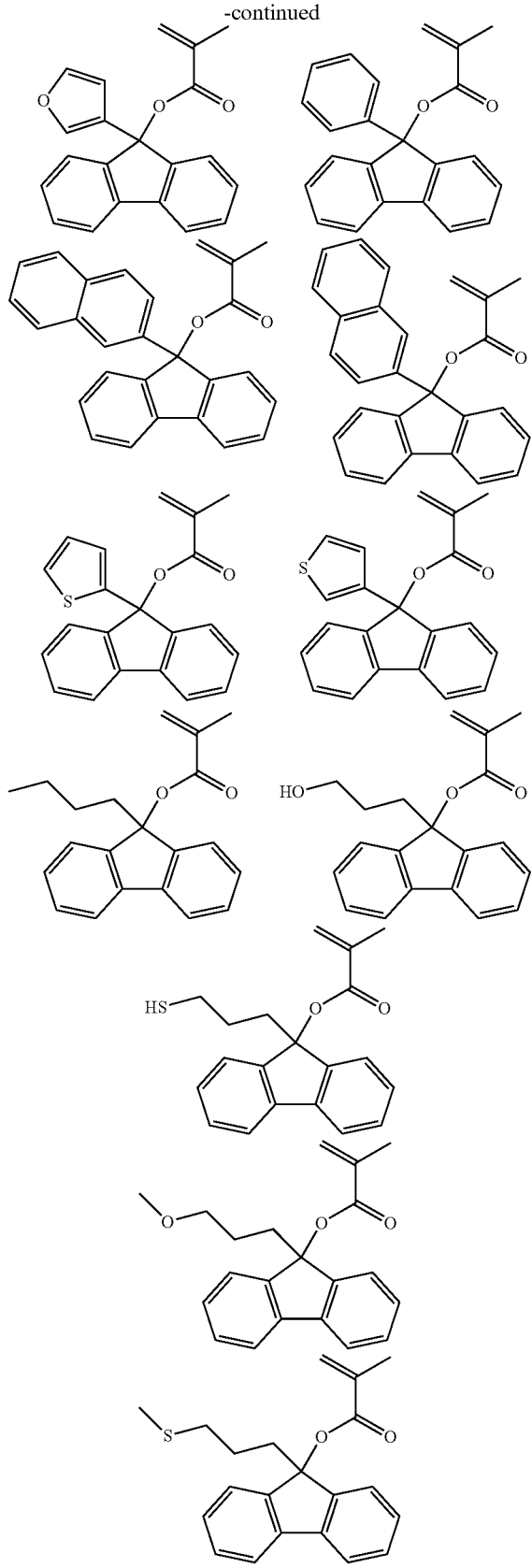

Also included in the acid labile group R² in recurring units (a1) are groups having the general formula (A-3)-25.

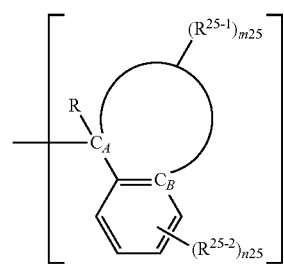

Herein, $R^{25-1}$ is each independently hydrogen or a straight, branched or cyclic $C_1$-$C_6$ alkyl group; when m25 is not less than 2, groups $R^{25-2}$ may bond together to form a $C_2$-$C_8$ non-aromatic ring. The circle stands for a link selected from ethylene, propylene, butylene and pentylene with the carbon atoms $C_A$ and $C_B$. $R^{25-2}$ is a $C_1$-$C_4$ alkyl group, alkoxy group, alkanoyl group, alkoxycarbonyl group, hydroxyl group, nitro group, $C_6$-$C_{10}$ aryl group, halogen atom, or cyano group. R has the same meaning as R in formula (A-3)-24. When the circle stands for ethylene or propylene, it is excluded that $R^{25-1}$ be hydrogen. The subscripts m25 and n25 each are an integer of 1 to 4.

Examples of the monomer from which the recurring units (a1) having an acid labile group of formula (A-3)-25 substituted thereon are derived are shown below.

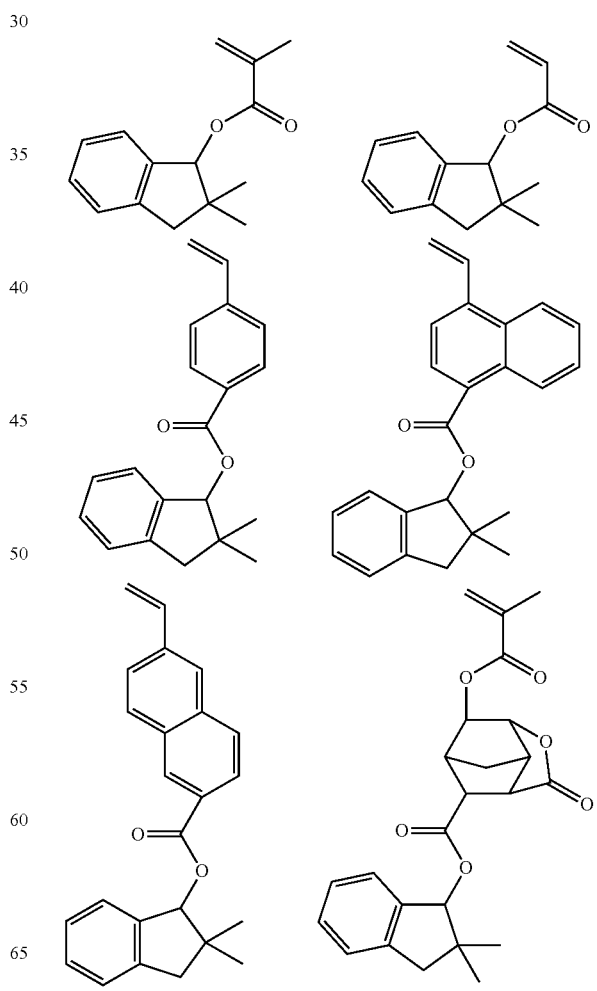

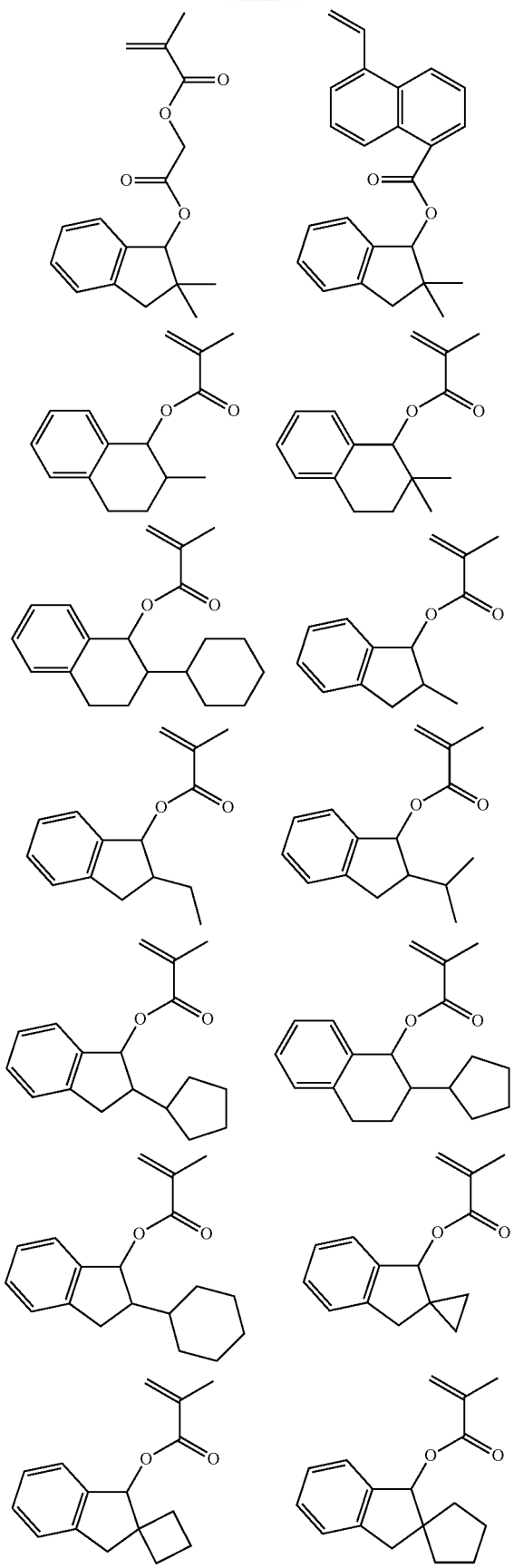
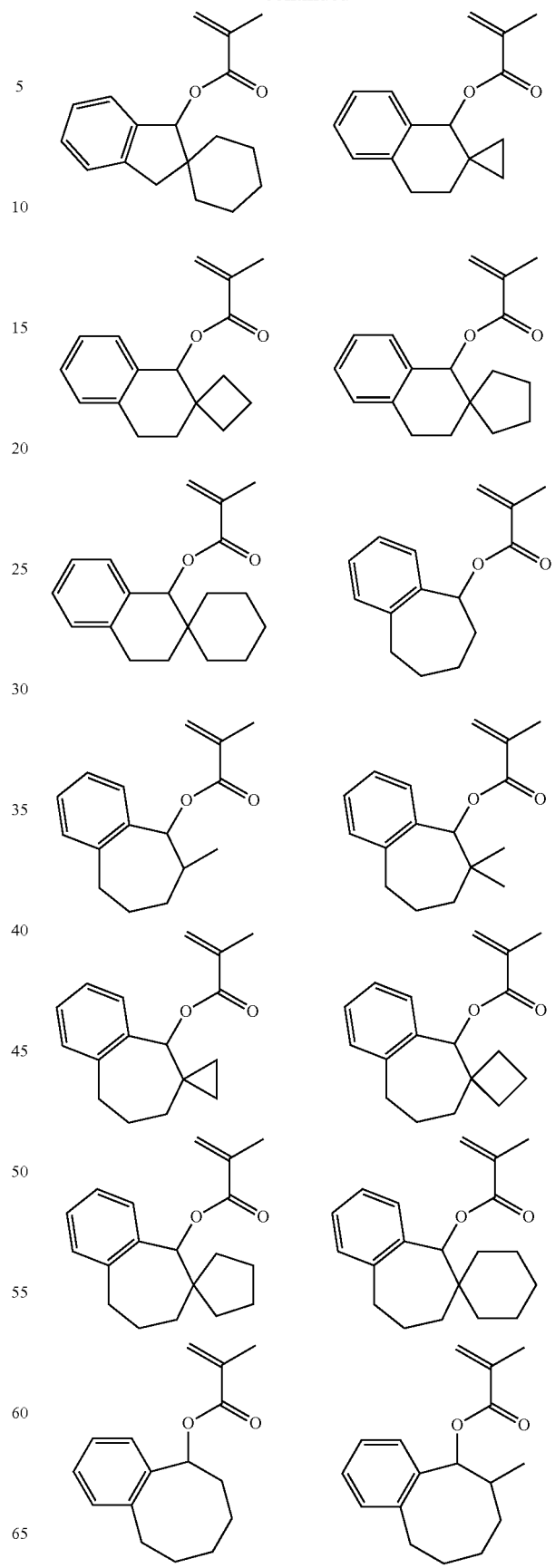

-continued
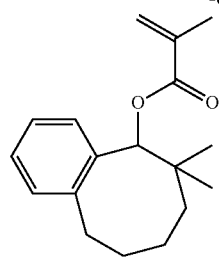 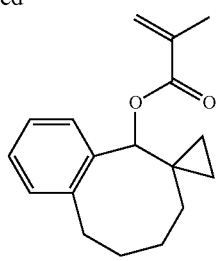 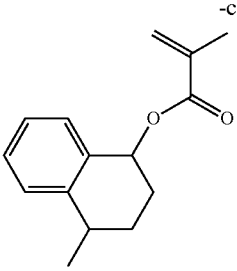 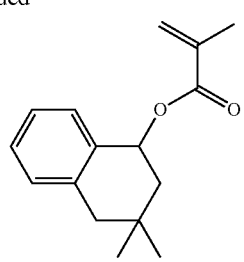
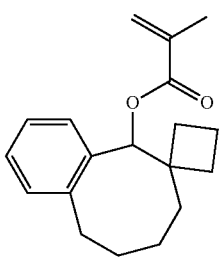 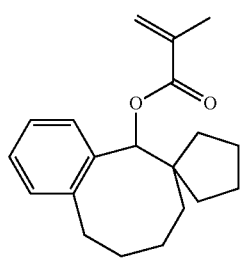 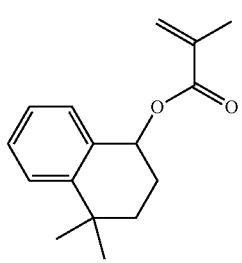 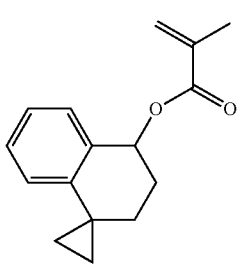
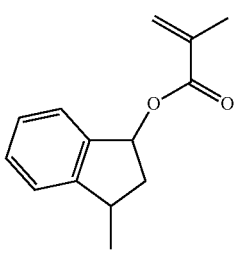 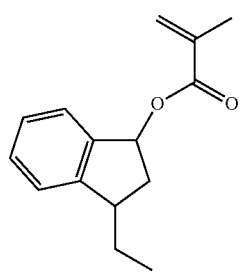 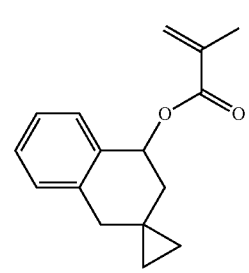 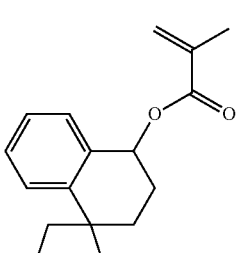
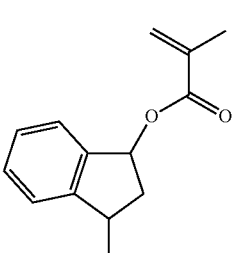 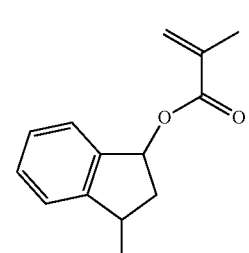 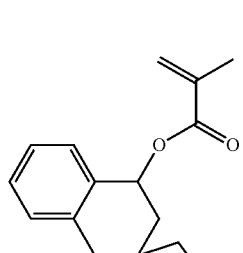 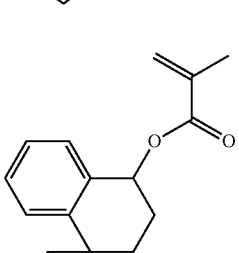
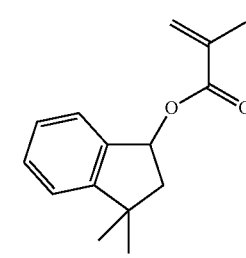 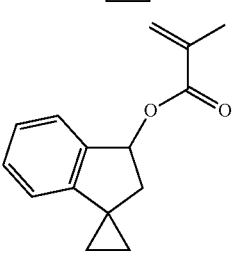 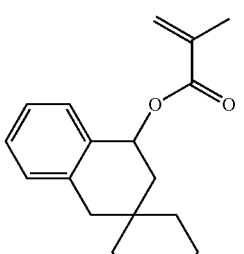 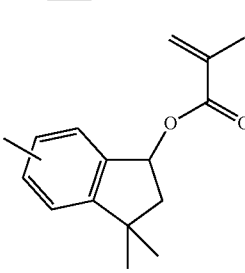
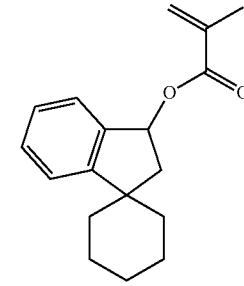 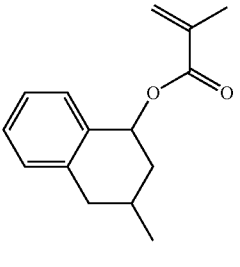 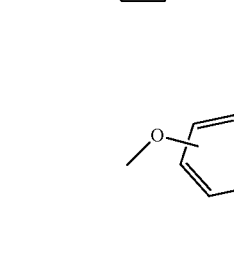 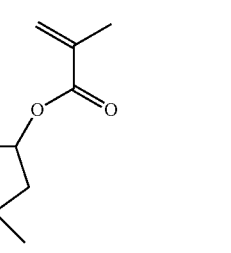

-continued
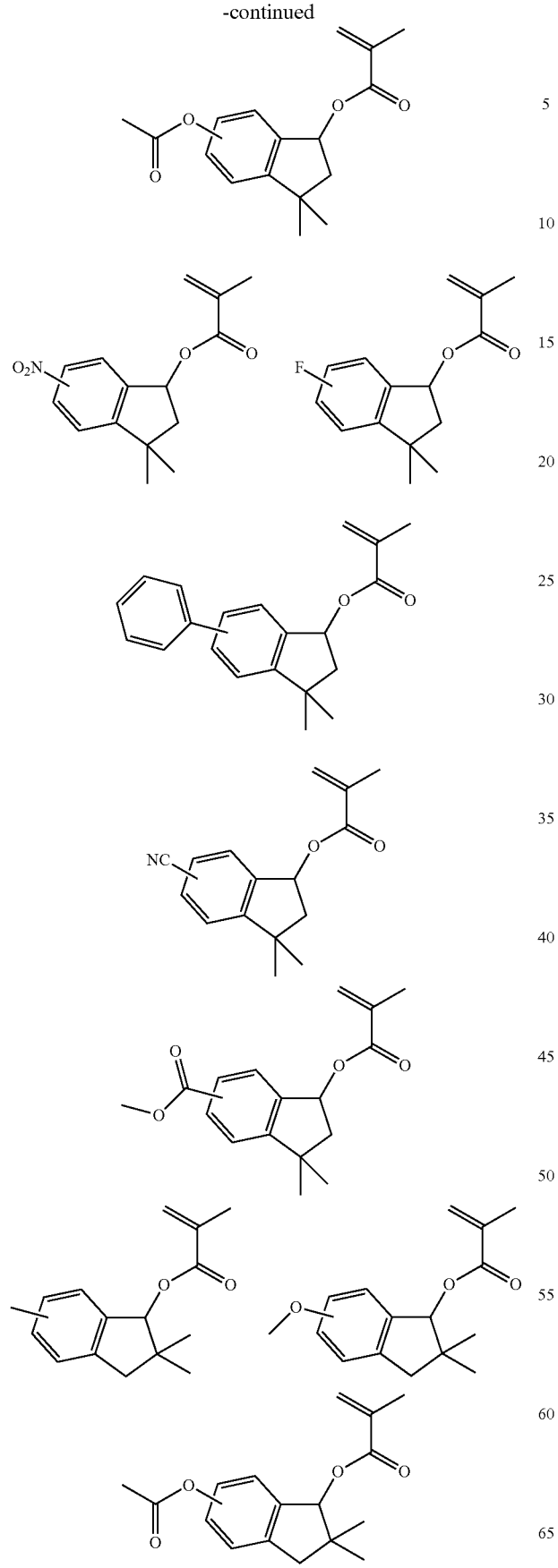
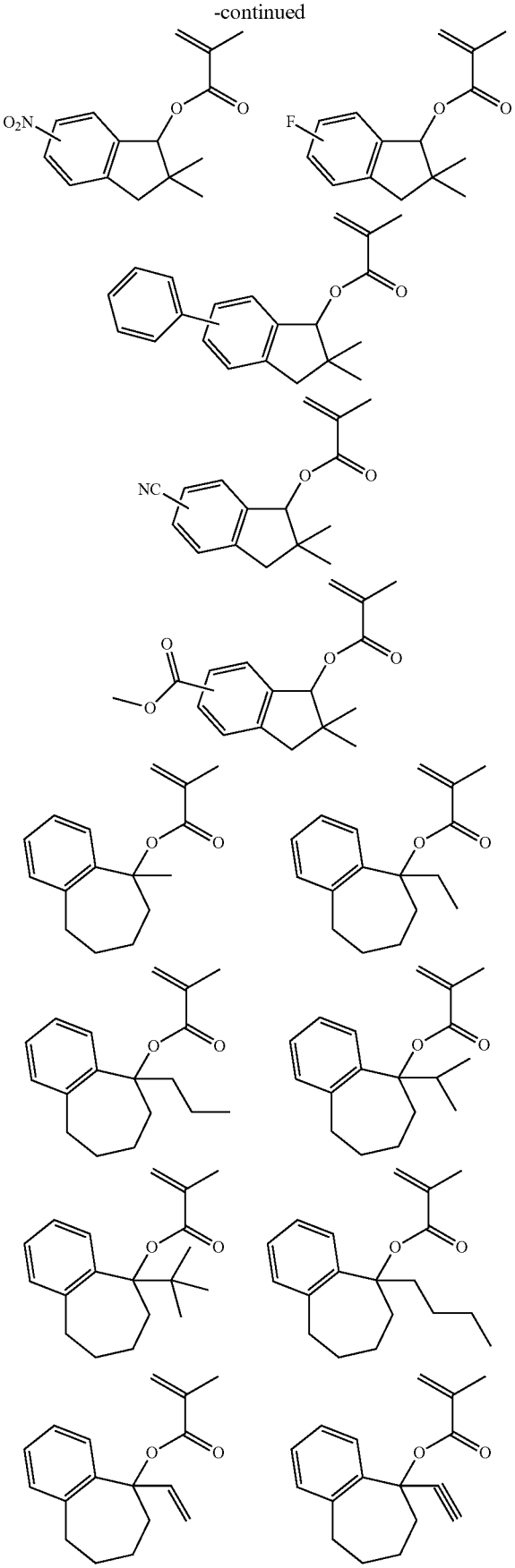

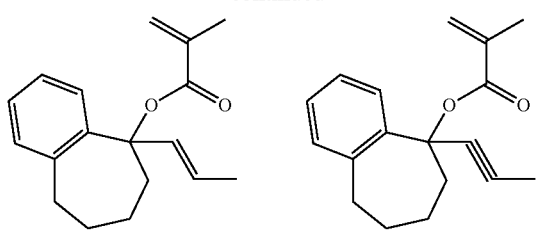
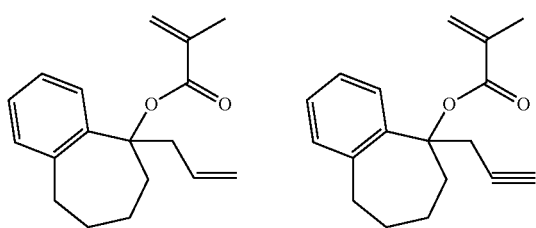
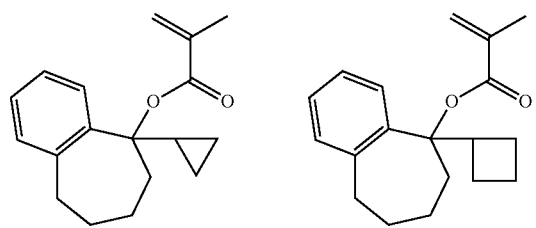
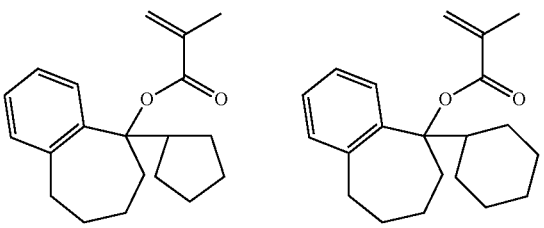
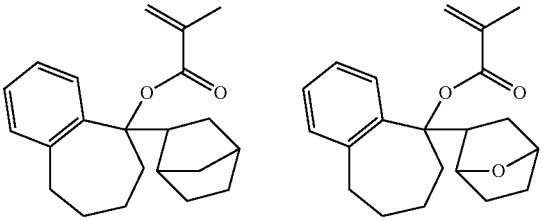
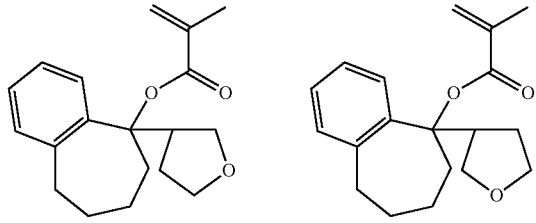
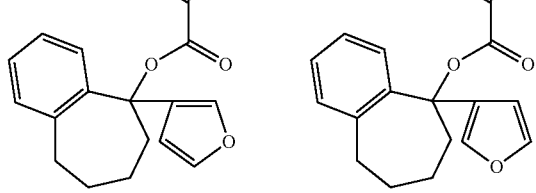
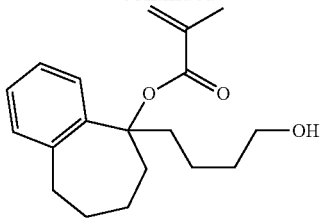
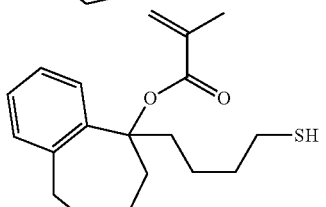
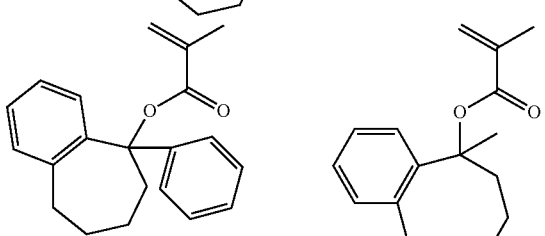
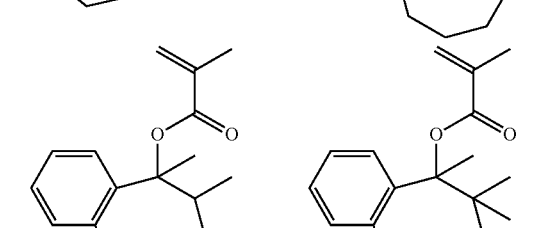
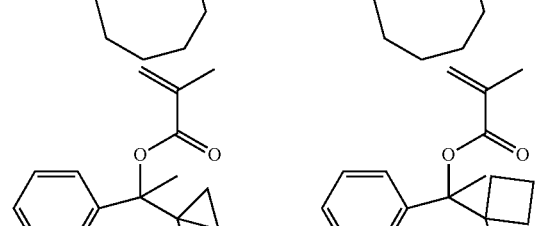
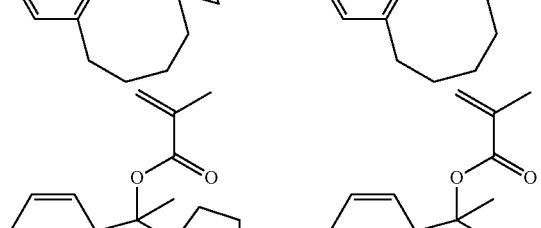
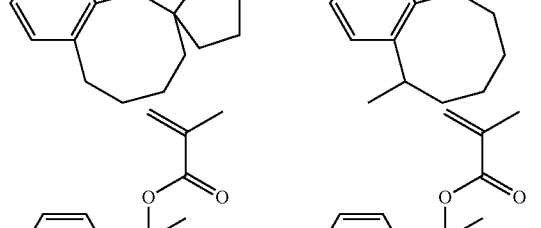
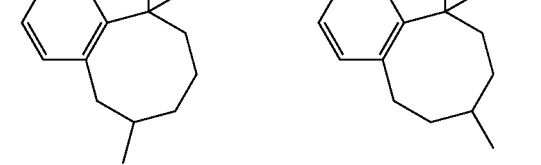

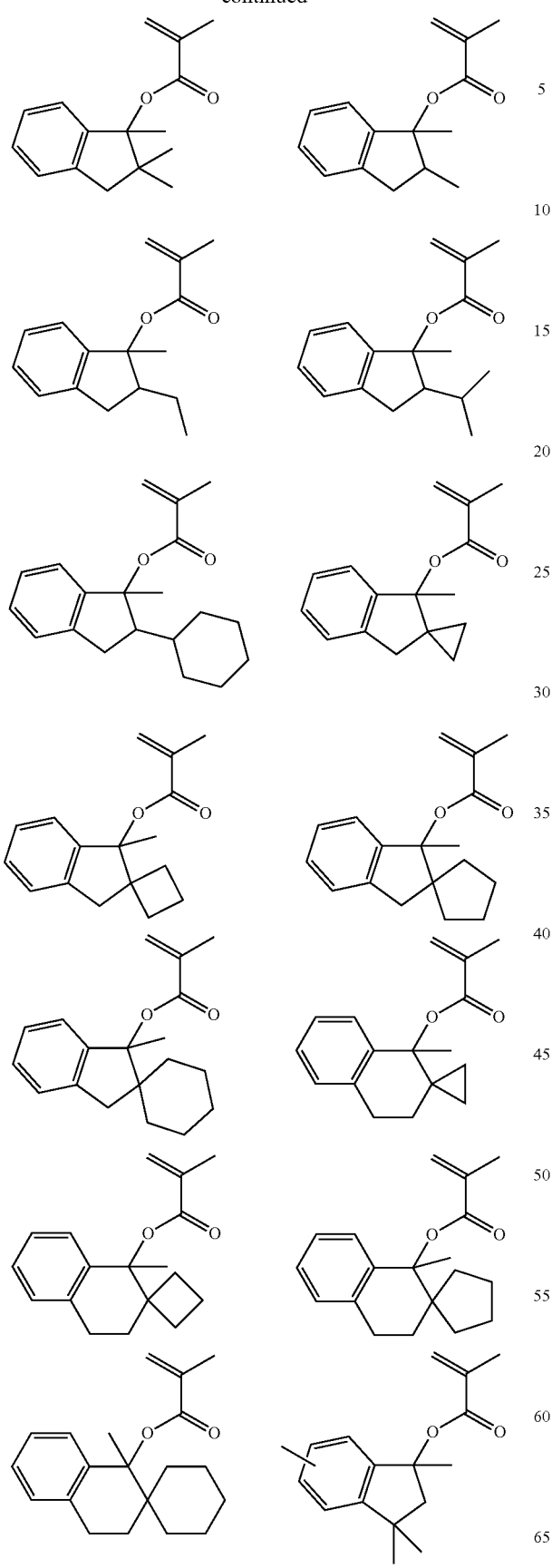
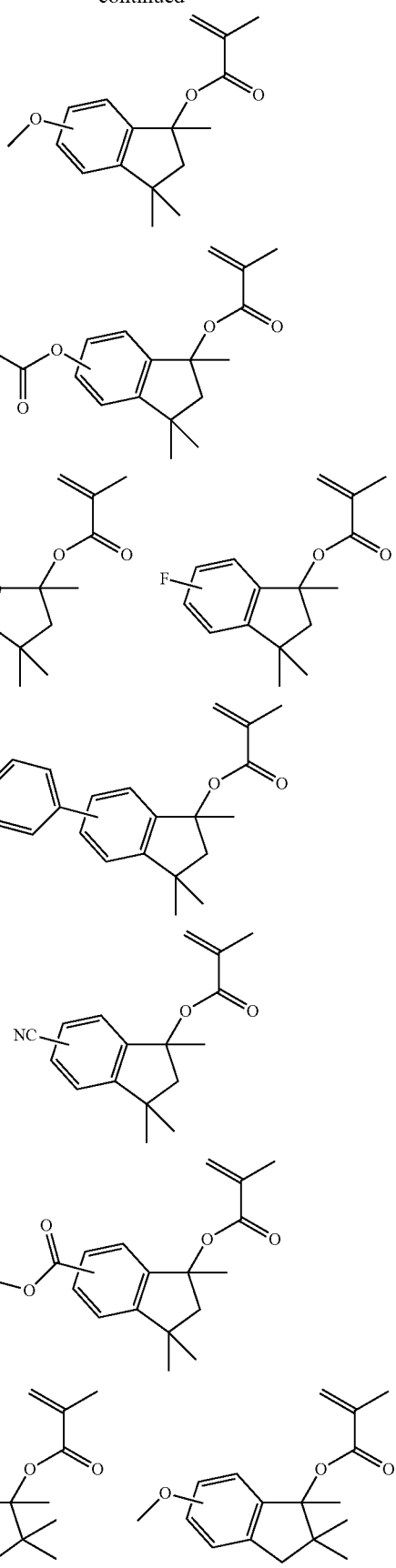

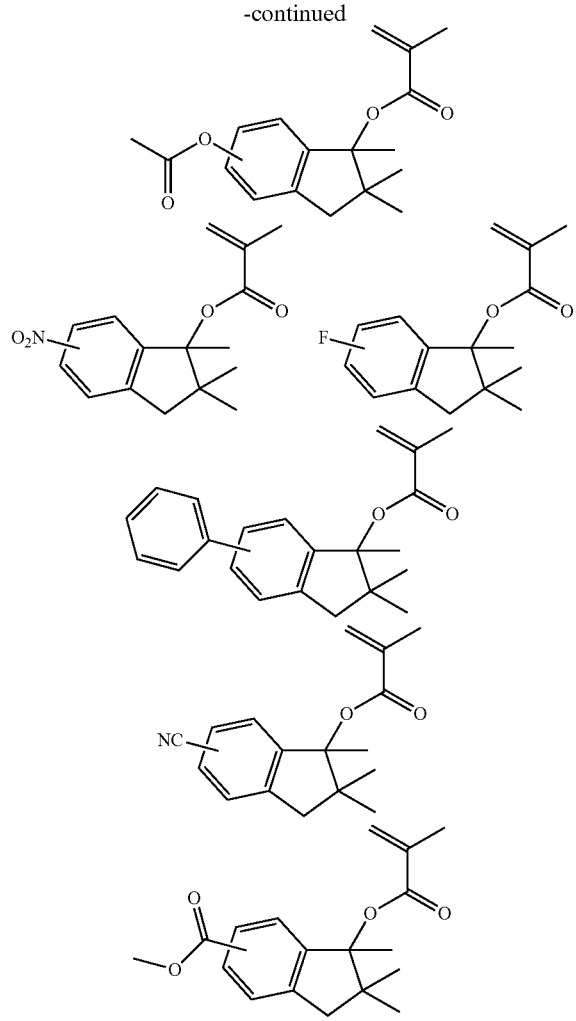

Also included in the acid labile group $R^2$ in recurring units (a1) are groups having the general formula (A-3)-26.

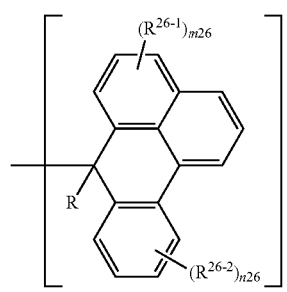 (A-3)-26

Herein, $R^{26-1}$ and $R^{26-2}$ each are hydrogen, a $C_1$-$C_4$ alkyl group, alkoxy group, alkanoyl group, alkoxycarbonyl group, hydroxyl group, nitro group, $C_6$-$C_{10}$ aryl group, halogen atom, or cyano group. R has the same meaning as R in formula (A-3)-24. The subscripts m26 and n26 each are an integer of 1 to 4.

Examples of the monomer from which the recurring units (a1) having an acid labile group of formula (A-3)-26 substituted thereon are derived are shown below.

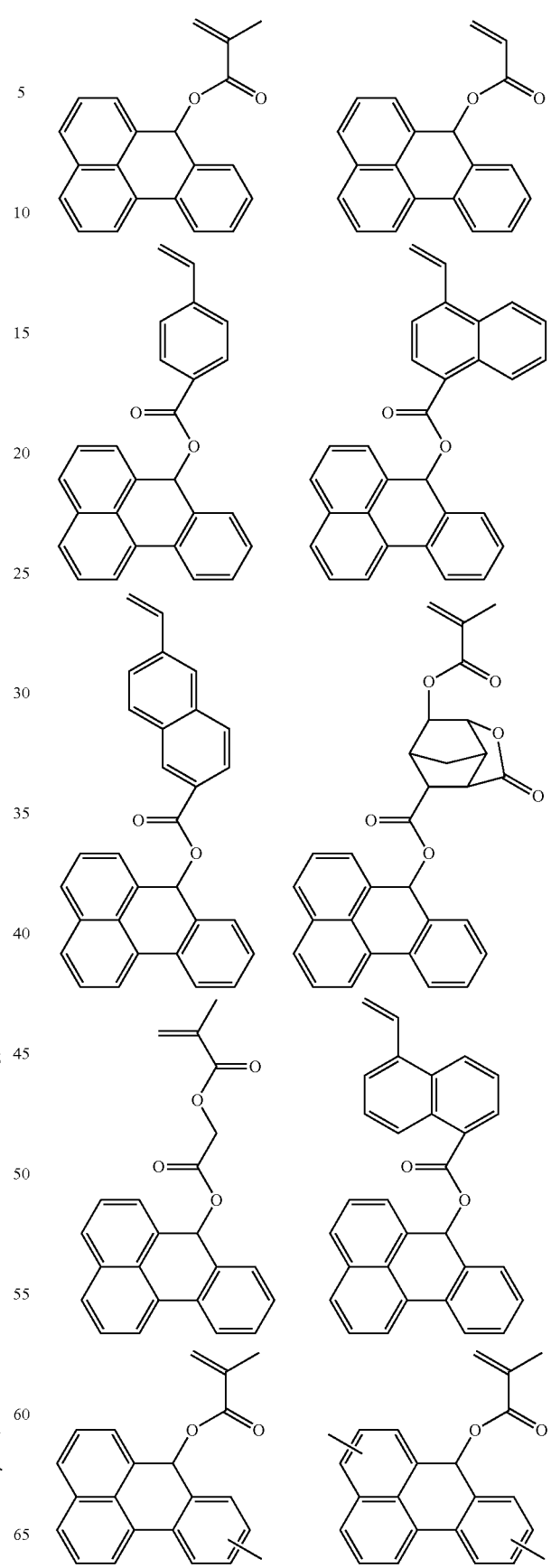

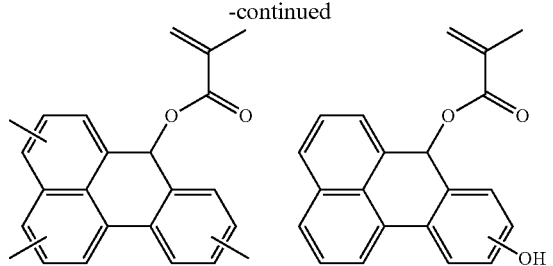
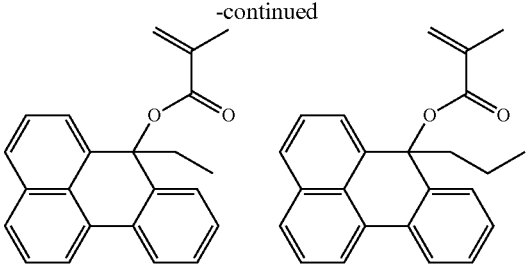
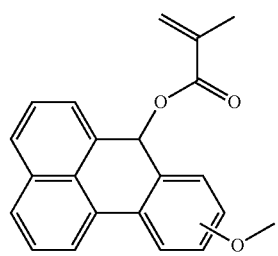
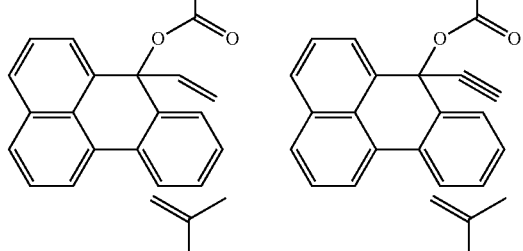
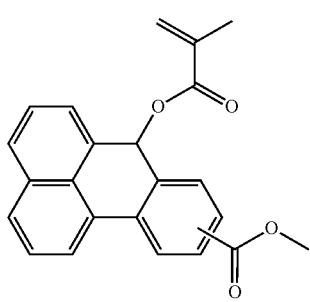
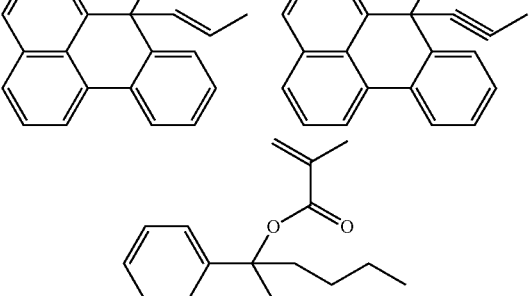
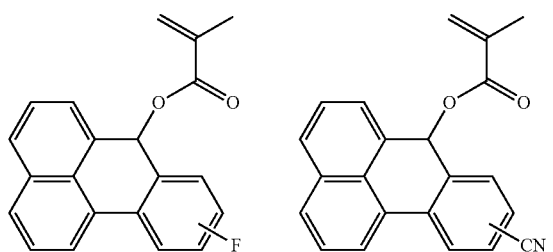
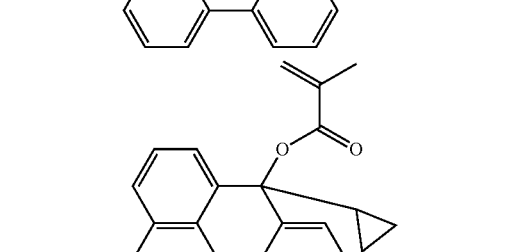
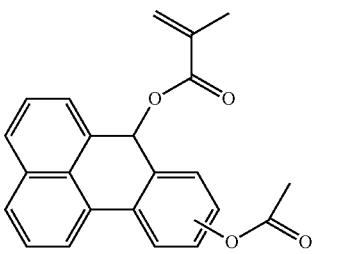
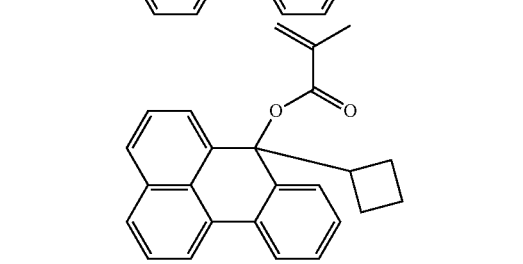
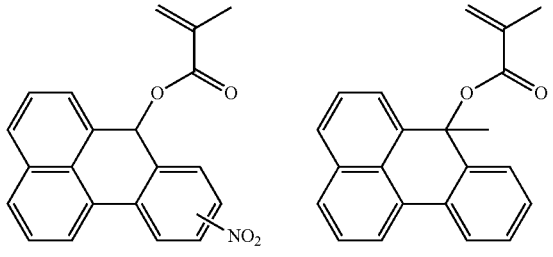
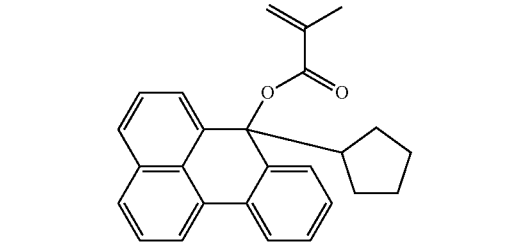

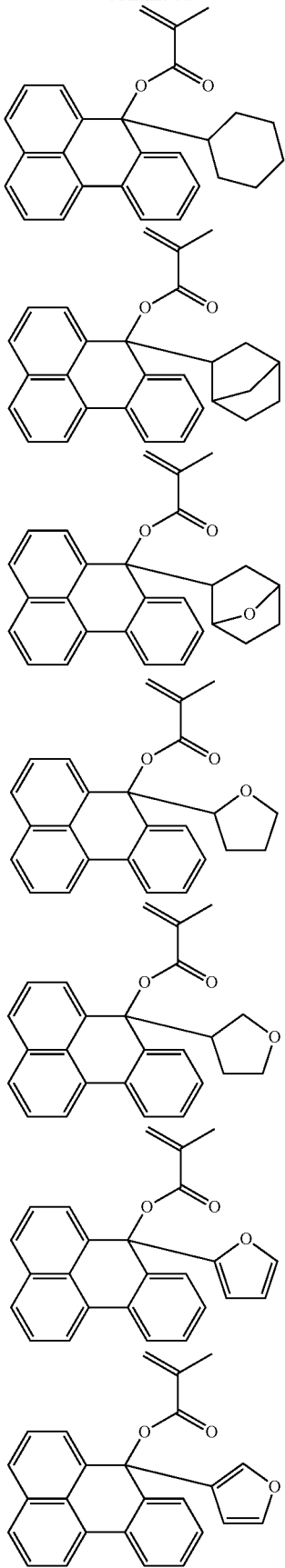
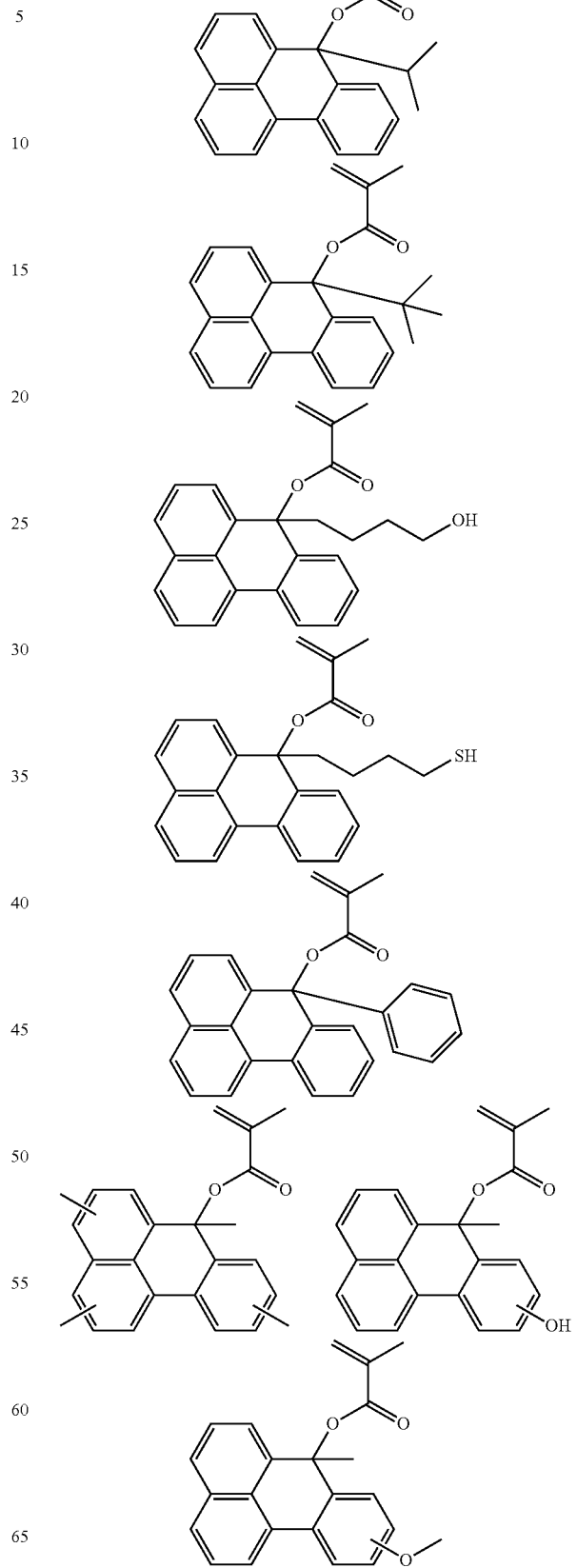

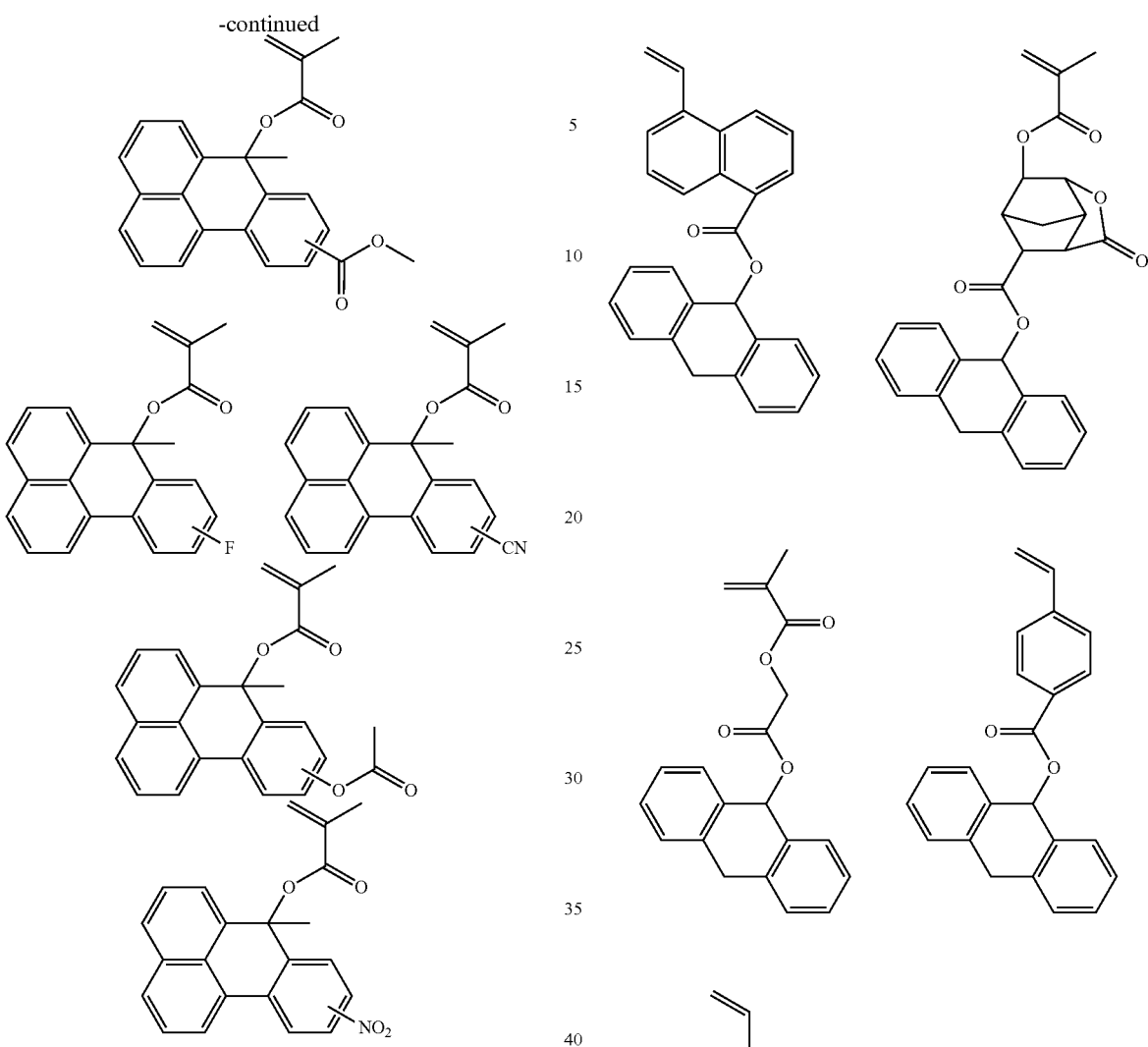

Also included in the acid labile group $R^2$ in recurring units (a1) are groups having the general formula (A-3)-27.

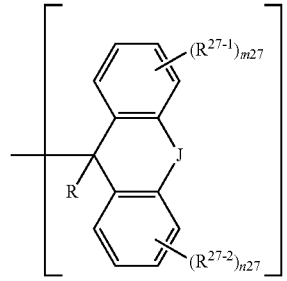
(A-3)-27

Herein, $R^{27\text{-}1}$ and $R^{27\text{-}2}$ each are hydrogen, a $C_1$-$C_4$ alkyl group, alkoxy group, alkanoyl group, alkoxycarbonyl group, hydroxyl group, $C_6$-$C_{10}$ aryl group, halogen atom, or cyano group. R has the same meaning as R in formula (A-3)-24. J is methylene, ethylene, vinylene, or —$CH_2$—S—. The subscripts m27 and n27 each are an integer of 1 to 4.

Examples of the monomer from which the recurring units (a1) having an acid labile group of formula (A-3)-27 substituted thereon are derived are shown below.

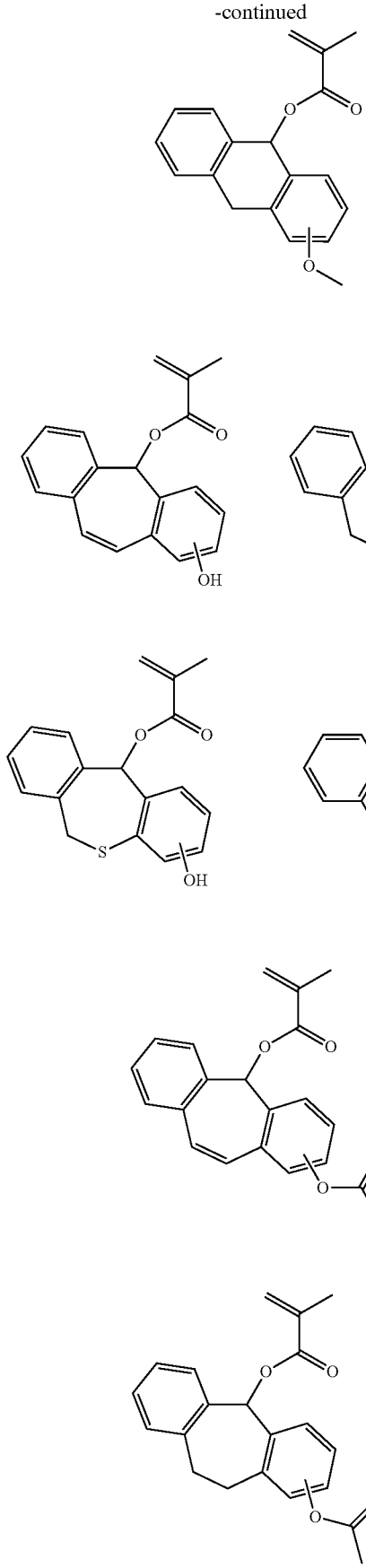
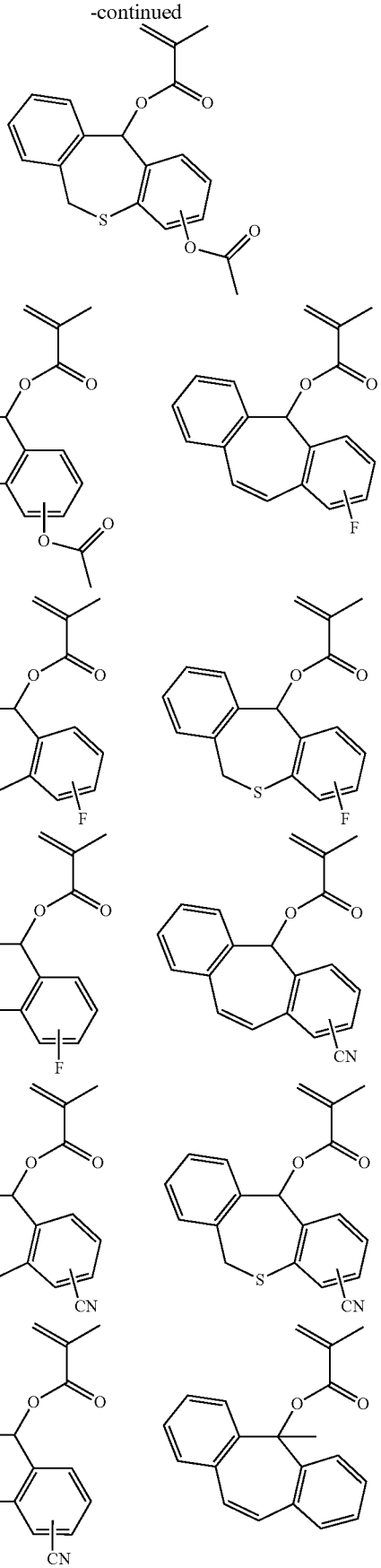

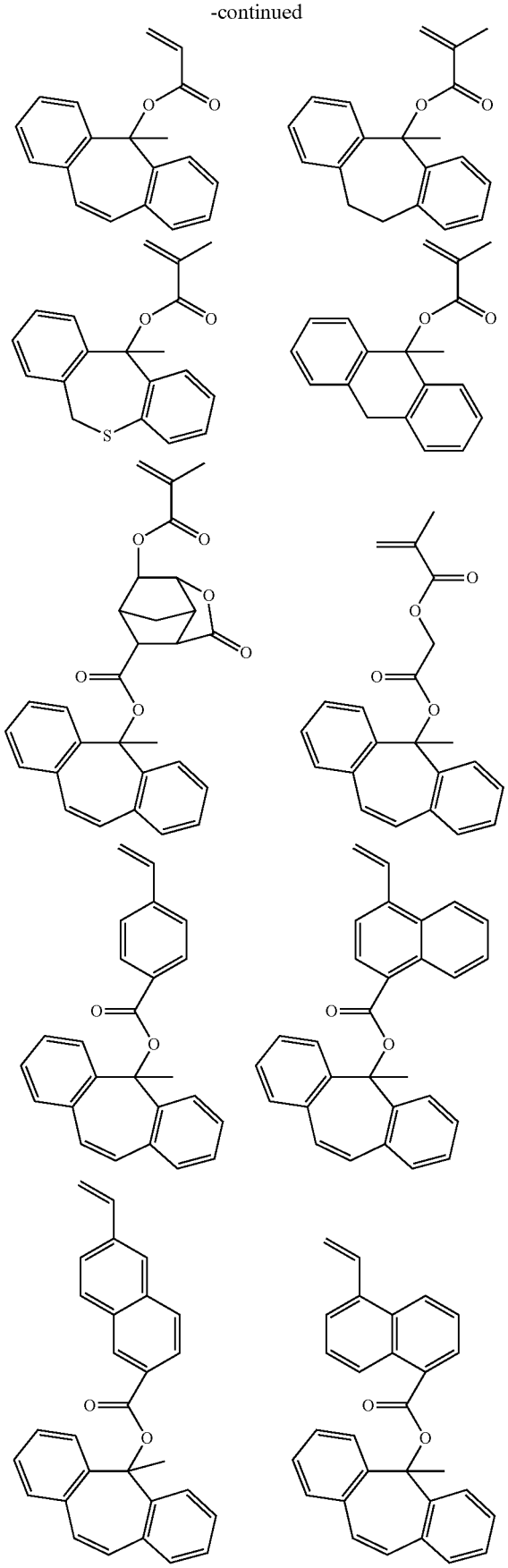
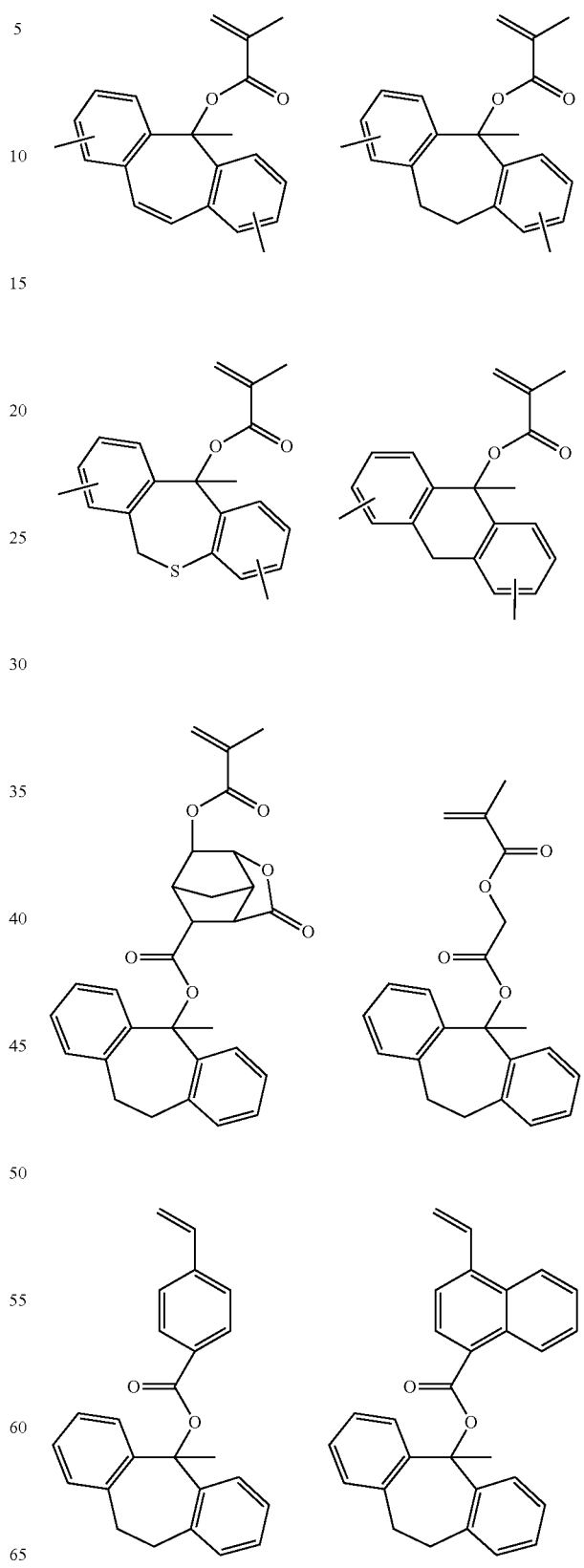

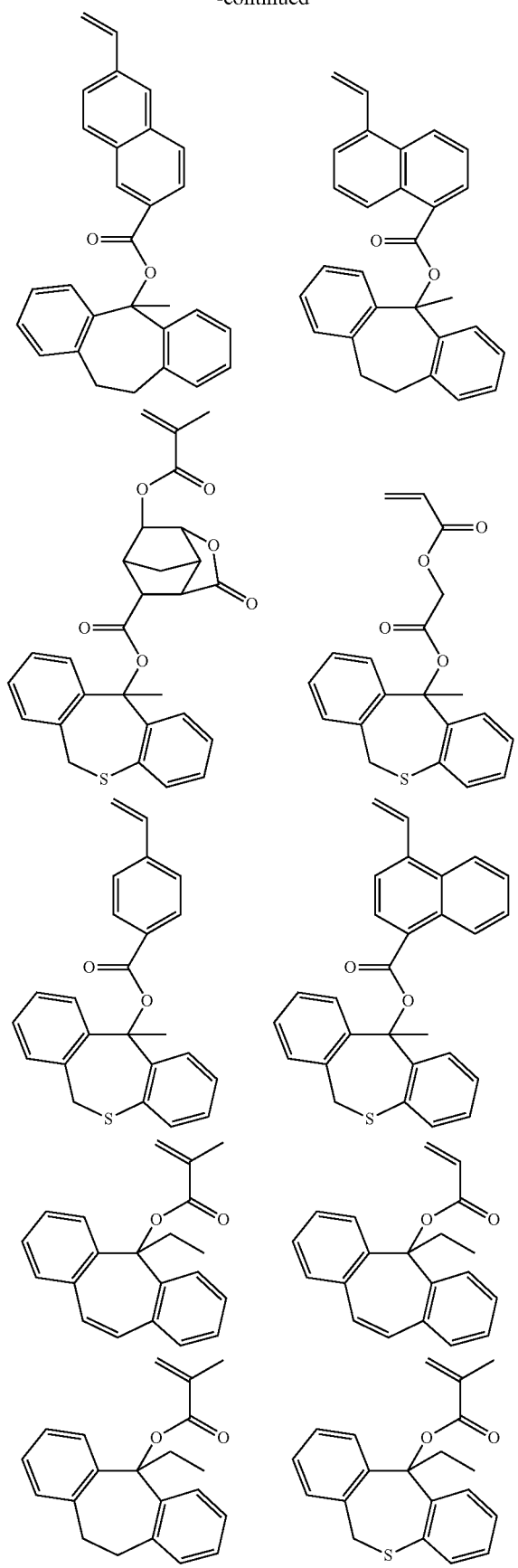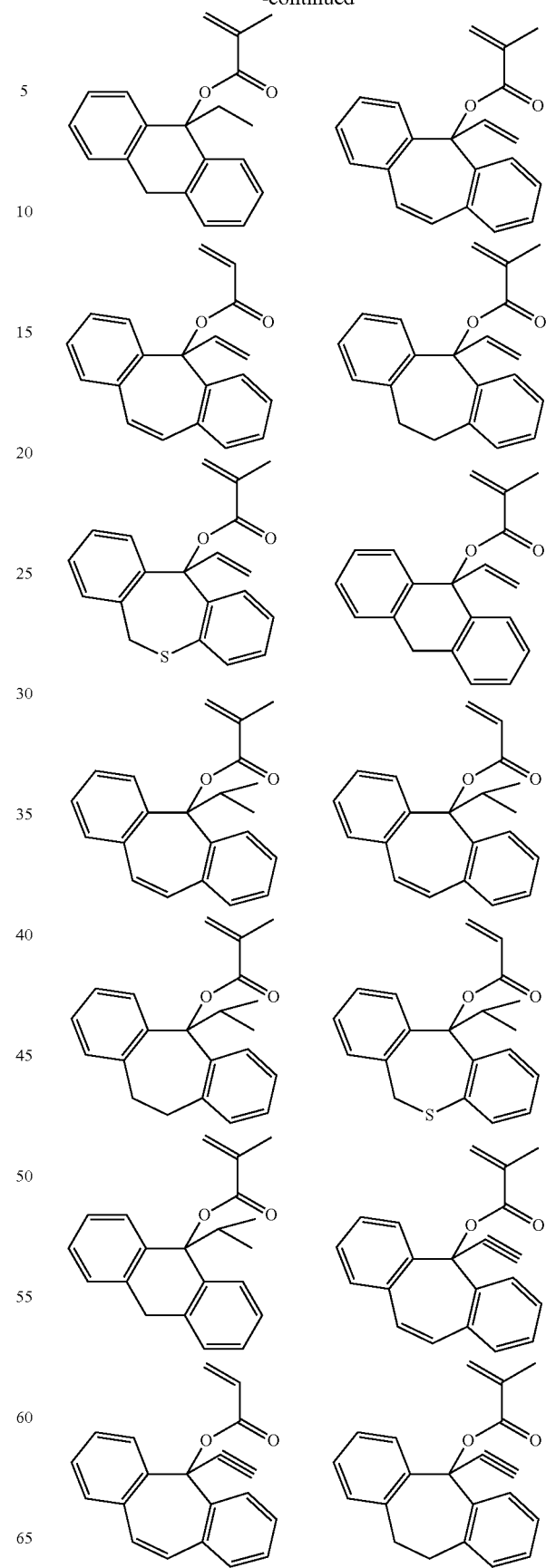

-continued

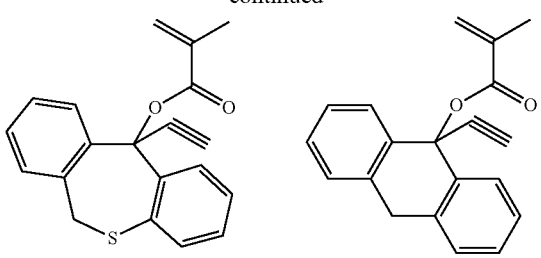

Also included in the acid labile group R² in recurring units (a1) are groups having the general formula (A-3)-28.

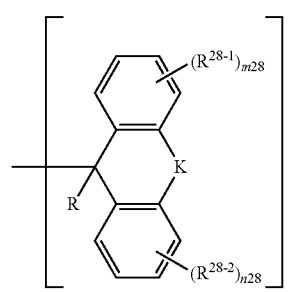

(A-3)-28

Herein, $R^{28-1}$ and $R^{28-2}$ each are hydrogen, a $C_1$-$C_4$ alkyl group, alkoxy group, alkanoyl group, alkoxycarbonyl group, hydroxyl group, $C_6$-$C_{10}$ aryl group, halogen atom, or cyano group. R has the same meaning as R in formula (A-3)-24. K is carbonyl, ether, sulfide, —S(=O)— or —S(=O)$_2$—. The subscripts m28 and n28 each are an integer of 1 to 4.

Examples of the monomer from which the recurring units (a1) having an acid labile group of formula (A-3)-28 substituted thereon are derived are shown below.

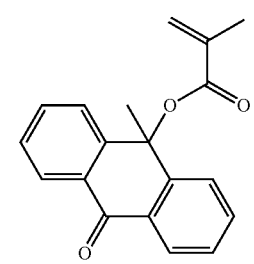
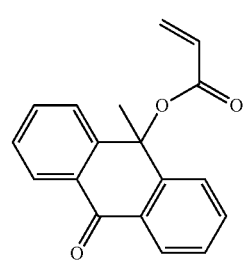
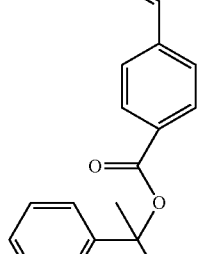
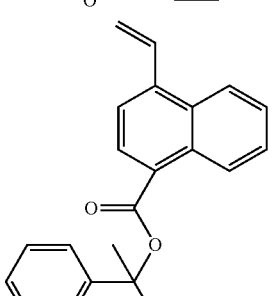
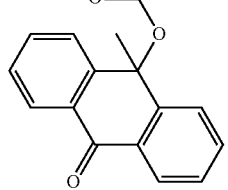
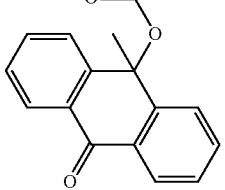

-continued

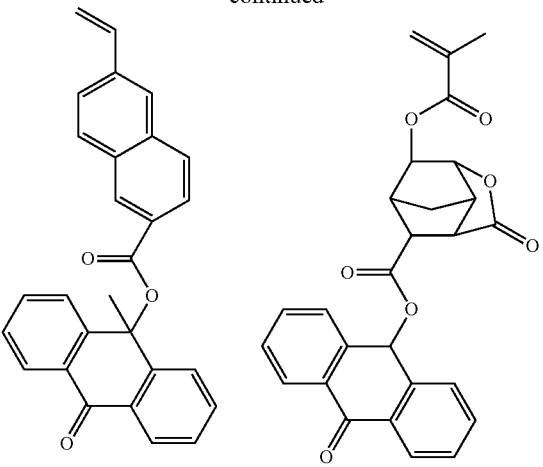
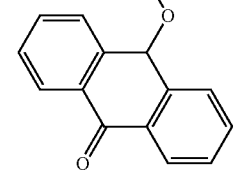
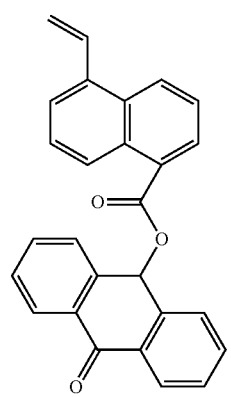
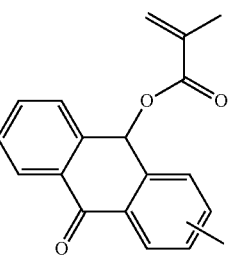
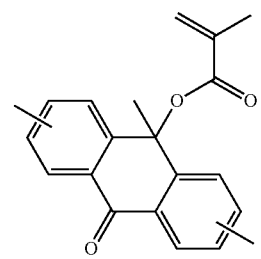
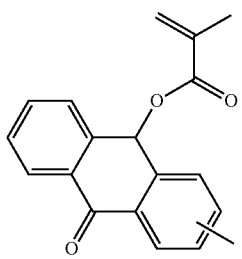
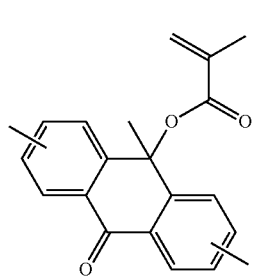
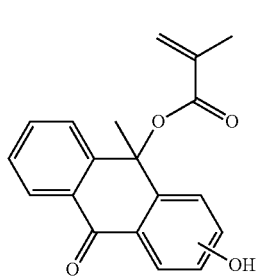
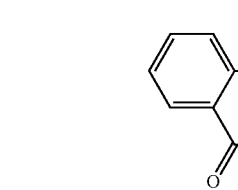
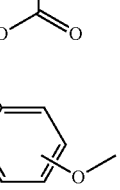

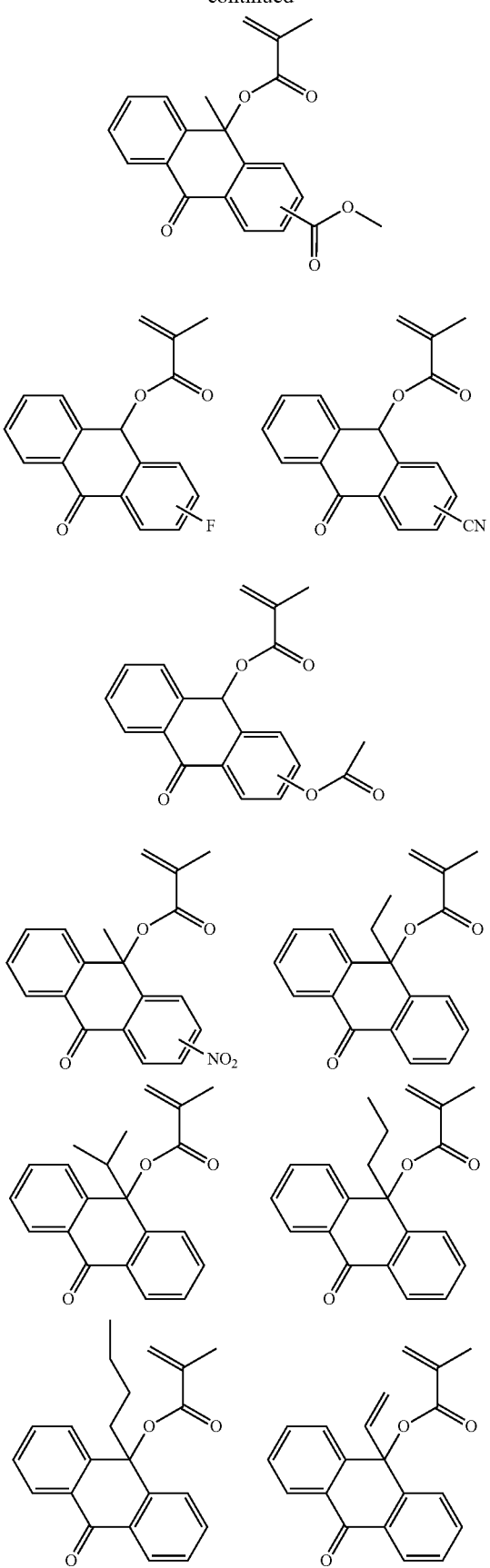

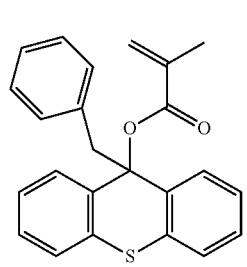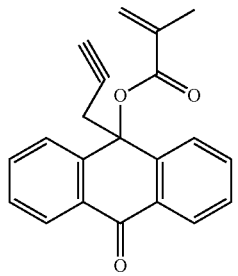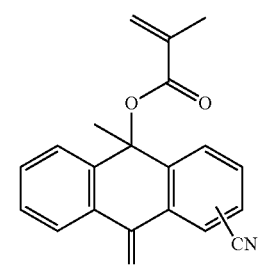
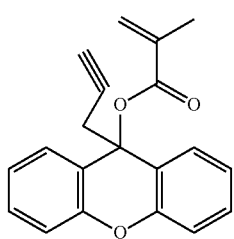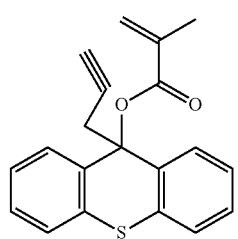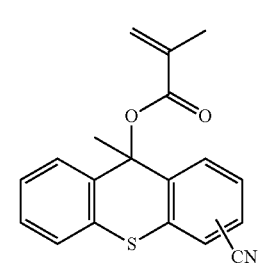
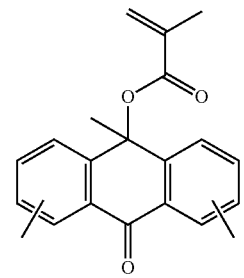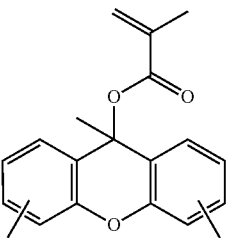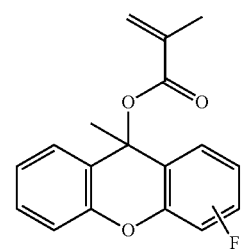
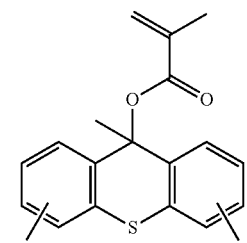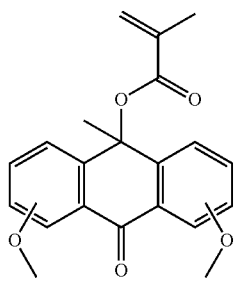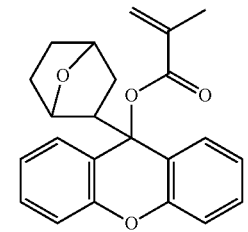
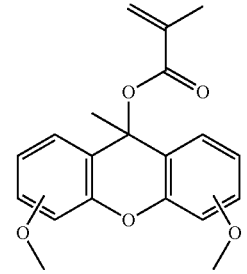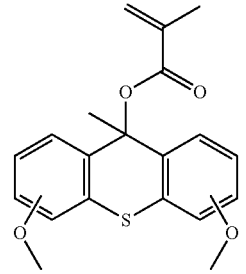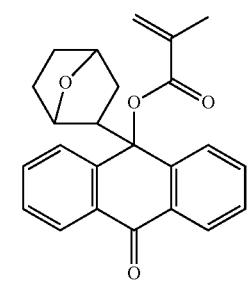
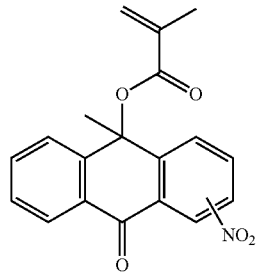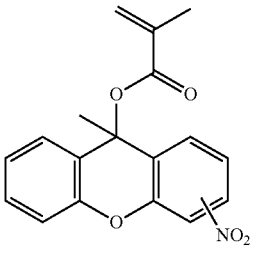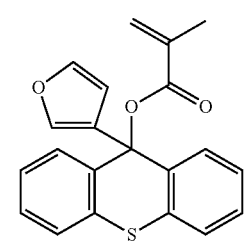
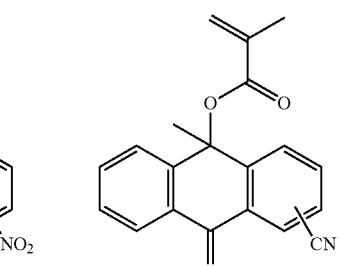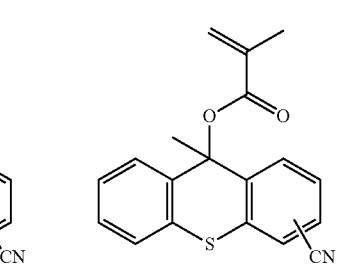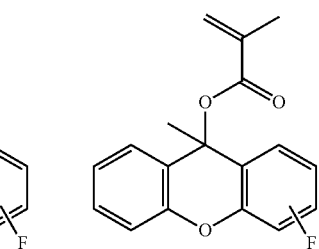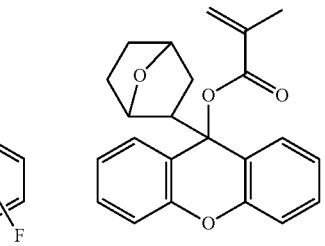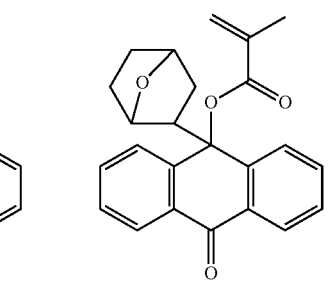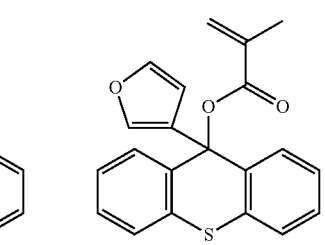

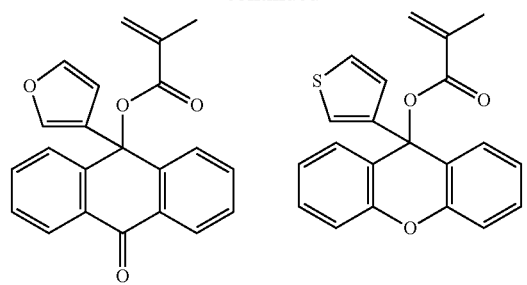
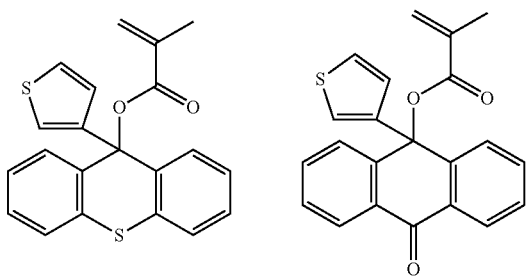
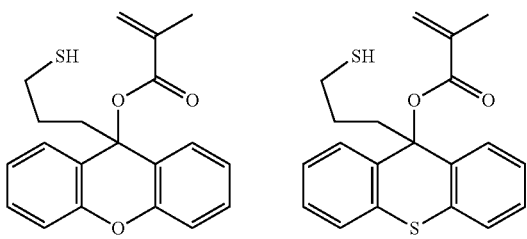
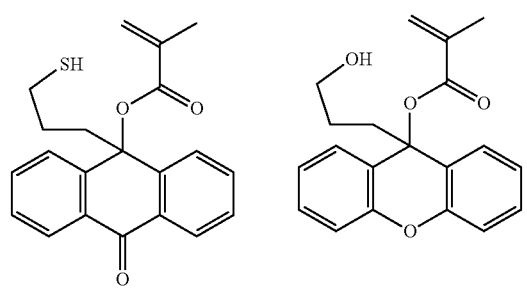
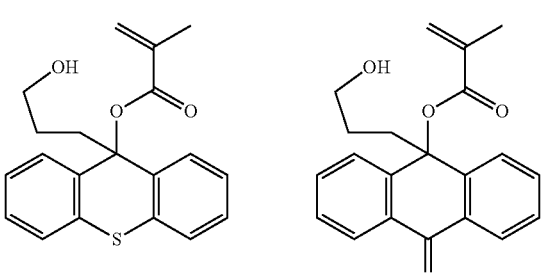
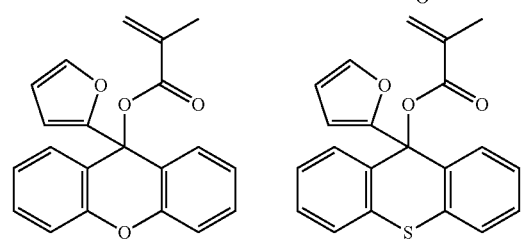
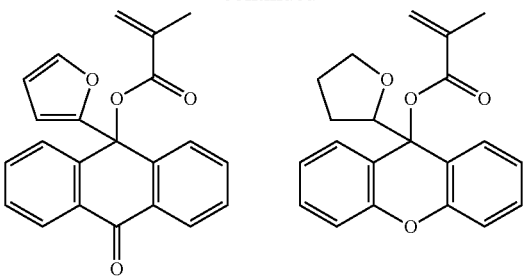
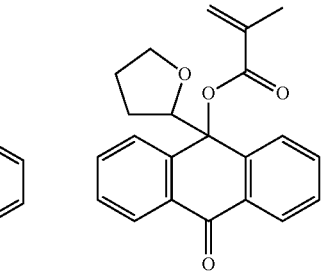
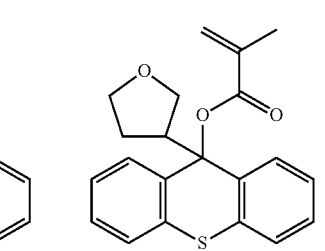
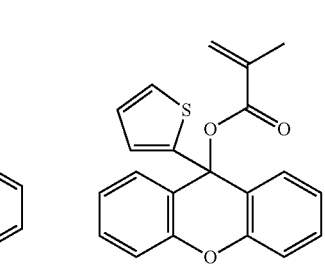
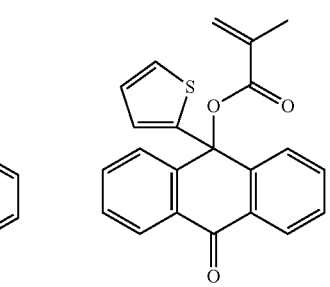
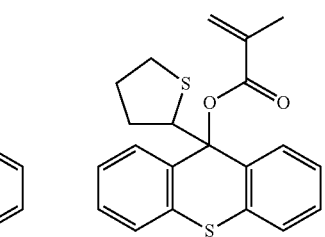

101
-continued
102
-continued
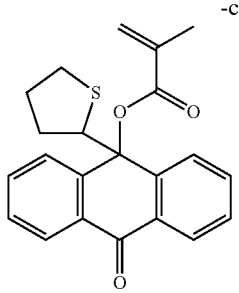 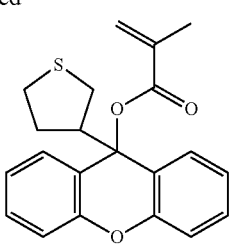
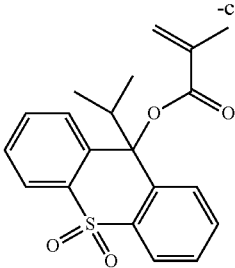 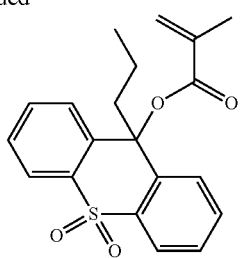
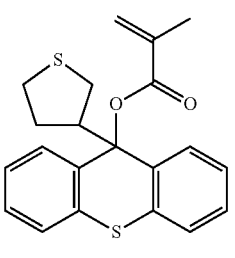 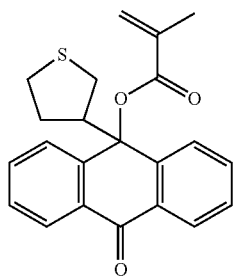
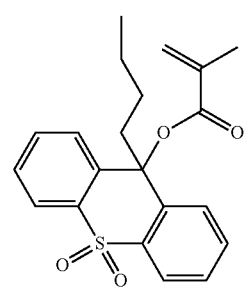 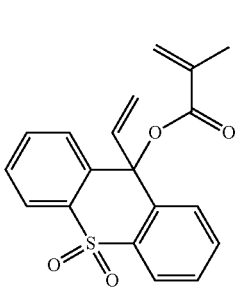
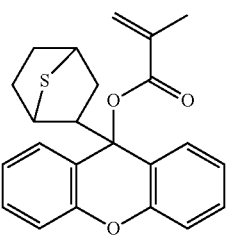 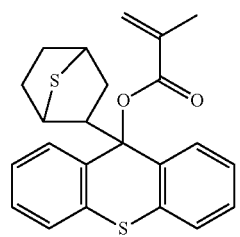
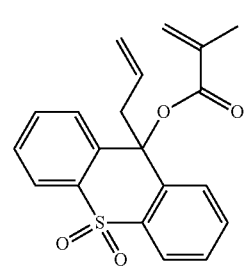 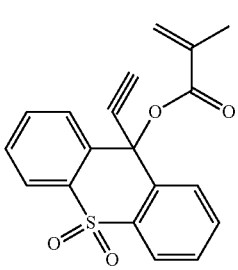
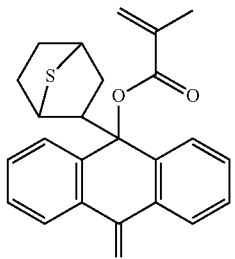 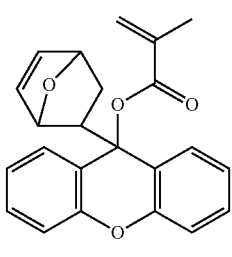
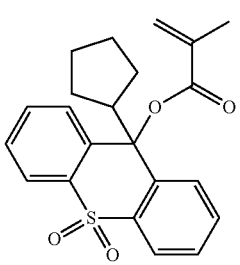 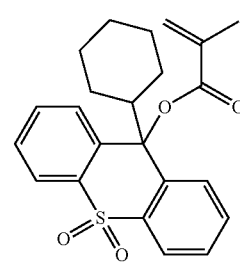
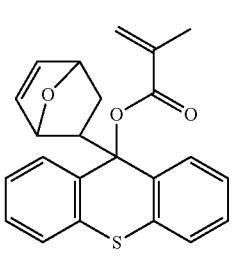 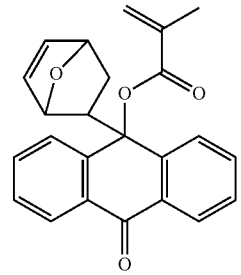
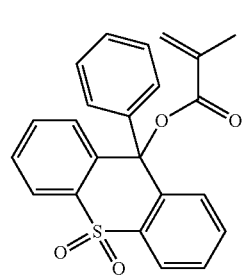 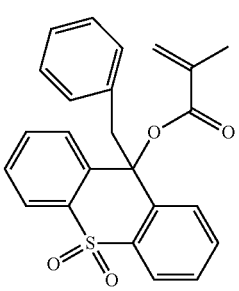
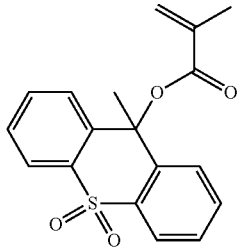 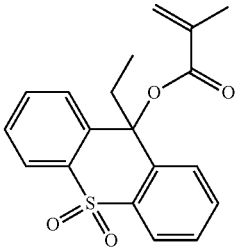
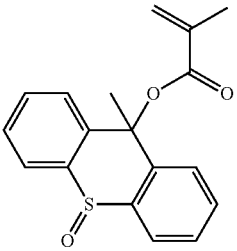 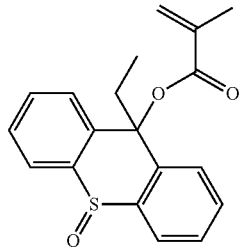

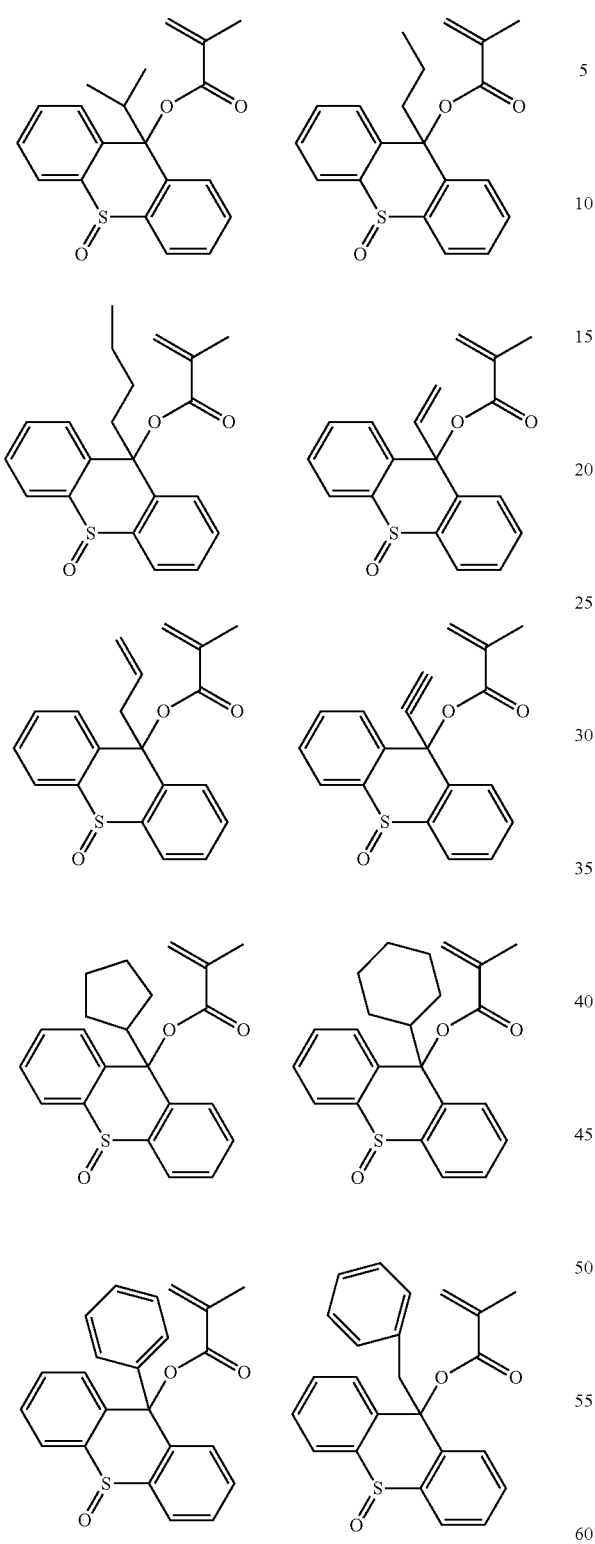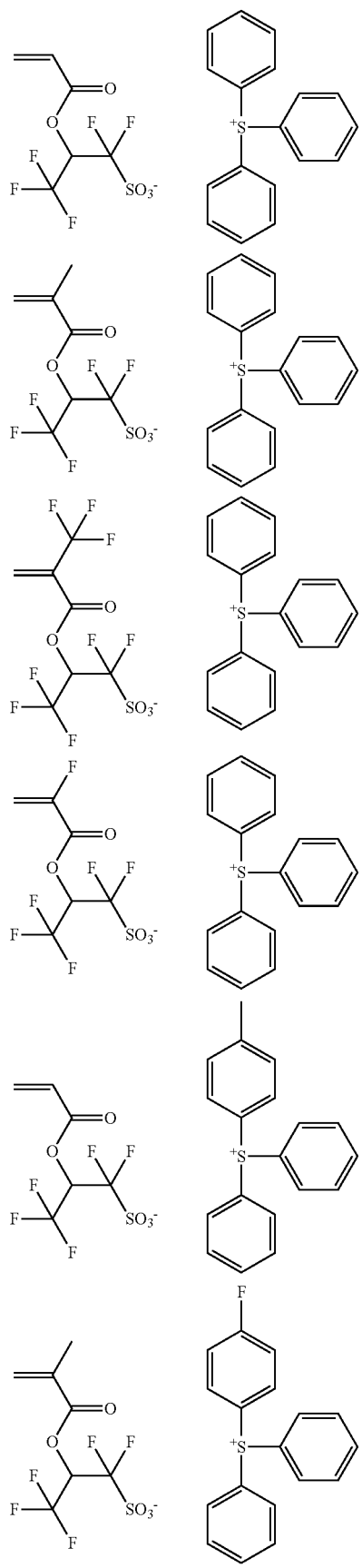
Examples of the monomers from which the recurring units (b1) and (b2) of sulfonium salt in formula (3) are derived are shown below.

105
-continued
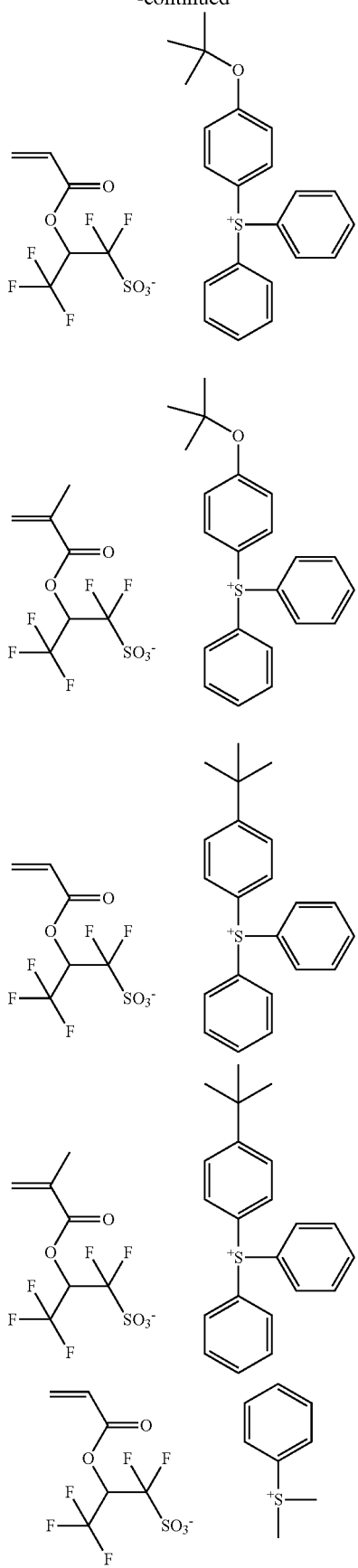
106
-continued
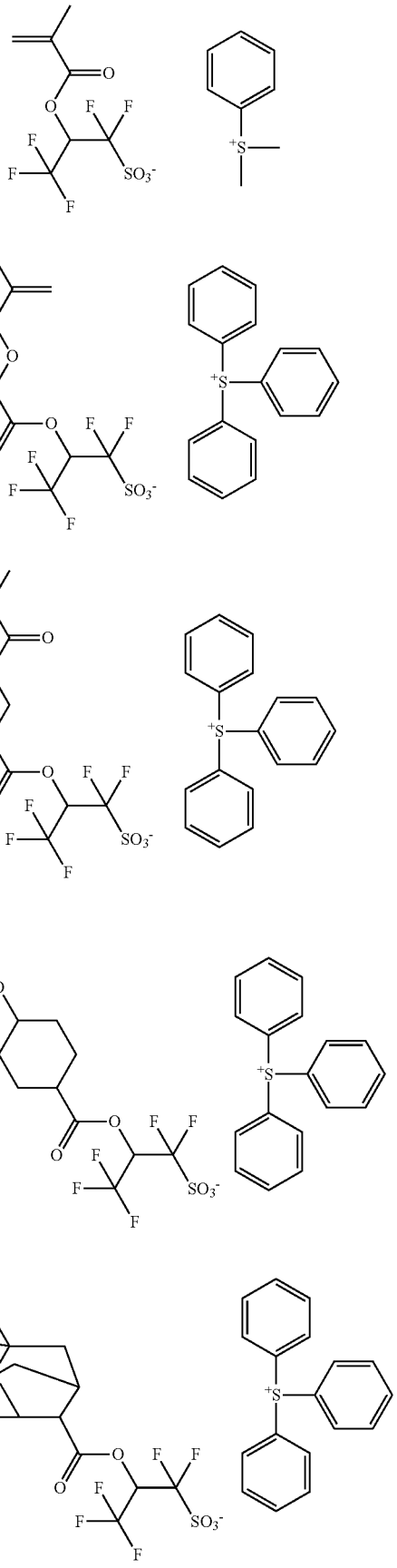

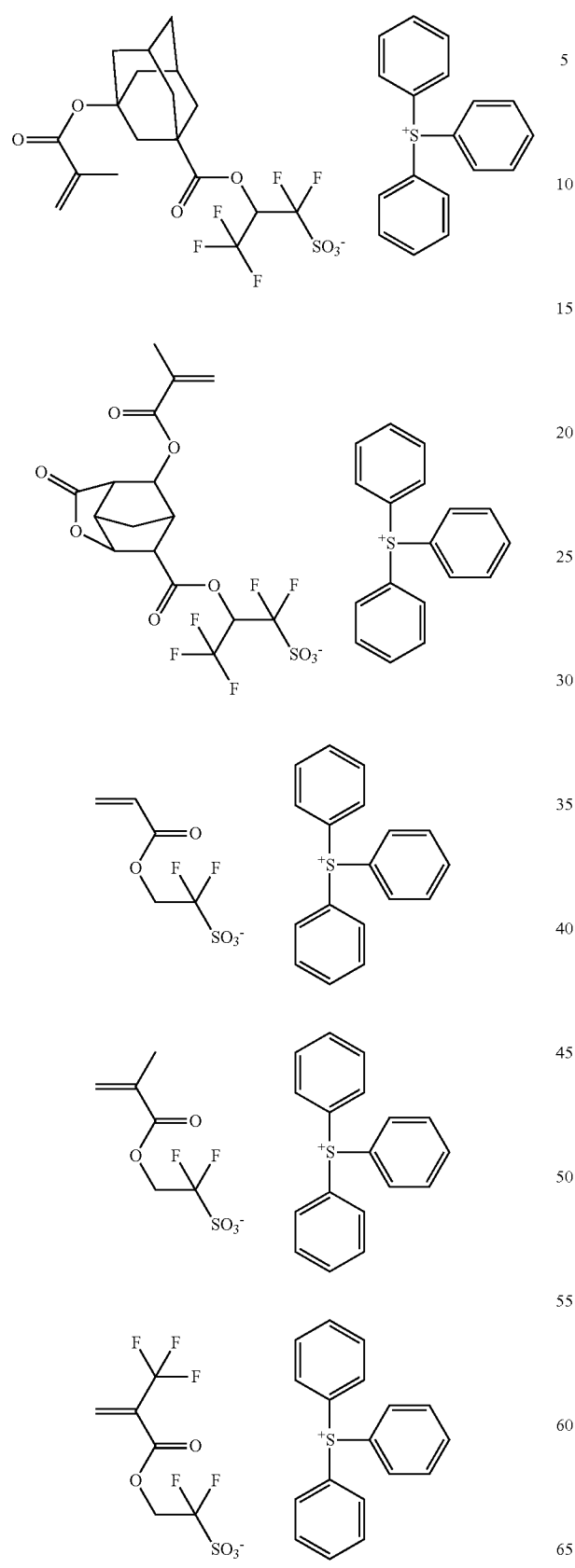
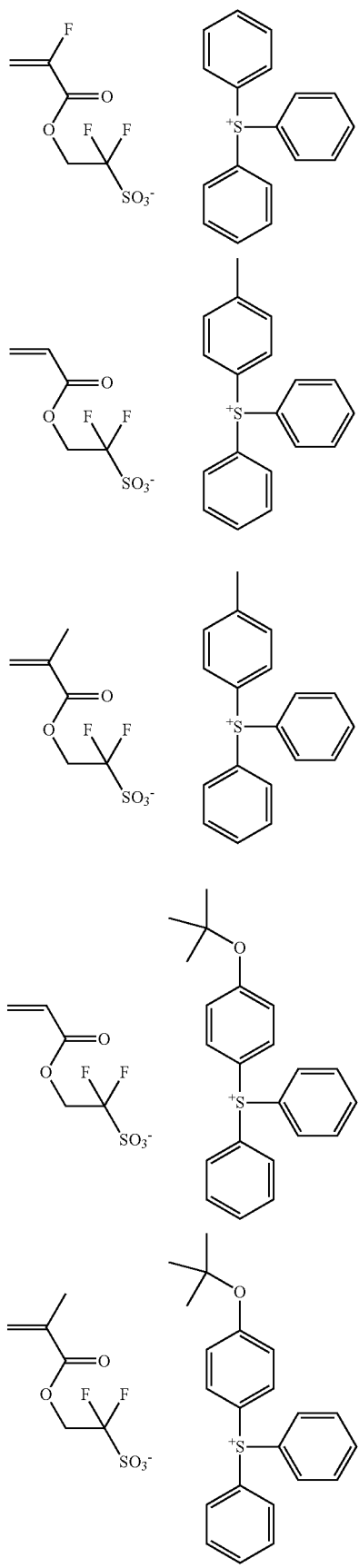

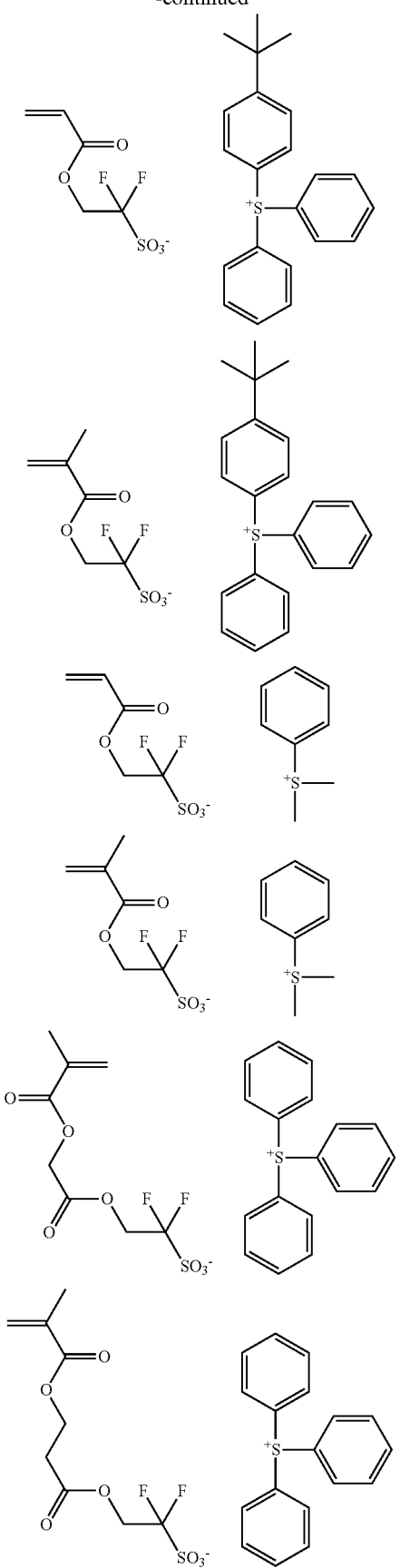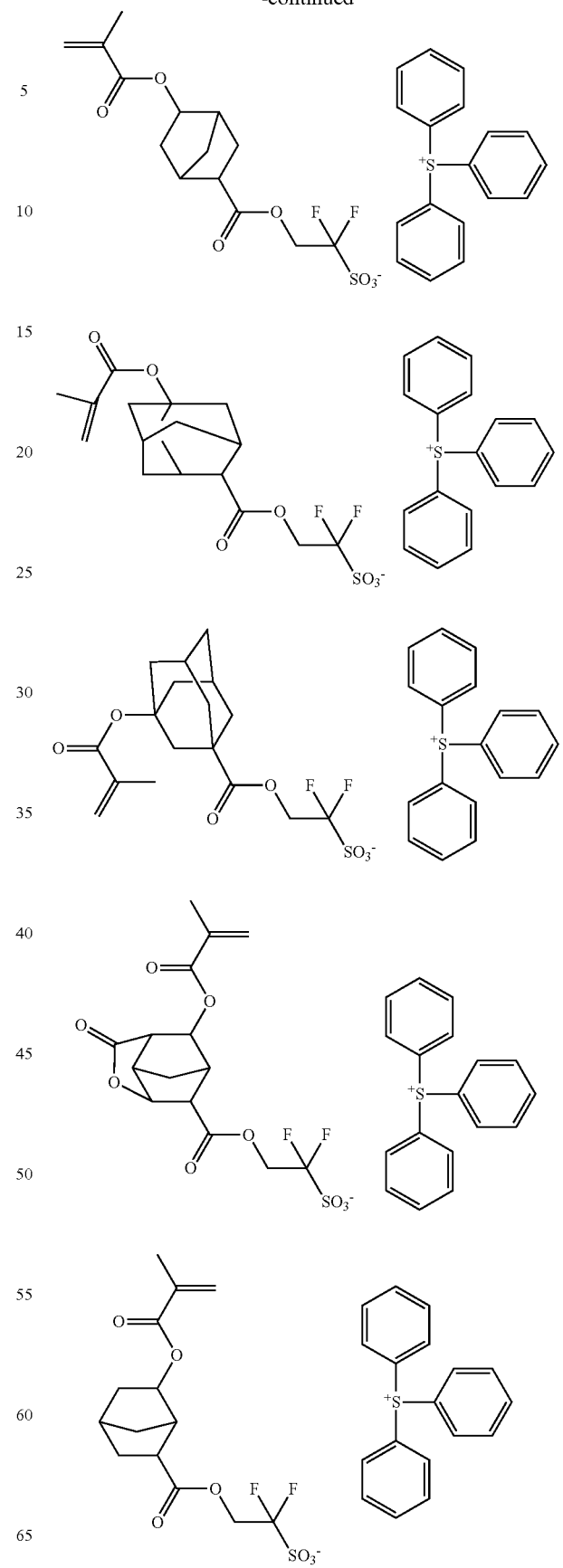

111
-continued
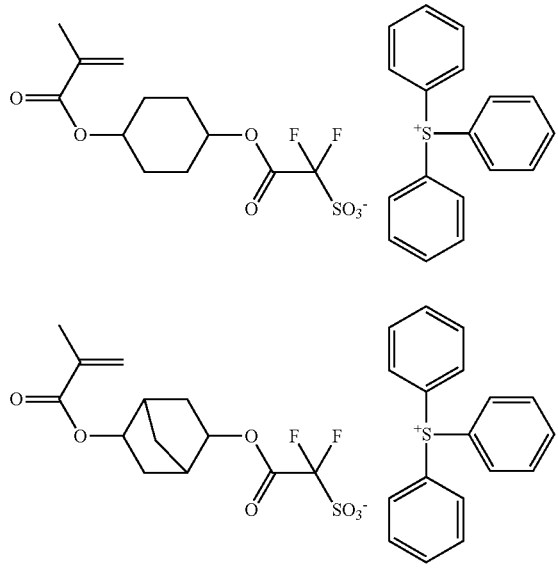
112
-continued
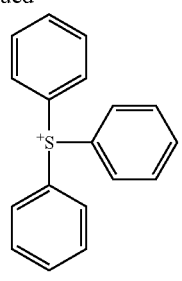
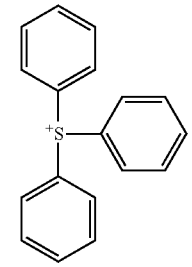
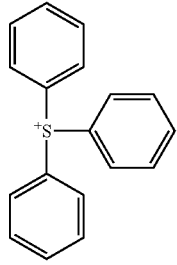
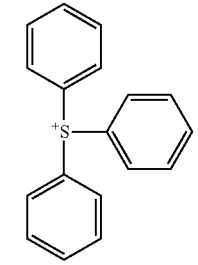
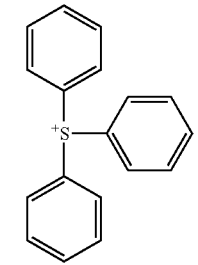
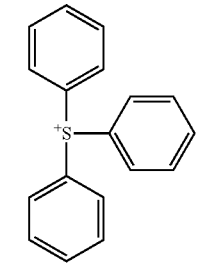

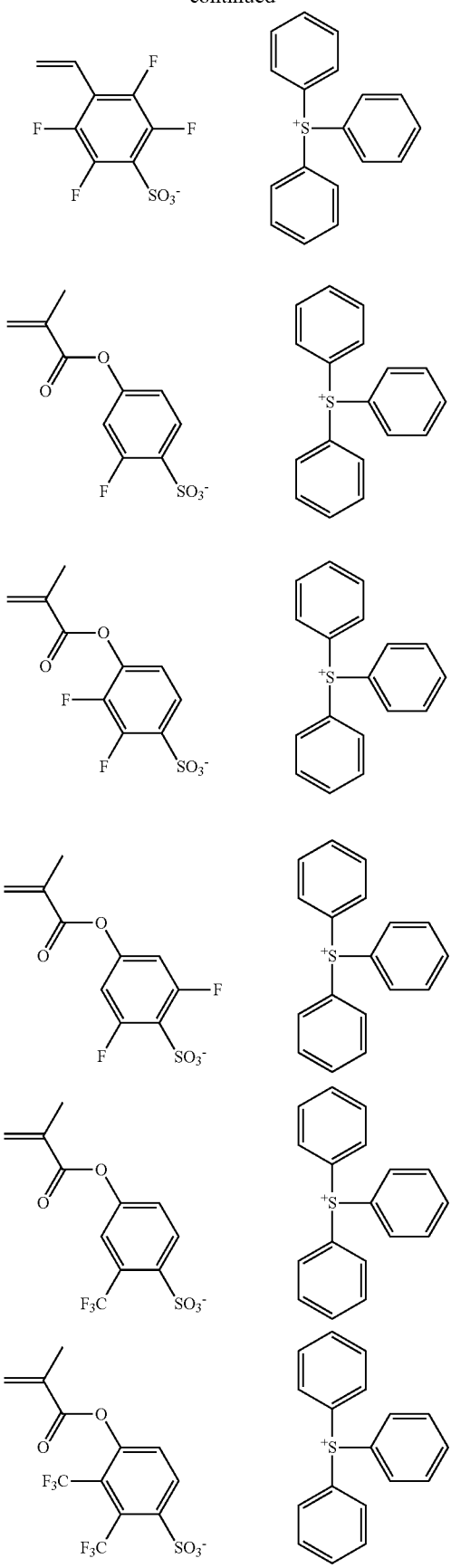

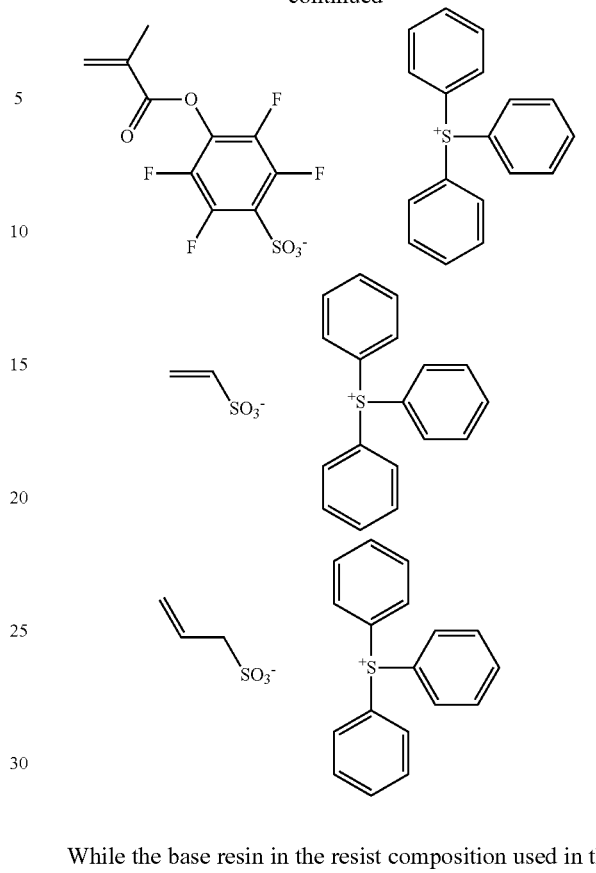

While the base resin in the resist composition used in the pattern forming process of the invention is characterized by comprising recurring units (a1) having a carboxyl group substituted with an acid labile group, recurring units (a2) having a phenolic hydroxyl group substituted with an acid labile group, and recurring units (b1) and (b2) having an acid generator in the form of a sulfonium salt of sulfonic acid bound to the backbone, in the copolymerized form, it may have further copolymerized therein recurring units (c) having a phenolic hydroxyl group as an adhesive group.

Examples of the monomers from which the recurring units (c) having a phenolic hydroxyl group are derived are shown below.

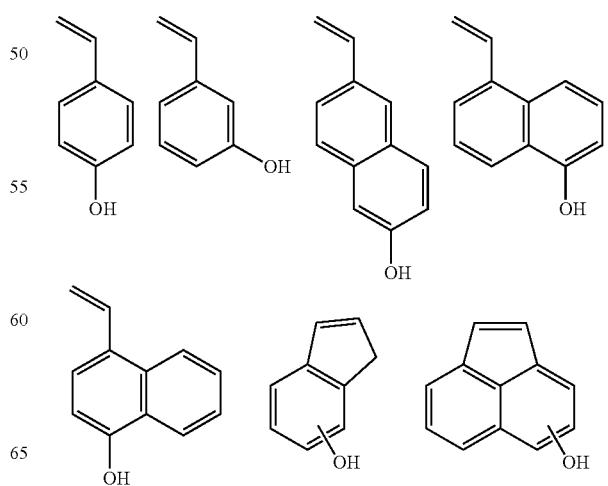

115
-continued
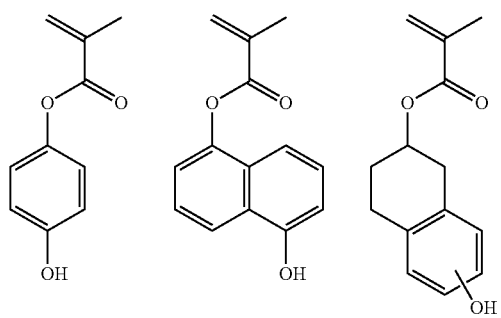
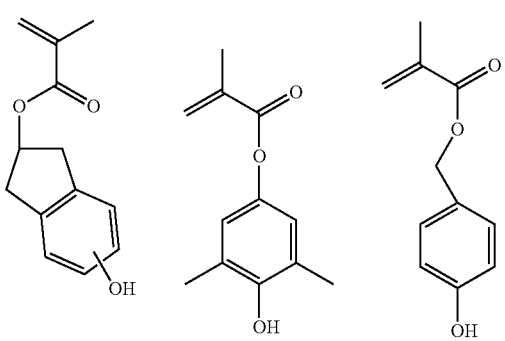
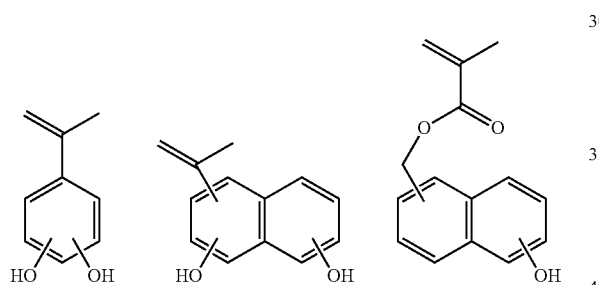
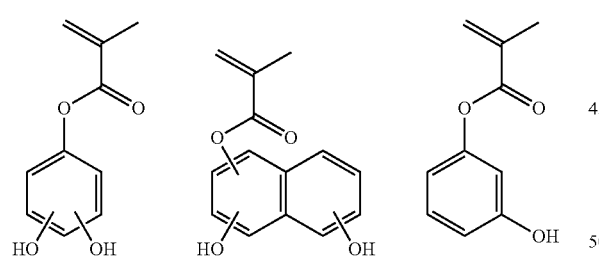
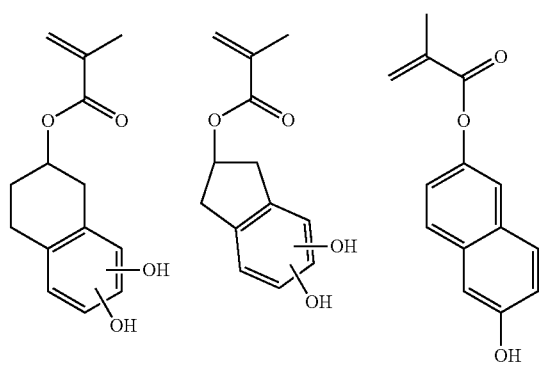
116
-continued
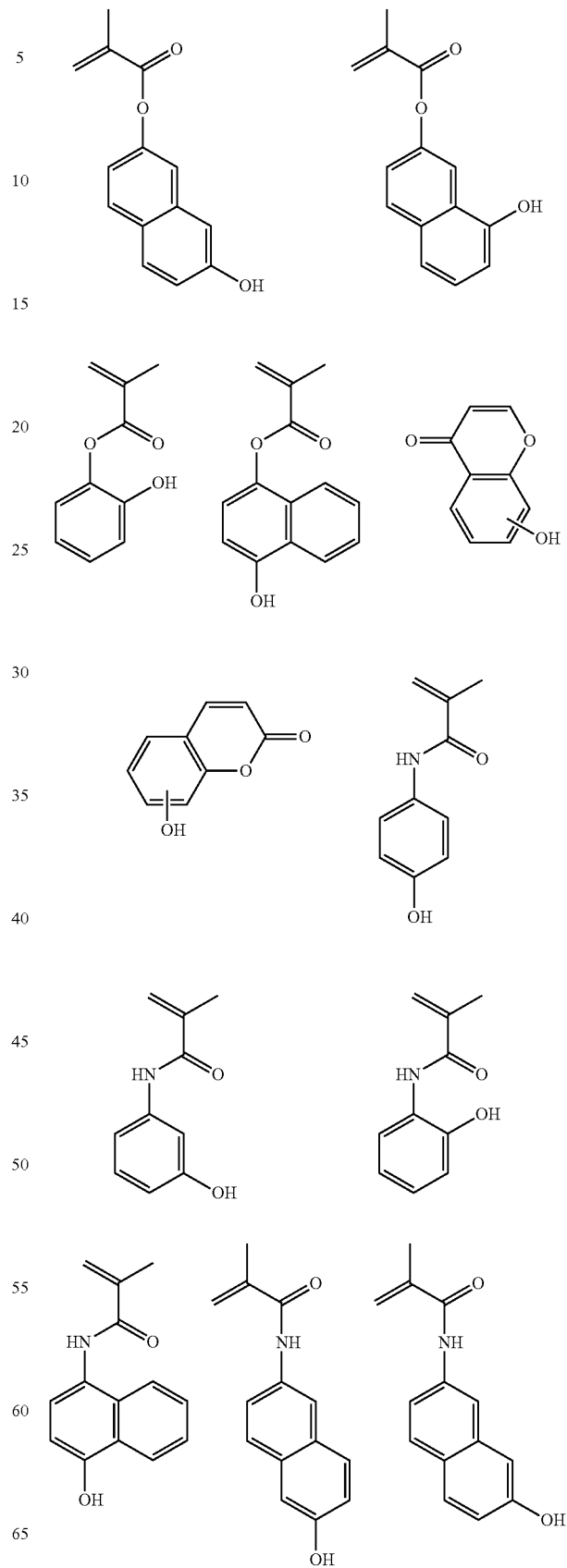

117
-continued
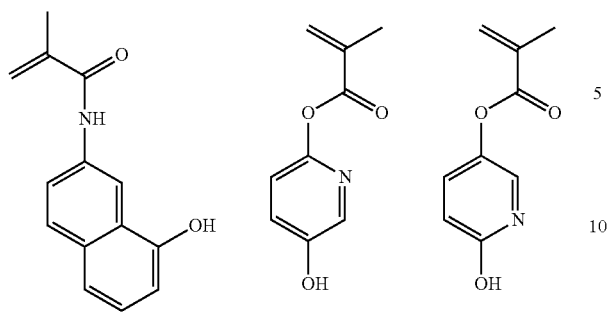
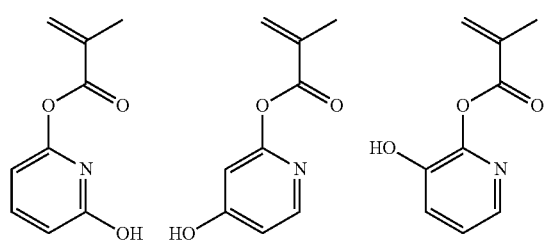
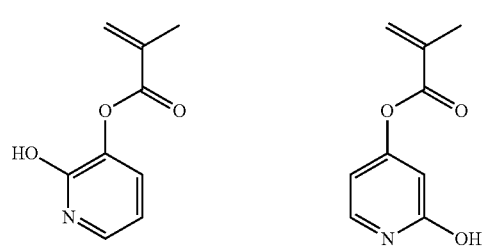
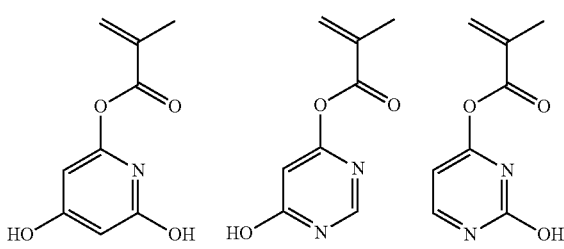
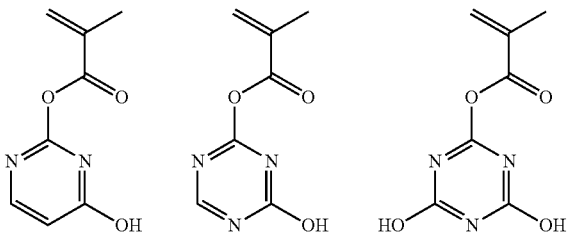
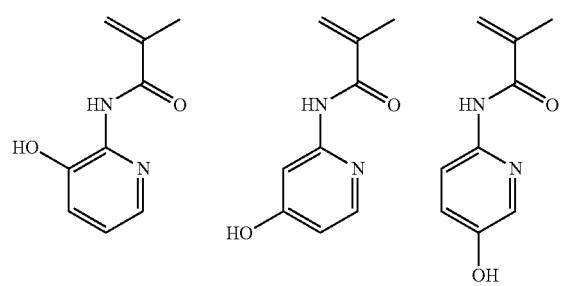
118
-continued
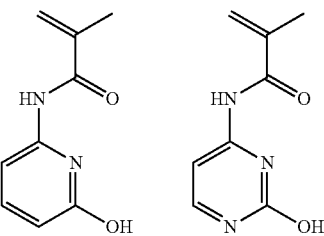
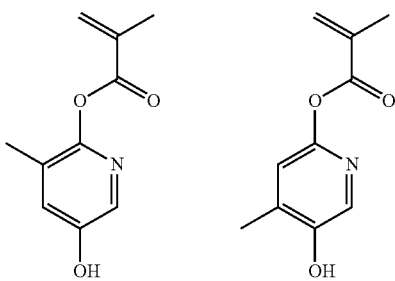
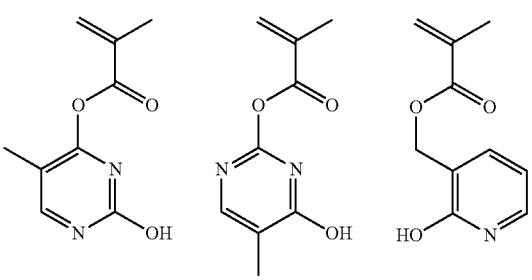
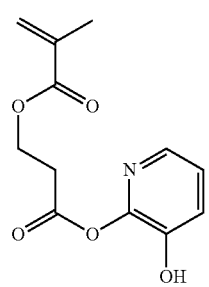
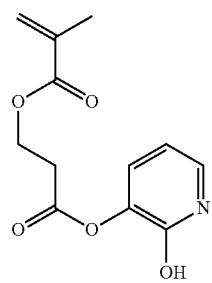
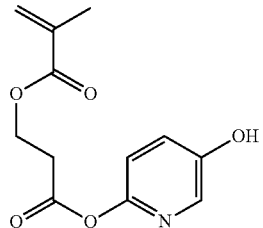
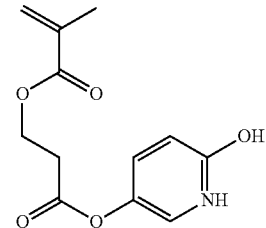

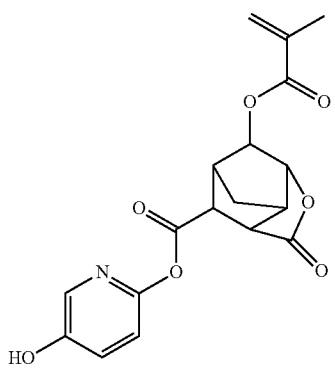

Other adhesive groups are also acceptable. For example, recurring units (d) having an adhesive group selected from among a hydroxyl group (other than phenolic hydroxyl), carboxyl group, lactone ring, carbonate group, thiocarbonate group, carbonyl group, cyclic acetal group, ether group, ester group, sulfonic acid ester group, cyano group, amide group, and —O—C(=O)-G- wherein G is sulfur or NH may be copolymerized.

Examples of the monomers from which the recurring units (d) are derived are shown below.

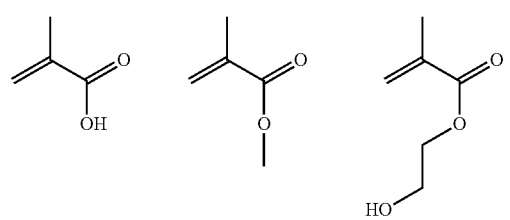

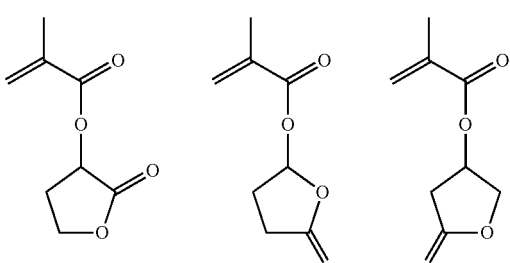

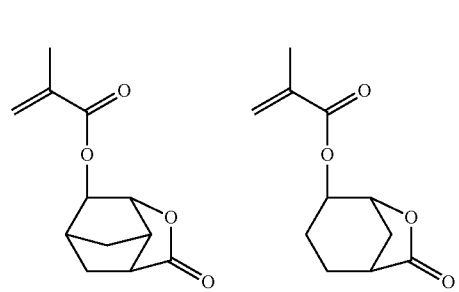

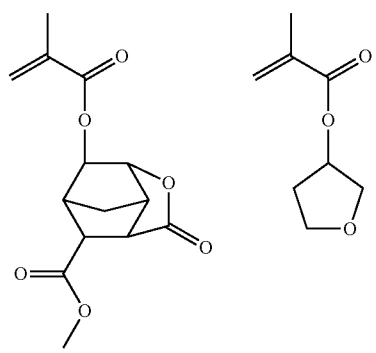

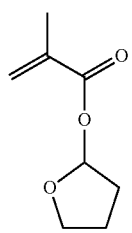

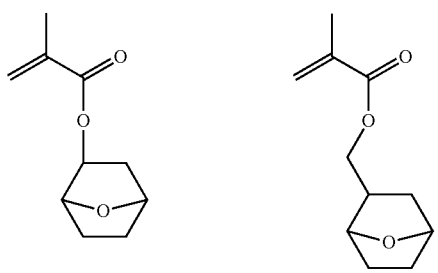

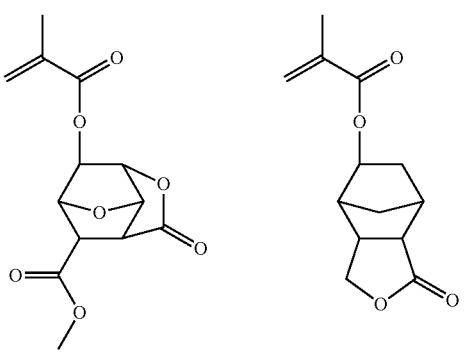

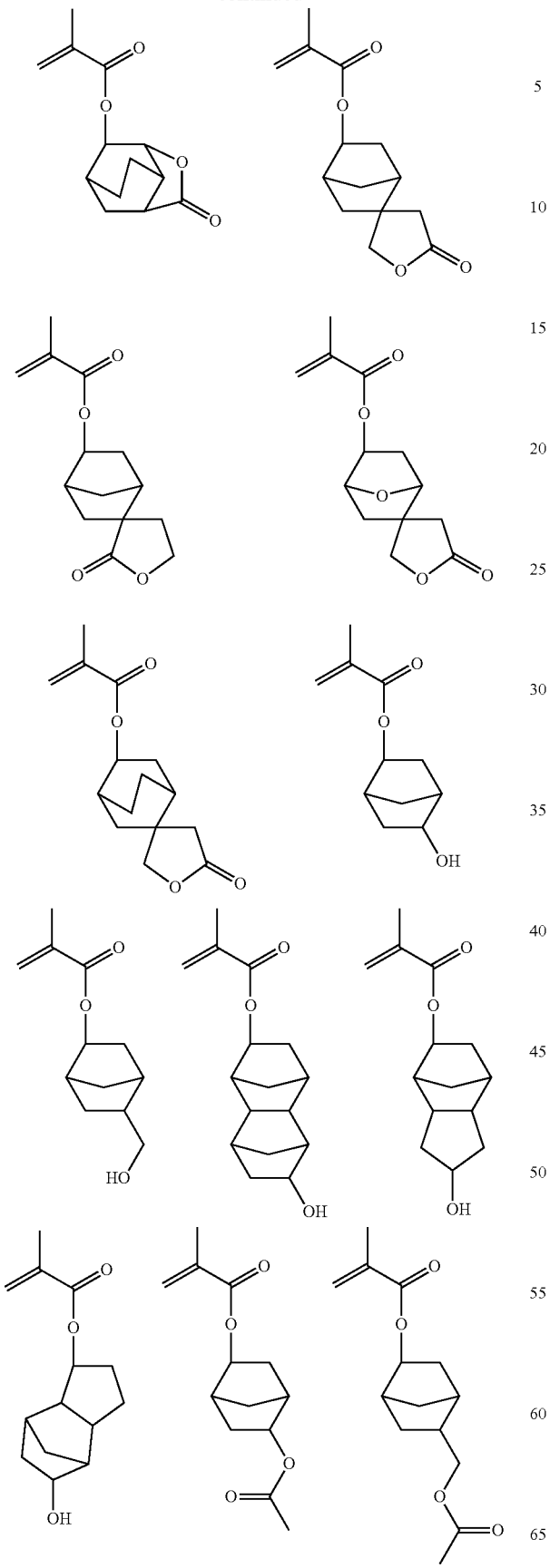
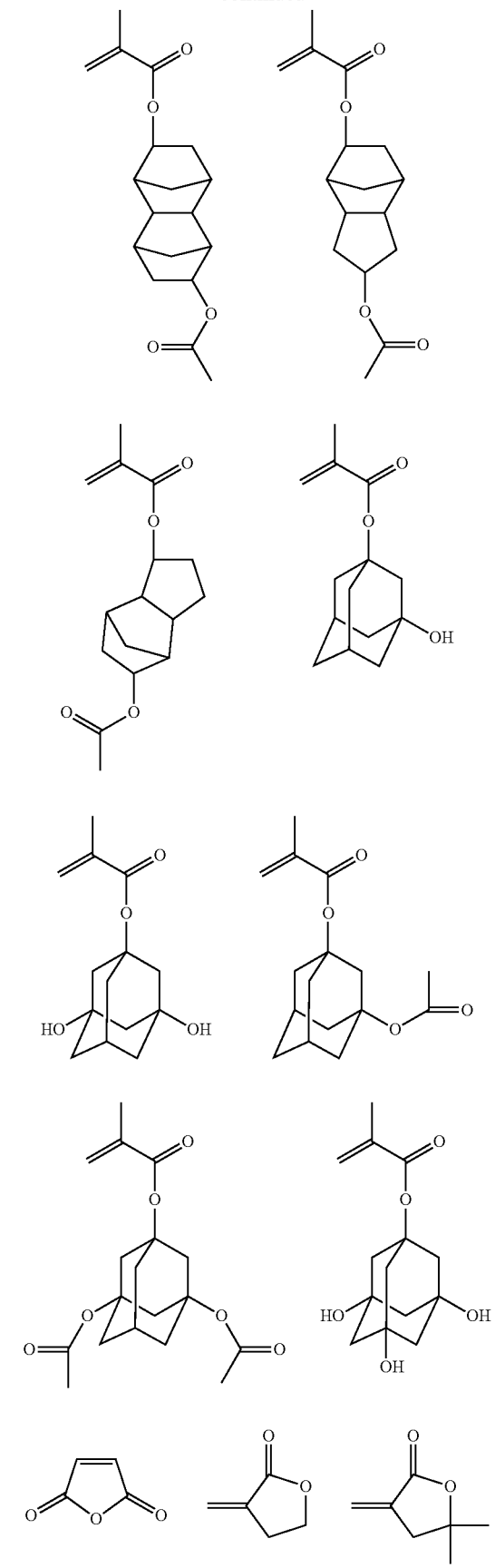

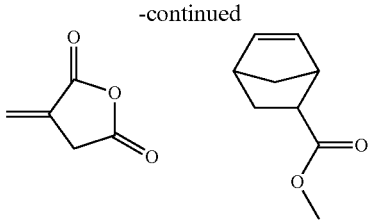
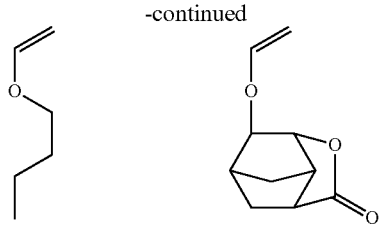
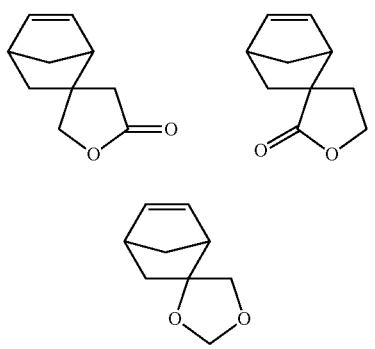
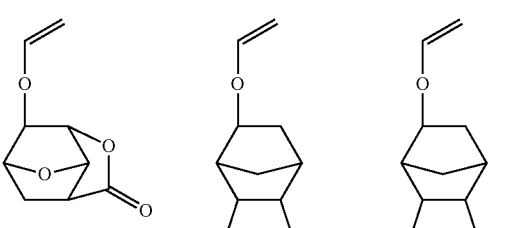
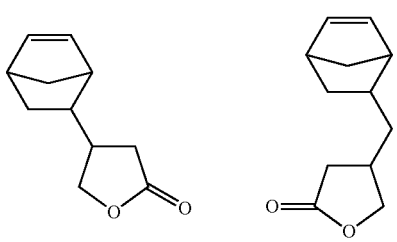
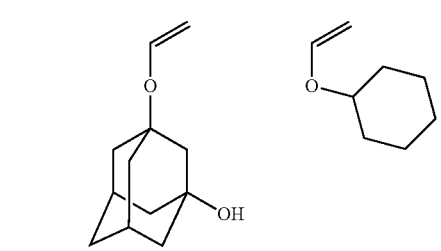
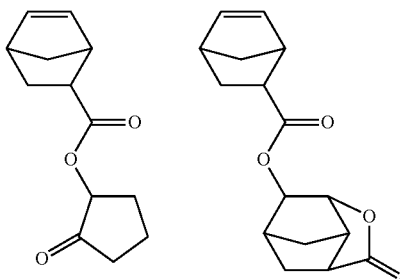
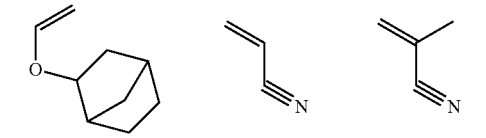
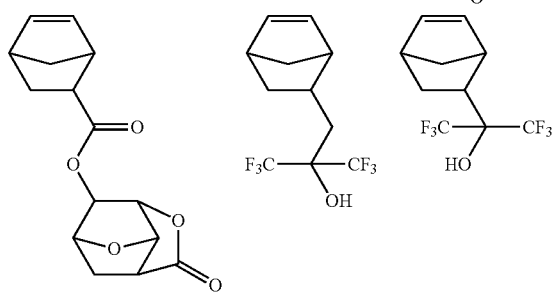
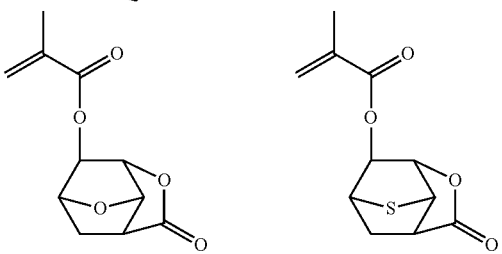
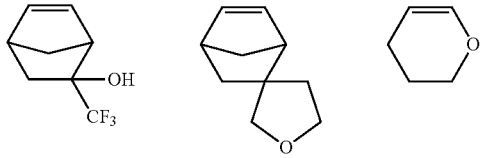
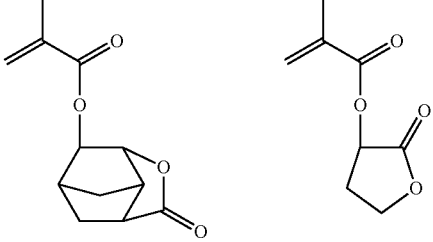
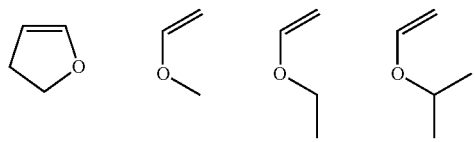
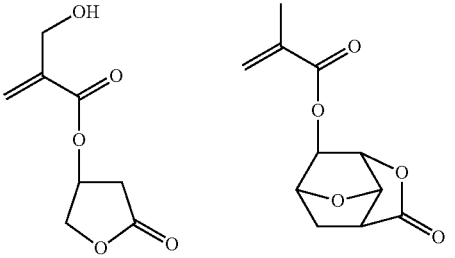

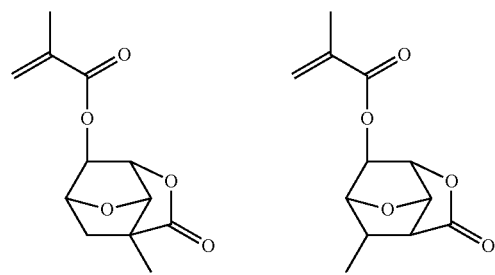
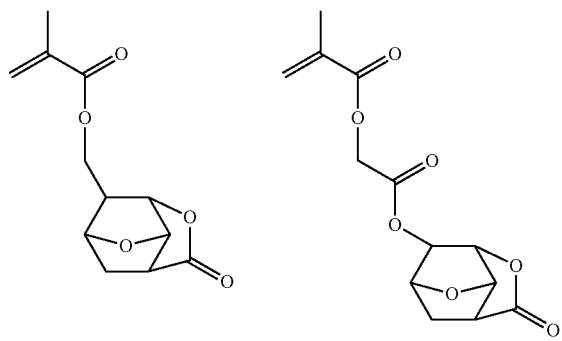
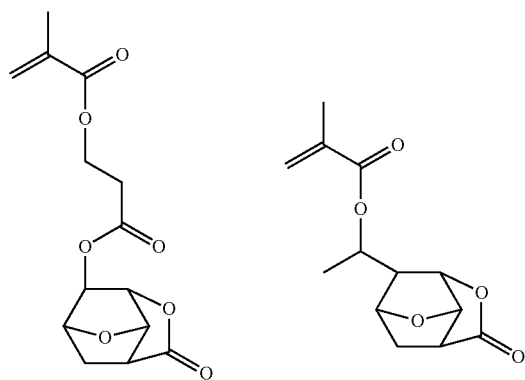
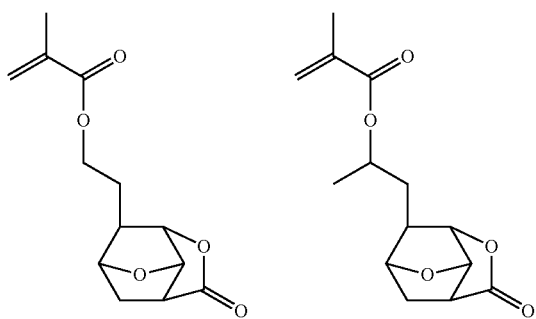
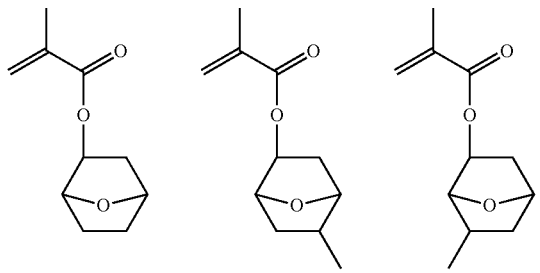
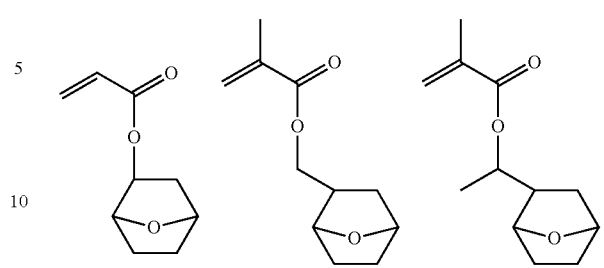
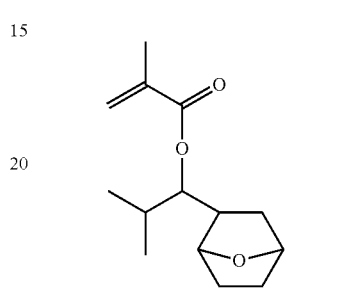
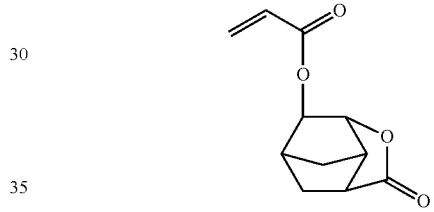
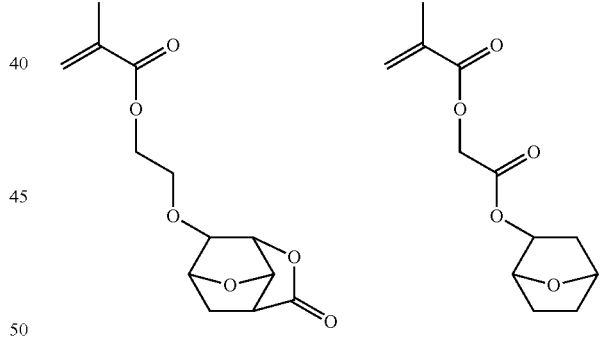
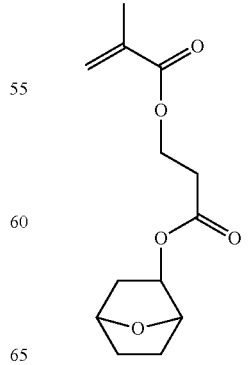

127
-continued
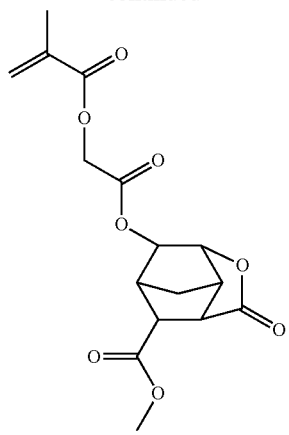
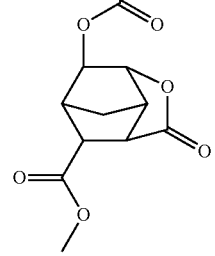
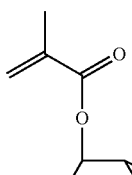 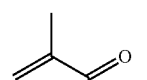
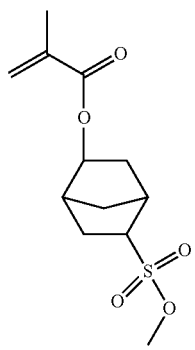
128
-continued
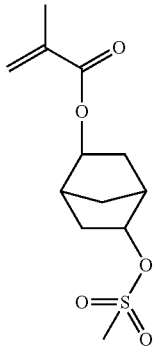 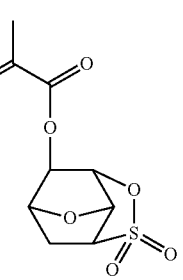
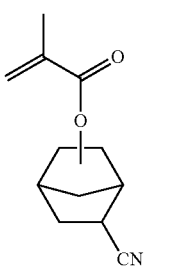 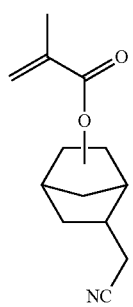 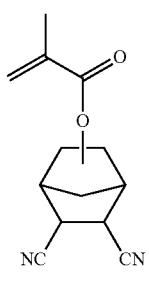
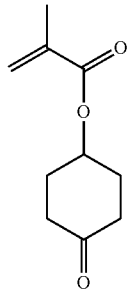 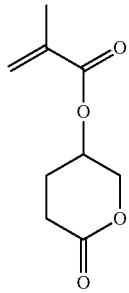
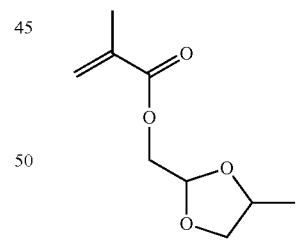 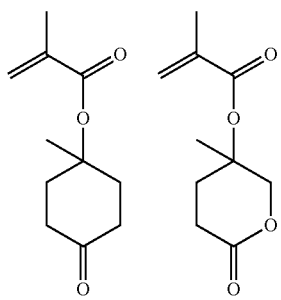
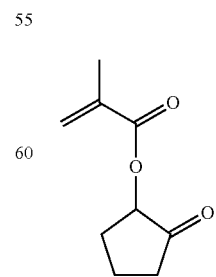 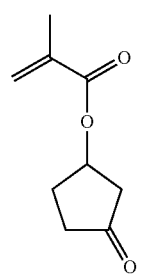 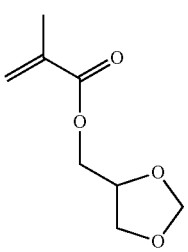

-continued
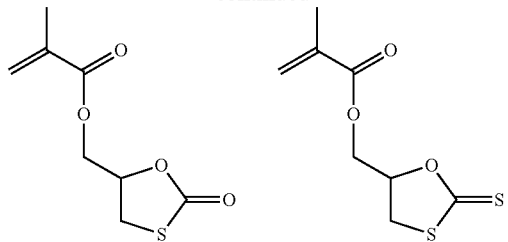
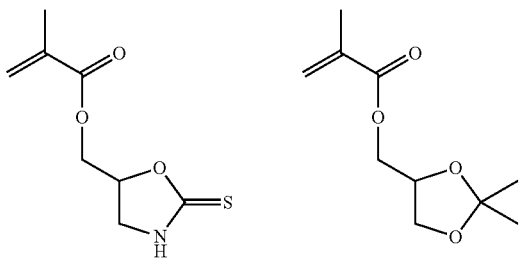
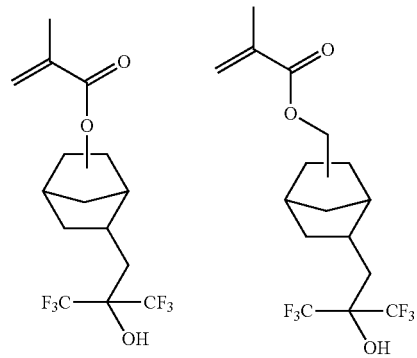
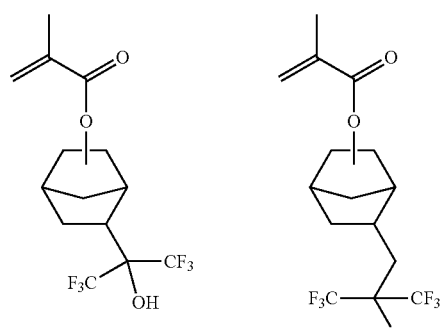
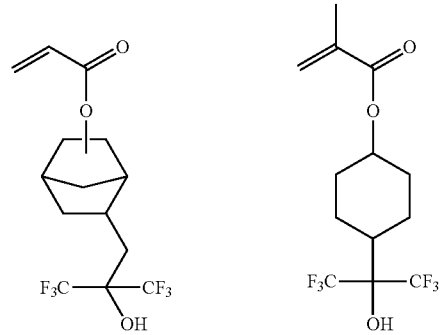
-continued
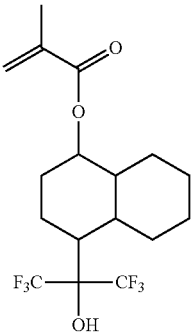
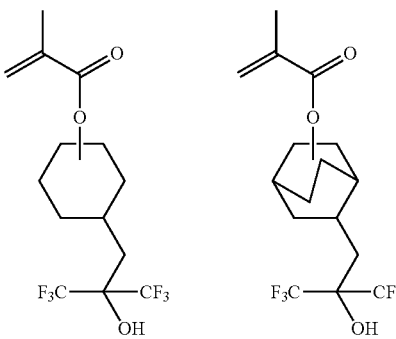
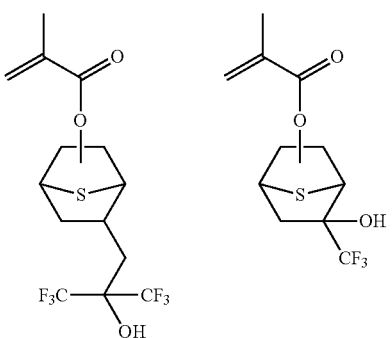
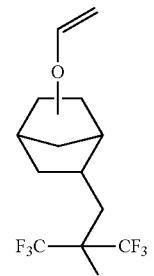
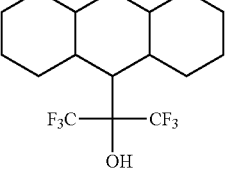

131
-continued
132
-continued
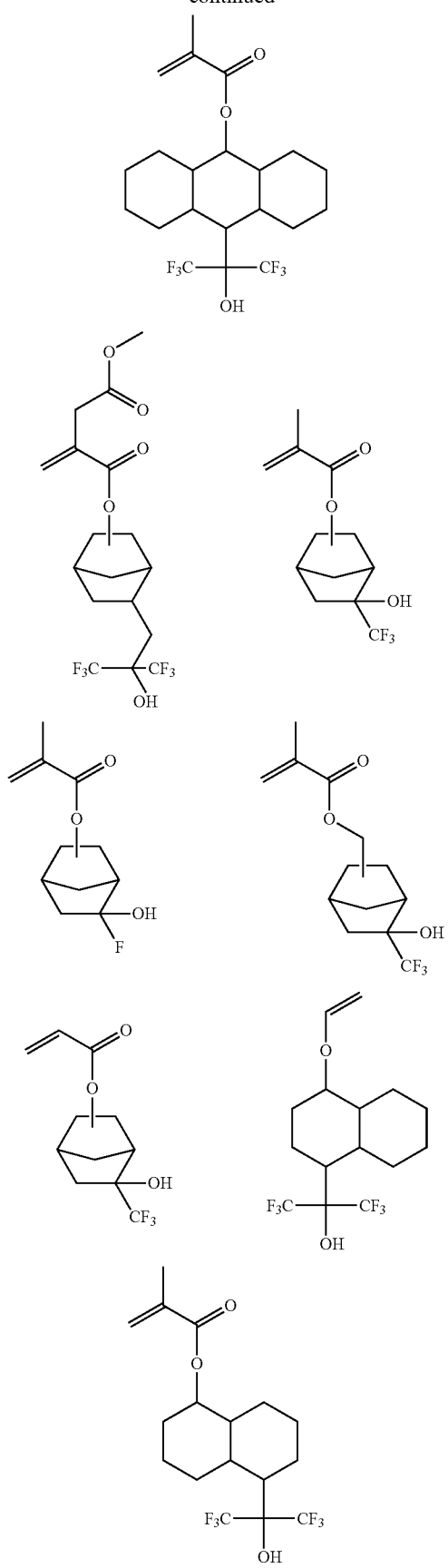
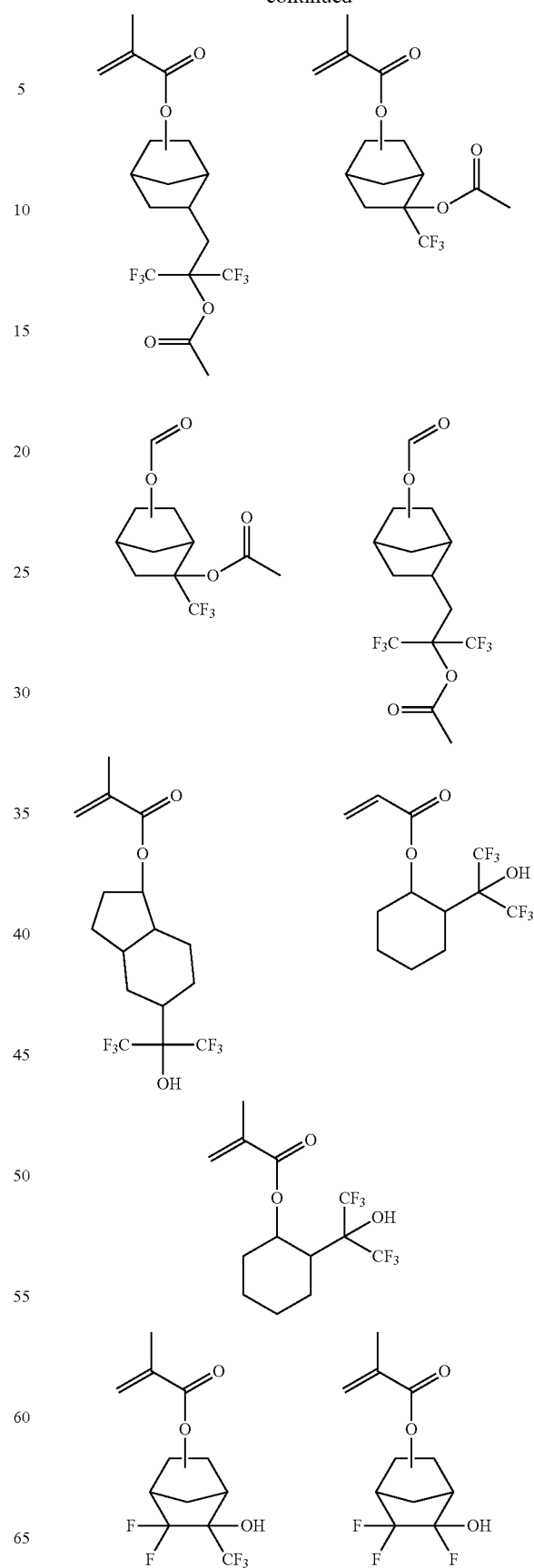

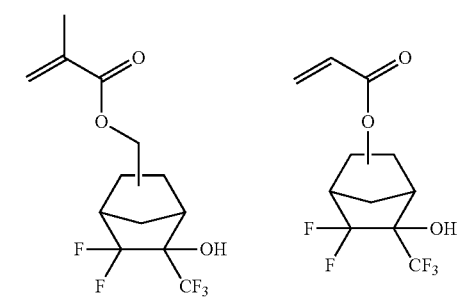
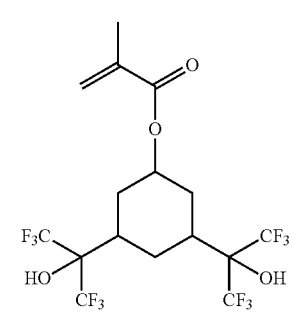
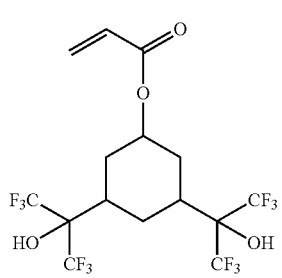
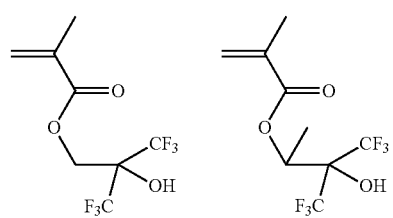
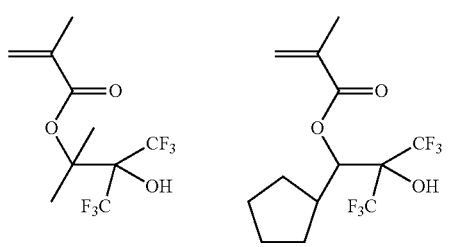
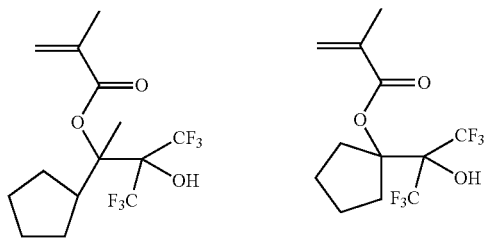
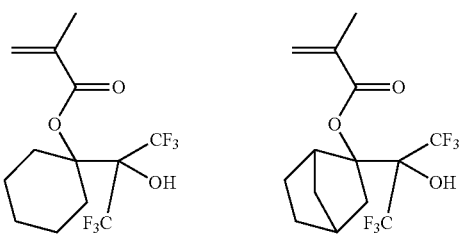
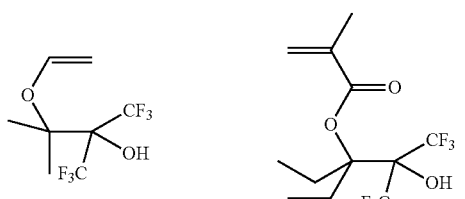
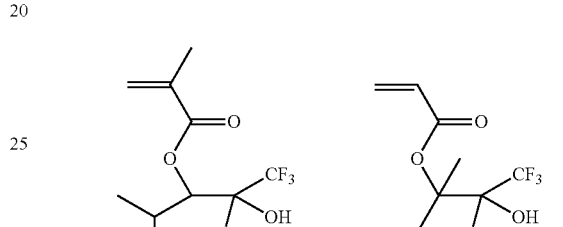
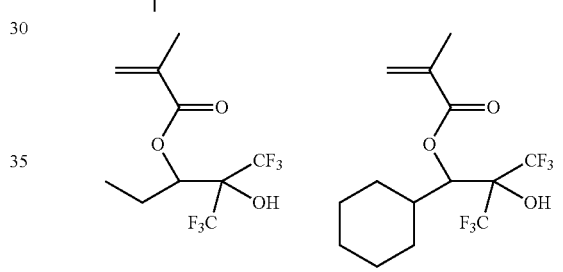
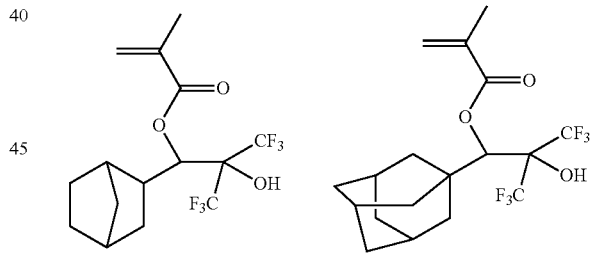
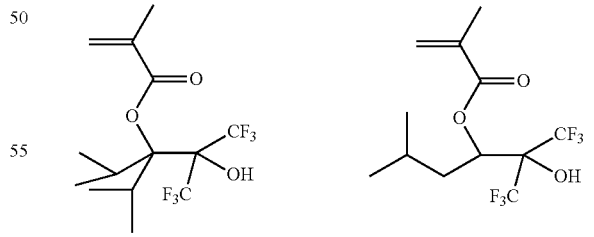
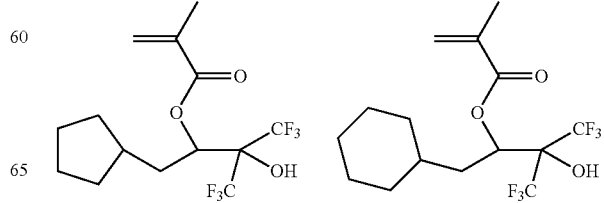

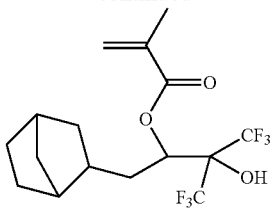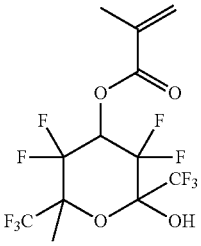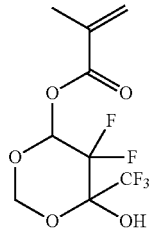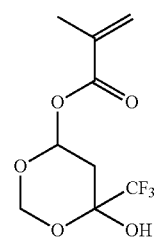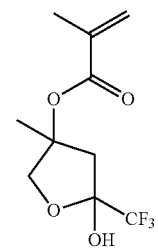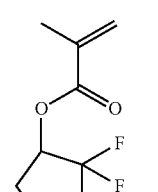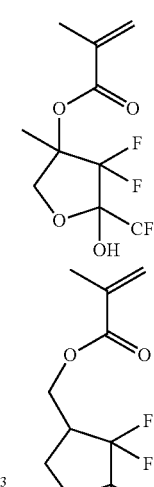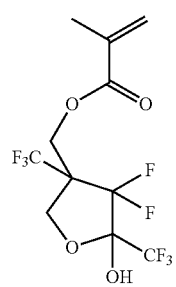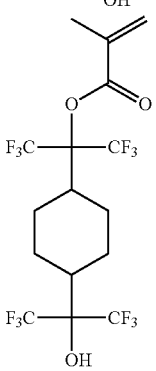

137
-continued
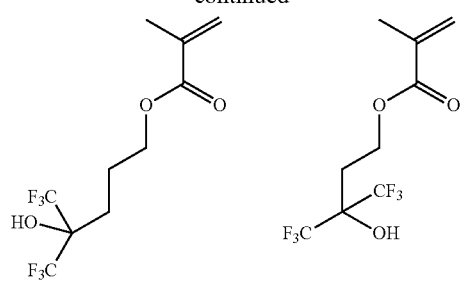
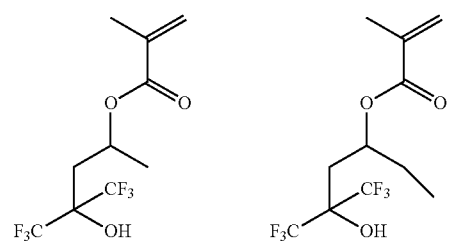
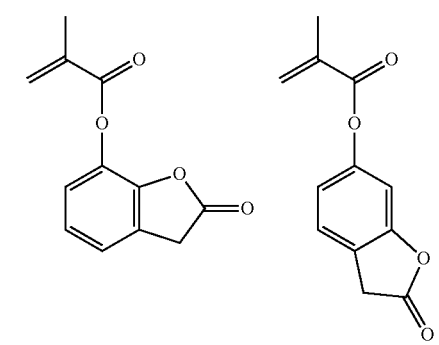
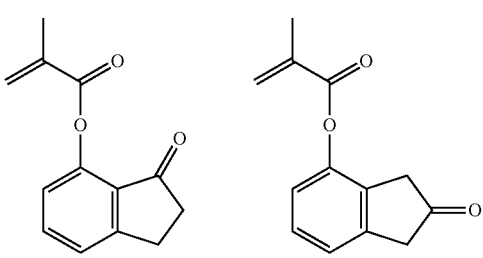
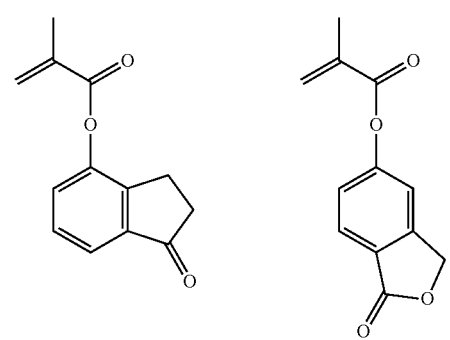
138
-continued
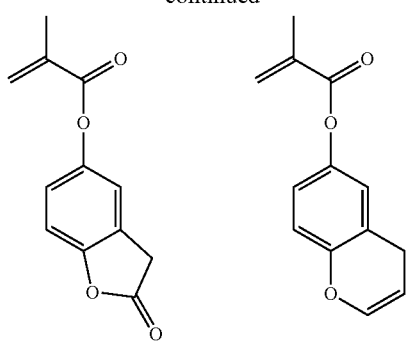
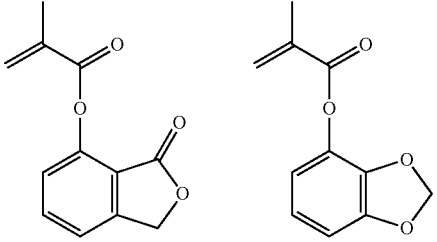
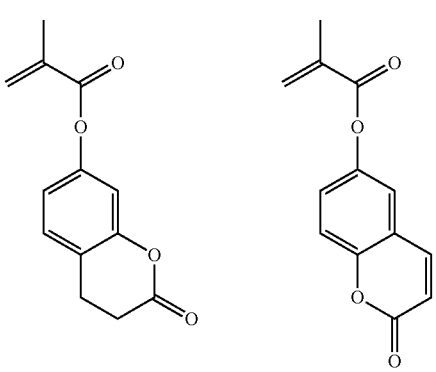
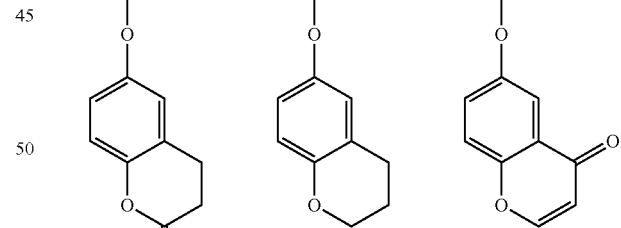
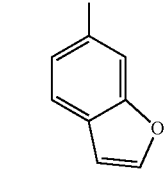

139
-continued
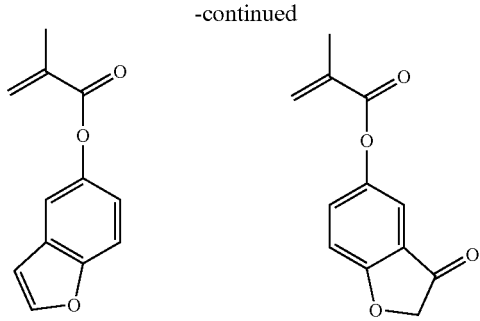
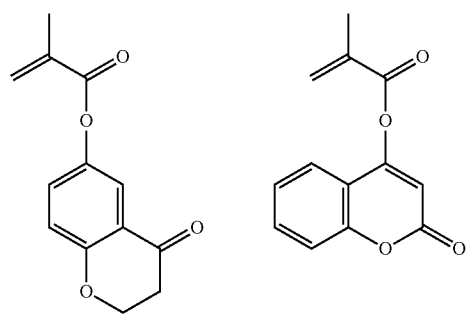
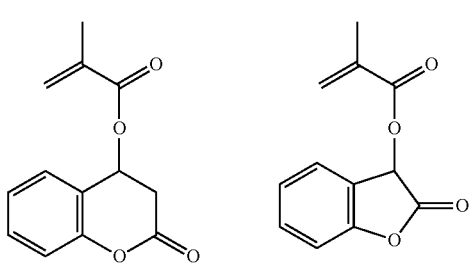
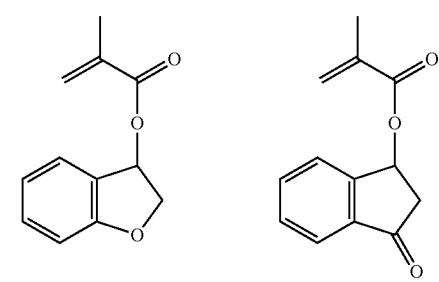
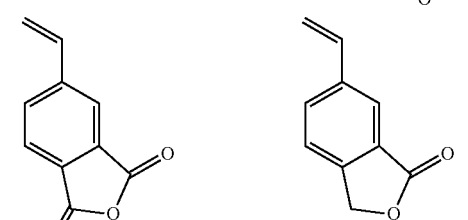
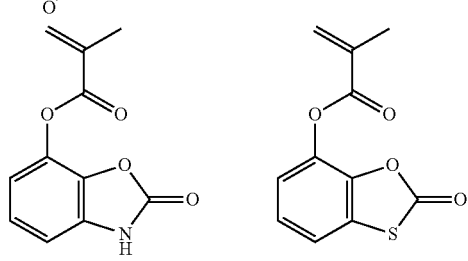
140
-continued
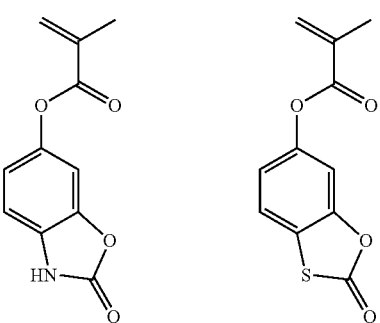
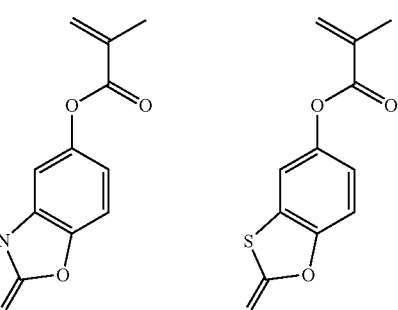
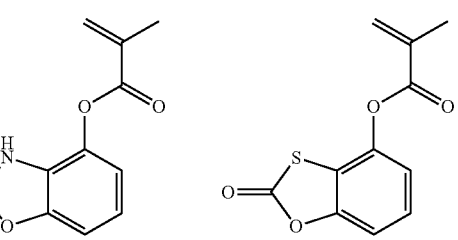
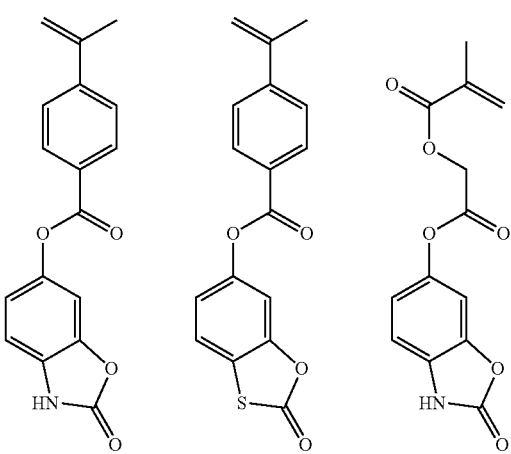

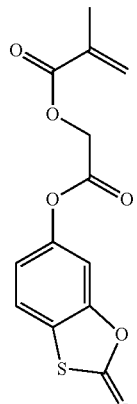
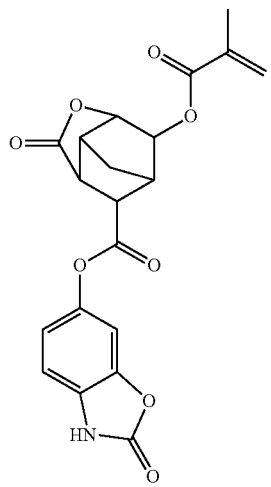
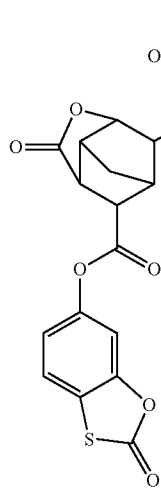
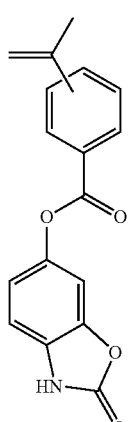
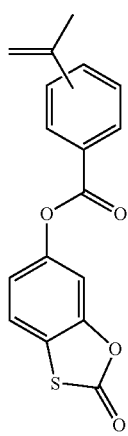
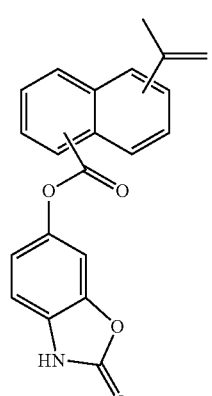

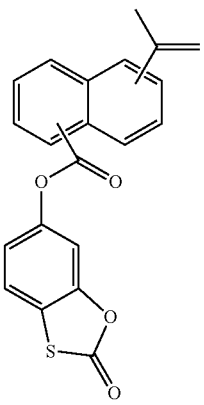
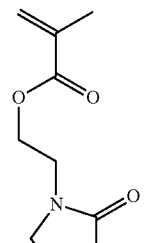
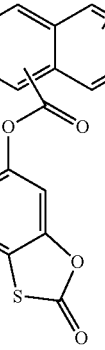
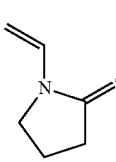
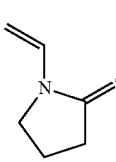

On use of a monomer having a hydroxyl group, prior to polymerization, the hydroxyl group may be replaced by an acetal group which is readily deprotected with an acid, such as ethoxyethoxy, and polymerization be followed by deprotection with weak acid and water. Alternatively, the hydroxyl group may be replaced by an acetyl, formyl, pivaloyl or similar group, and polymerization be followed by alkaline hydrolysis.

In a preferred embodiment, the polymer may have further copolymerized therein recurring units (e) of indene, benzofuran, benzothiophene, acenaphthylene, chromone, coumarin, and norbornadiene, or derivatives thereof, examples of which are shown below.

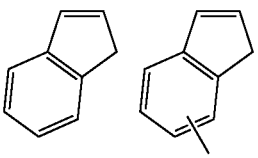
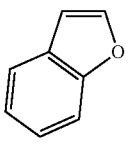
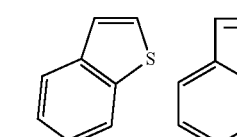
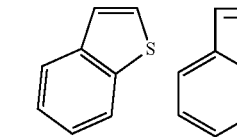
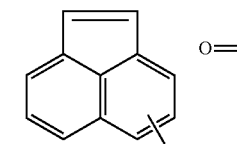
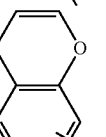

-continued

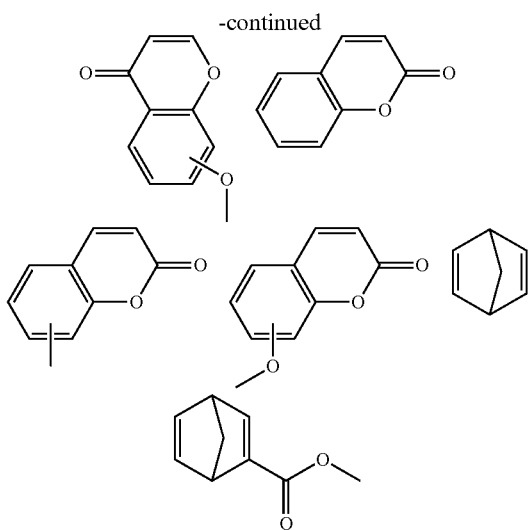

Besides the above recurring units, additional recurring units (f) may be copolymerized in the polymer, which include recurring units derived from styrene, vinylnaphthalene, vinylanthracene, vinylpyrene, methyleneindene, and the like.

In the copolymer for resist use, recurring units (a) to (f) may be incorporated in the following molar fraction:
$0 \leq a1 \leq 0.9$, $0 \leq a2 \leq 0.9$, $0 < a1+a2 \leq 0.9$, $0 \leq b1 \leq 0.3$, $0 \leq b2 \leq 0.3$, $0 < b1+b2 \leq 0.3$, $0 \leq c < 1.0$, $0 \leq d < 1.0$, $0 \leq e < 1.0$, $0 \leq f < 1.0$, and $0.7 \leq a1+a2+b1+b2+c+d \leq 1.0$,
preferably
$0 \leq a1 \leq 0.8$, $0 \leq a2 \leq 0.8$, $0.1 \leq a1+a2 \leq 0.8$, $0 \leq b1 \leq 0.3$, $0 \leq b2 \leq 0.3$, $0.02 \leq b1+b2 \leq 0.3$, $0 \leq c \leq 0.8$, $0 \leq d \leq 0.8$, $0 \leq e \leq 0.5$, $0 \leq f \leq 0.5$, and $0.8 \leq a1+a2+b1+b2+c+d \leq 1.0$, and
more preferably
$0 \leq a1 \leq 0.7$, $0 \leq a2 \leq 0.7$, $0.1 \leq a1+a2 \leq 0.7$, $0 \leq b1 \leq 0.3$, $0 \leq b2 \leq 0.3$, $0.02 \leq b1+b2 \leq 0.25$, $0 \leq c \leq 0.7$, $0 \leq d \leq 0.7$, $0 \leq e \leq 0.4$, $0 \leq f \leq 0.4$, and $0.85 \leq a1+a2+b1+b2+c+d \leq 1.0$.

It is noted that $a1+a2+b1+b2+c+d+e+f=1$.

The polymer may be synthesized by dissolving selected ones of monomers corresponding to units (a1), (a2), (b1) and (b2) and optionally units (c), (d), (e) and (f) in an organic solvent, adding a radical polymerization initiator thereto, and effecting heat polymerization to form a copolymeric high-molecular-weight compound.

Examples of suitable organic solvents used for polymerization include toluene, benzene, tetrahydrofuran, diethyl ether and dioxane. Suitable polymerization initiators include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the relevant units to hydroxystyrene or hydroxyvinylnaphthalene units. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

The polymer serving as the base resin in the resist composition should have a weight average molecular weight (Mw) in the range of 1,000 to 500,000, and preferably 2,000 to 30,000, as measured by GPC versus polystyrene standards using tetrahydrofuran solvent. A polymer with a Mw of at least 1,000 may be fully heat resistant. A polymer with a Mw of up to 500,000 may not lose alkaline solubility or give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component polymer should preferably have a narrow dispersity (Mw/Mn) of 1.0 to 2.0, especially 1.0 to 1.5, in order to provide a resist composition suitable for micropatterning to a small feature size.

The polymer defined herein is suitable as a base resin in a positive resist composition. The positive resist composition is formulated by using the polymer as the base resin and combining it with an organic solvent, acid generator, dissolution regulator, basic compound, surfactant and the like in accordance with a particular purpose. This positive resist composition has a very high sensitivity because the dissolution rate in developer of the polymer in the exposed region is accelerated due to catalytic reaction. The resist film exhibits a high dissolution contrast and resolution, and has an exposure latitude, process adaptability, good pattern profile after exposure, better etching resistance, and minimal proximity bias due to restrained acid diffusion. Because of these advantages, the resist composition finds practical application and is best suited as the resist material for VLSI fabrication. Particularly when the acid generator is added to the resist composition so that it may be a chemically amplified positive one utilizing acid-catalyzed reaction, the composition becomes more useful due to a higher sensitivity and better properties.

Process

The lithography pattern forming process in a preferred embodiment involves at least the steps of forming a photoresist film on a substrate or wafer, forming a protective film thereon from the resist protective film-forming composition of the invention, exposure, and development in a developer.

First, a photoresist film is formed on a substrate. A typical film forming method is spin coating. If it is desirable to reduce the amount of the photoresist composition dispensed for spin coating, preferably the substrate is previously wetted with the resist solvent or a solvent miscible with the resist solvent before the resist composition is dispensed. See JP-A H09-246173, for example. The previous wetting assists in spreading of the photoresist composition solution over the substrate for thereby saving the amount of the photoresist composition dispensed for spin coating. The resist film preferably has a thickness of 10 to 500 nm, more preferably 20 to 300 nm.

Next, a resist protective film is formed on the photoresist film using the protective film-forming composition defined herein. A typical film forming method is spin coating. For spin coating of the protective film-forming composition, previous wetting as described for the photoresist film may be similarly utilized. That is, the surface of the photoresist film may be wetted before the protective film-forming composition is coated thereon. The resist protective film preferably has a thickness of 2 to 200 nm, more preferably 5 to 50 nm. The means of wetting the surface of the photoresist film include spin coating and vapor priming, with the spin coating technique being often employed. The solvent used for wetting is preferably selected from higher alcohols, ethers, and fluorinated solvents which do not dissolve the resist film.

The protective film should preferably have an alkaline dissolution rate of at least 3 nm/s, more preferably at least 5 nm/s.

Once the resist film is coated with the protective film, it is exposed patternwise to radiation. In the exposure step, radiation having a wavelength of 3 to 15 nm or electron beam may be used. The exposure environment may be vacuum for both EUV and EB. Exposure is followed by optional PEB and development.

In the development step, the wafer is immersed in an alkaline developer for 3 to 300 seconds. The alkaline developer is typically a 2.38 wt % aqueous solution of tetramethylammonium hydroxide (TMAH). An aqueous solution of tetrabutylammonium hydroxide may also be used instead of the TMAH solution. In the development step using an alkaline developer, preferably the photoresist film is developed to form a resist pattern, and the protective film on the photoresist film is stripped off at the same time. Then stripping of the protective film can be carried out without adding a stripper unit to the existing system.

In addition to the foregoing steps, any of etching, resist removal, cleaning and other steps may be carried out.

EXAMPLE

Examples of the invention are given below by way of illustration and not by way of limitation. It is noted that Mw and Mn are determined by GPC versus polystyrene standards using tetrahydrofuran solvent.

Examples & Comparative Examples

The following polymers were used as the bisphenol novolak resin for the protective film.

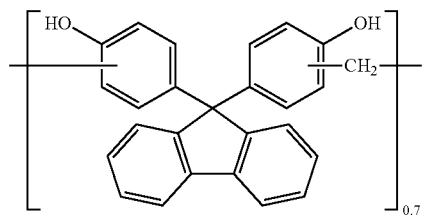

Protective Polymer 1
Mw = 3,600
Mw/Mn = 2.10

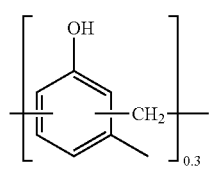

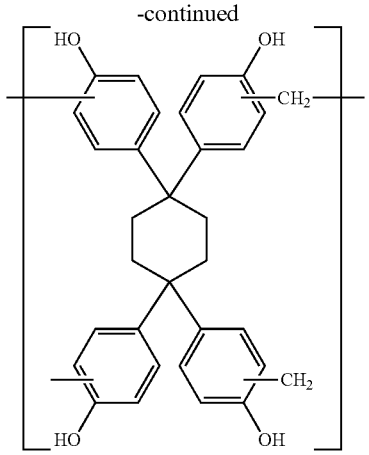

Protective Polymer 2
Mw = 3,600
Mw/Mn = 3.32

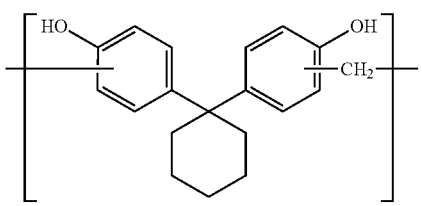

Protective Polymer 3
Mw = 2,900
Mw/Mn = 2.66

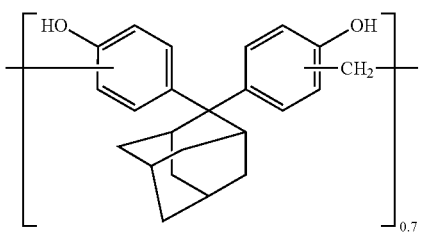

Protective Polymer 4
Mw = 2,900
Mw/Mn = 2.65

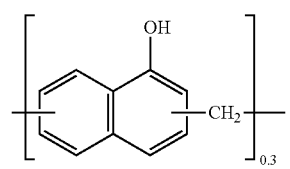

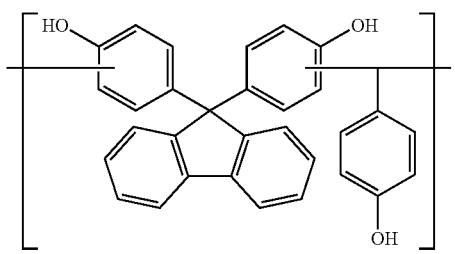

Protective Polymer 5
Mw = 3,100
Mw/Mn = 3.32

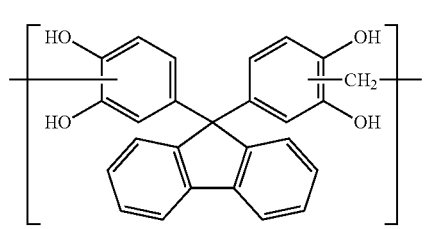
Protective Polymer 6
Mw = 3,200
Mw/Mn = 3.68
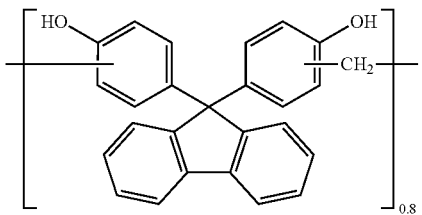
Protective Polymer 10
Mw = 2,500
Mw/Mn = 2.76
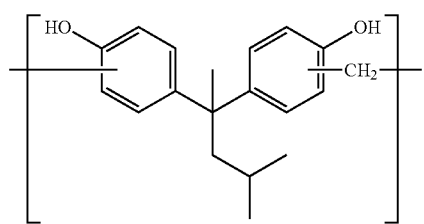
Protective Polymer 7
Mw = 5,300
Mw/Mn = 5.20
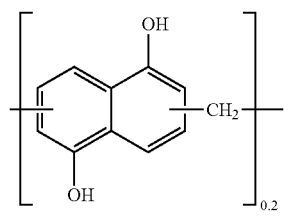
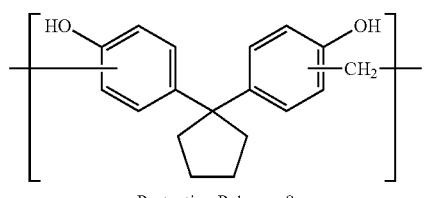
Protective Polymer 8
Mw = 4,200
Mw/Mn = 3.95
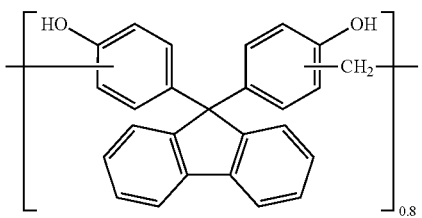
Protective Polymer 11
Mw = 2,100
Mw/Mn = 3.22
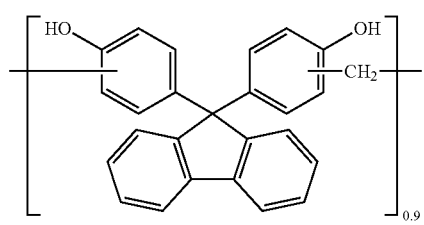
Protective Polymer 9
Mw = 2,900
Mw/Mn = 2.80
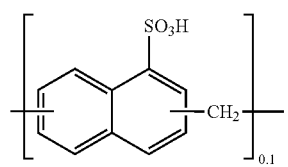
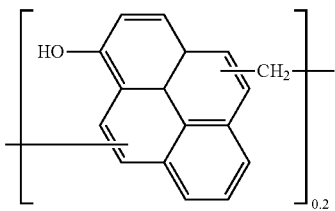
Comparative Protective Polymer 1
Mw = 6,300
Mw/Mn = 3.66

-continued

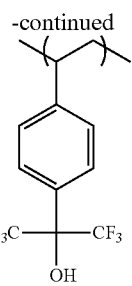

Comparative Protective Polymer 2
Mw = 9,600
Mw/Mn = 1.93

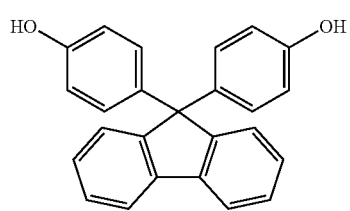

Comparative Protective Compound 1

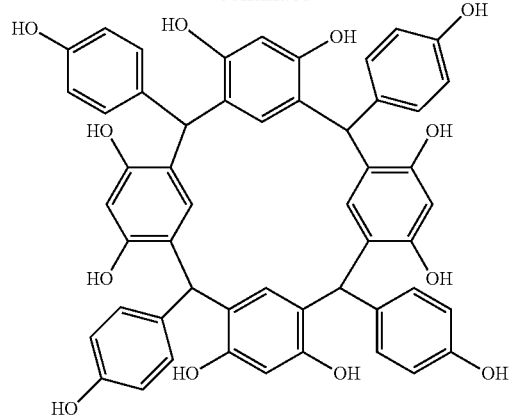

Comparative Protective Compound 2

Resist protective topcoat solutions TC-1 to 15 and Comparative-TC-1 to 5 were prepared by mixing the polymer with an additive and a solvent mixture. In the case of Comparative-TC-5, Comparative Protective Polymer 1 did not dissolve in a mixture of 4-methyl-2-pentanol and diisopentyl ether.

TABLE 1

| | | | Base resin (pbw) | Additive (pbw) | Solvents (pbw) |
|---|---|---|---|---|---|
| Example | 1 | TC-1 | Protective Polymer 1 (10) | — | isobutyl alcohol (100) diisopentyl ether (600) |
| | 2 | TC-2 | Protective Polymer 2 (10) | — | 2-methyl-1-butanol (100) diisopentyl ether (500) |
| | 3 | TC-3 | Protective Polymer 3 (10) | — | 4-methyl-2-pentanol (200) diisopentyl ether (400) |
| | 4 | TC-4 | Protective Polymer 4 (10) | — | 4-methyl-2-pentanol (200) diisopentyl ether (400) |
| | 5 | TC-5 | Protective Polymer 5 (10) | — | 4-methyl-2-pentanol (300) diisopentyl ether (300) |
| | 6 | TC-6 | Protective Polymer 6 (10) | — | 4-methyl-2-pentanol (200) diisopentyl ether (400) |
| | 7 | TC-7 | Protective Polymer 7 (10) | — | 4-methyl-2-pentanol (200) diisopentyl ether (400) |
| | 8 | TC-8 | Protective Polymer 8 (10) | — | 4-methyl-2-pentanol (200) diisopentyl ether (400) |
| | 9 | TC-9 | Protective Polymer 9 (10) | — | 4-methyl-2-pentanol (200) diisopentyl ether (400) |
| | 10 | TC-10 | Protective Polymer 10 (10) | — | 4-methyl-2-pentanol (200) diisopentyl ether (400) |
| | 11 | TC-11 | Protective Polymer 11 (10) | — | 4-methyl-2-pentanol (200) diisopentyl ether (400) |
| | 12 | TC-12 | Protective Polymer 1 (10) | — | 4-methyl-2-pentanol (100) dibutyl ether (600) |
| | 13 | TC-13 | Protective Polymer 1 (10) | — | 4-methyl-2-pentanol (250) xylene (450) |
| | 11 | TC-14 | Protective Polymer 1 (10) | tri-n-octylamine (0.01) | 4-methyl-2-pentanol (100) diisopentyl ether (600) |
| | 15 | TC-15 | Protective Polymer 1 (10) | 1-aminopyrene (0.01) | 4-methyl-2-pentanol (100) diisopentyl ether (600) |
| Comparative Example | 1 | Comparative-TC-1 | Comparative Protective Polymer 1 (10) | — | 4-methyl-2-pentanol (500) |
| | 2 | Comparative-TC-2 | Comparative Protective Polymer 2 (10) | — | diisopentyl ether (500) |
| | 3 | Comparative-TC-3 | Comparative Protective Compound 1 (10) | — | isobutyl alcohol (300) diisopentyl ether (300) |
| | 4 | Comparative-TC-4 | Comparative Protective Compound 2 (15) | — | isobutyl alcohol (800) |
| | 5 | Comparative-TC-5 | Comparative Protective Polymer 1 (10) | — | 4-methyl-2-pentanol (200) diisopentyl ether (400) |

The resist protective topcoat solutions TC-1 to 15 and Comparative-TC-1 to 4 were spin coated onto silicon substrates and baked at 100° C. for 60 seconds to form protective films (TC-1 to 15 and Comparative-TC-1 to 4) having a thickness of 20 nm.

The silicon substrates covered with the protective films were developed in a 2.38 wt % TMAH aqueous solution for 30 seconds. After development, the thickness of the protective films was measured. The results are shown in Table 2. It was confirmed that after development, all the protective films were dissolved away.

TABLE 2

|  |  | Resist protective film | Film thickness after development (nm) |
|---|---|---|---|
| Example | 1 | TC-1 | 0 |
|  | 2 | TC-2 | 0 |
|  | 3 | TC-3 | 0 |
|  | 4 | TC-4 | 0 |
|  | 5 | TC-5 | 0 |
|  | 6 | TC-6 | 0 |
|  | 7 | TC-7 | 0 |
|  | 8 | TC-8 | 0 |
|  | 9 | TC-9 | 0 |
|  | 10 | TC-10 | 0 |
|  | 11 | TC-11 | 0 |
|  | 12 | TC-12 | 0 |
|  | 13 | TC-13 | 0 |
|  | 14 | TC-14 | 0 |
|  | 15 | TC-15 | 0 |
| Comparative Example | 1 | Comparative-TC-1 | 0 |
|  | 2 | Comparative-TC-2 | 0 |
|  | 3 | Comparative-TC-3 | 0 |
|  | 4 | Comparative-TC-4 | 0 |

Figure 2:
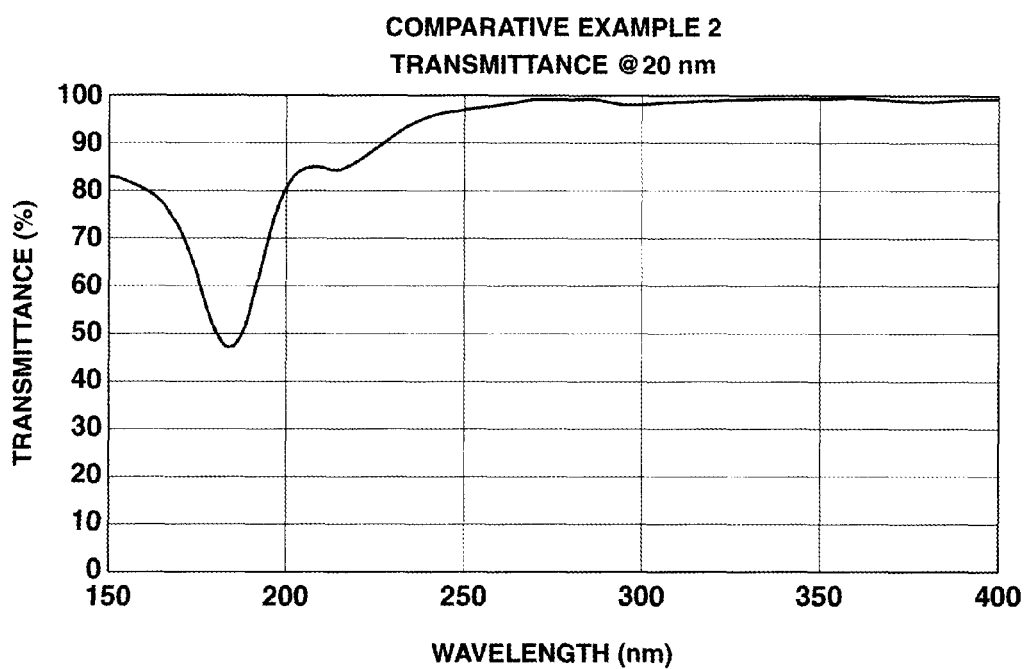
FIG. 2 graphically illustrates the transmittance of a protective film of 20 nm thick in Comparative Example 2.

The resist protective topcoat solutions TC-1 and Comparative-TC-2 were spin coated onto silicon substrates and baked at 100° C. for 60 seconds to form protective films (TC-1 and Comparative-TC-2) having a thickness of 20 nm. Each film was measured for a refractive index (n and k values) using a spectroscopic ellipsometer of J. A. Woollam Co., and a transmittance across the film of 20 nm thick was computed from the k value. The results of Example 1 and Comparative Example 2 are shown in FIGS. 1 and 2, respectively.

EUV Test

Positive resist compositions 1 and 2 were prepared by using the polymer synthesized by conventional radical polymerization, dissolving the polymer and other components in a solvent as shown in Table 3, and filtering through a filter having a pore size of 0.2 μm.

A silicon substrate of 8 inch diameter was coated with a silicon-containing SOG film of 35 nm thick (SHB-A940, Shin-Etsu Chemical Co., Ltd.). The positive resist composition was coated on the silicon substrate and prebaked on a hot plate at 105° C. for 60 seconds to form a resist film of 50 nm thick. The protective film solution was spin coated onto the resist film and prebaked on a hot plate at 100° C. for 60 seconds to form a protective film of 20 nm thick. The wafer was exposed using an EUV micro-stepper (NA 0.3, quadrapole illumination). As a simulation of OOB light irradiation, the wafer was exposed over the entire surface in a dose of 1 mJ/cm² by means of an ArF excimer laser scanner and then over the entire surface in a dose of 1 mJ/cm² by means of a KrF excimer laser scanner. This was followed by PEB on a hot plate at 95° C. for 60 seconds and puddle developed in a 2.38 wt % TMAH aqueous solution for 30 seconds, yielding a positive pattern. It is noted that Comparative Example 10 omitted formation of a protective film on the resist film, and Comparative Example 11 omitted formation of a protective film on the resist film and the ArF and KrF exposures simulating OOB. The results are shown in Table 4.

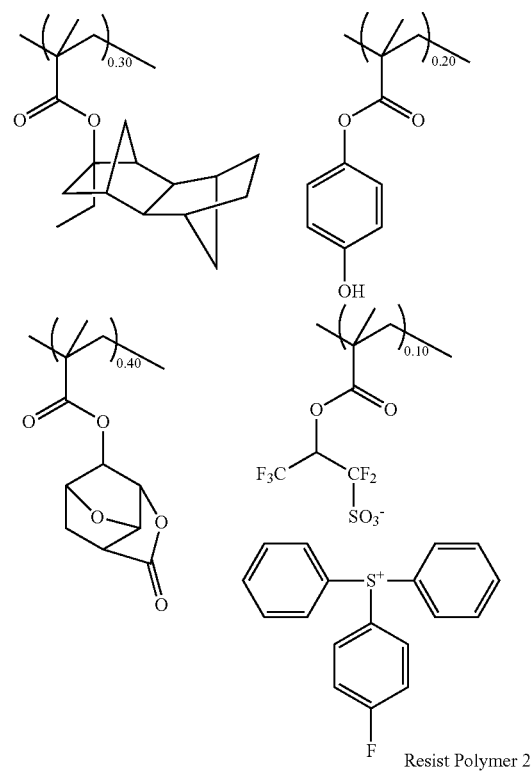

Resist Polymer 1

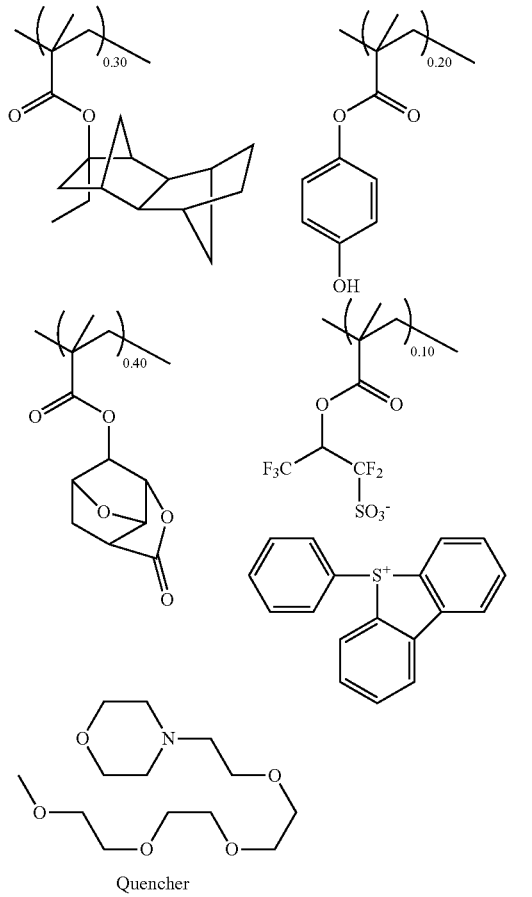

Resist Polymer 2

Quencher

TABLE 3

|  | Polymer (pbw) | Quencher (pbw) | Surfactant (pbw) | Solvents (pbw) |
|---|---|---|---|---|
| Resist composition 1 | Resist Polymer 1 (100) | Quencher (0.85) | FC-4430 (0.001) | PGMEA (1,000) PGME (500) cyclohexanone (3,000) |
| Resist composition 2 | Resist Polymer 2 (100) | Quencher (0.85) | FC-4430 (0.001) | PGMEA (1,000) PGME (500) cyclohexanone (3,000) |

PGMEA: propylene glycol monomethyl ether acetate
PGME: propylene glycol monomethyl ether
FC-4430: fluorochemical surfactant by 3M-Sumitomo Co., Ltd.

TABLE 4

|  |  |  | Protective film | Sensitivity (mJ/cm$^2$) | Pattern profile |
|---|---|---|---|---|---|
| Example | 16 | Resist composition 1 | TC-1 | 9.5 | rectangular |
|  | 17 | Resist composition 1 | TC-2 | 9.5 | rectangular |
|  | 18 | Resist composition 1 | TC-3 | 9.5 | rectangular |
|  | 19 | Resist composition 1 | TC-4 | 9.7 | rectangular |
|  | 20 | Resist composition 1 | TC-5 | 9.8 | rectangular |
|  | 21 | Resist composition 1 | TC-6 | 9.9 | rectangular |
|  | 22 | Resist composition 1 | TC-7 | 10.0 | rectangular |
|  | 23 | Resist composition 1 | TC-8 | 9.9 | rectangular |
|  | 24 | Resist composition 1 | TC-9 | 9.4 | rectangular |
|  | 25 | Resist composition 1 | TC-10 | 9.3 | rectangular |
|  | 26 | Resist composition 1 | TC-11 | 9.9 | rectangular |
|  | 27 | Resist composition 1 | TC-12 | 9.9 | rectangular |
|  | 28 | Resist composition 1 | TC-13 | 9.8 | rectangular |
|  | 29 | Resist composition 1 | TC-14 | 9.0 | rectangular |
|  | 30 | Resist composition 1 | TC-15 | 9.0 | rectangular |
|  | 31 | Resist composition 2 | TC-1 | 10.0 | rectangular |
| Comparative Example | 6 | Resist composition 1 | Comparative-TC-1 | 9.0 | film thickness loss |
|  | 7 | Resist composition 1 | Comparative-TC-2 | 14.0 | tapered |
|  | 8 | Resist composition 1 | Comparative-TC-3 | 9.5 | film thickness loss |
|  | 9 | Resist composition 1 | Comparative-TC-4 | 10.0 | film thickness loss |
|  | 10 | Resist composition 1 | — | 8.3 | film thickness loss tapered |
|  | 11 | Resist composition 1 | — | 11.0 | rectangular |

Since the protective film composition contains a large amount of ether or aromatic solvent capable of preventing intermixing with the resist film, it causes few damages to the resist film and prevents intermixing between the resist film and the protective film. As a result, the resist pattern after development remains rectangular. Since the protective film composition contains a large amount of phenol group having high transparency to EUV and a sensitizing effect to the resist, it helps enhance the sensitivity of the resist film. Since the hydroxystyrene/acenaphthylene copolymer used in the protective film within the scope of the invention has a wide absorption band of wavelength 180 to 250 nm, a satisfactory OOB cutoff effect is exerted. Since the polymer in the protective film-forming compositions of Comparative Examples 2 and 7 is highly soluble in amyl ether, but has less absorption of OOB, OOB exposure is performed by the ArF and KrF exposures, resulting in tapered profile. Additionally, since the polymer contains fluorine atoms having absorption of EUV, the resist film is reduced in sensitivity. When the resist film was subjected to the ArF and KrF exposures in the absence of a protective film (Comparative Example 10), the resist pattern was tapered. In Comparative Example 11 where no protective film was formed and the ArF and KrF exposures were omitted, the pattern was rectangular, but would be deformed when processed by an actual EUV scanner because of a strong possibility that the actual EUV scanner is not equipped with an OOB-cutoff filter because of laser power shortage. Understandably, the experiment of pseudo-OOB irradiation by ArF and KrF lasers is a simulation of EUV scanner exposure.

Japanese Patent Application No. 2011-266406 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of forming a photoresist layer on a wafer, forming a protective film thereon, and exposure in vacuum,
the protective film being formed from a resist protective film-forming composition,
the photoresist layer being formed from a resist composition comprising a copolymer comprising recurring units of at least one type selected from recurring units (a1) and (a2) having a carboxyl group and phenol group whose hydroxyl moiety is substituted with an acid labile group, respectively, as represented by the general formula (2) and recurring units of at least one type selected from recurring units (b1) and (b2) of a sulfonium salt as represented by the general formula (3) and having a weight average molecular weight of 1,000 to 500,000, as a base resin,

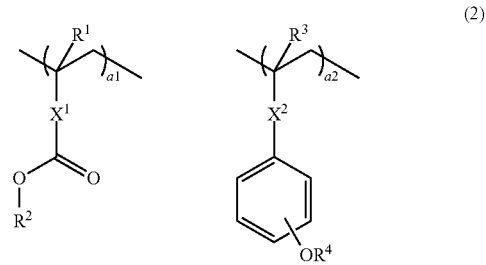

(2)

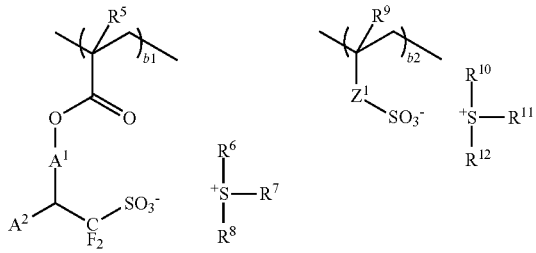

(3)

in formula (2), $R^1$ and $R^3$ are each independently hydrogen or methyl, $R^2$ and $R^4$ each are an acid labile group, $X^1$ is a single bond, a $C_1$-$C_{12}$ linking group having an ester radical, lactone ring, phenylene radical or naphthylene radical, phenylene group or naphthylene group, $X^2$ is a single bond, an ester group or an amide group, in formula (3), $R^5$ and $R^9$ are each independently hydrogen or methyl, $R^6$, $R^7$, $R^8$, $R^{10}$, $R^{11}$ and $R^{12}$ are each independently a straight, branched or cyclic $C_1$-$C_{12}$ alkyl group which may contain a carbonyl, ester or ether radical, or $C_6$-$C_{12}$ aryl group, $C_7$-$C_{20}$ aralkyl group or thiophenyl group, $A^1$ is a single bond, -$A^0$-C($=$O)—O— or -$A^0$-O—C($=$O)—, $A^0$ is a straight, branched or cyclic $C_1$-$C_{12}$ alkylene group which may contain a carbonyl, ester or ether radical, $A^2$ is hydrogen or $CF_3$, $Z^1$ is a single bond, methylene, ethylene, phenylene, fluorophenylene, —O—$R^{13}$—, or —C($=$O)—$Z^2$—$R^{13}$—, $Z^2$ is oxygen or NH, $R^{13}$ is a straight, branched or cyclic $C_1$-$C_6$ alkylene group, phenylene group, fluorophenylene group, trifluoromethyl-substituted phenylene group or alkenylene group, which may contain a carbonyl, ester, ether or hydroxyl radical, a1, a2, b1 and b2 are numbers in the range: $0 \leq a1 \leq 0.9$, $0 \leq a2 \leq 0.9$, $0 < a1+a2 \leq 0.9$, $0 \leq b1 \leq 0.3$, $0 \leq b2 \leq 0.3$, and $0 < b1+b2 \leq 0.3$, and the resist protective film forming composition comprising a novolak resin of a bisphenol compound having the general formula (1) as a base resin,

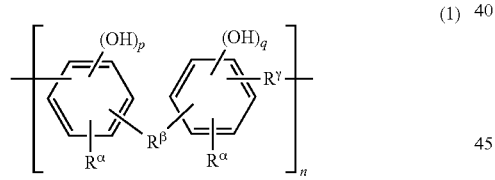

(1)

wherein $R^\alpha$ is each independently hydrogen, a $C_1$-$C_{10}$ alkyl group, $C_2$-$C_{10}$ alkenyl group, or $C_6$-$C_{10}$ aryl group, $R^\beta$ is a single bond or a 2n-valent $C_1$-$C_{40}$ hydrocarbon group of straight, branched or cyclic structure which may have a bridged cyclic hydrocarbon radical, aliphatic unsaturation, heteroatom, or $C_6$-$C_{30}$ aromatic radical, n is an integer of 1 to 4, $R^\gamma$ is a single bond or a straight or branched alkylene group which may have an aromatic radical, p and q each are an integer of 1 to 3.

2. The pattern forming process of claim 1 wherein the protective film-forming composition is soluble in an alkaline developer.

3. The pattern forming process of claim 1 wherein the protective film-forming composition further comprises an organic solvent mixture of at least one alcohol solvent and at least one other solvent, the alcohol solvent being selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclopentanol, and cyclohexanol, the other solvent being selected from an ether solvent selected from the group consisting of diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether, and an aromatic solvent selected from the group consisting of toluene, xylene, mesitylene, ethylbenzene, propylbenzene, butylbenzene, tert-butylbenzene, and anisole.

* * * * *